United States Patent
Kuroi et al.

(10) Patent No.: US 6,521,527 B1
(45) Date of Patent: Feb. 18, 2003

(54) SEMICONDUCTOR DEVICE AND METHOD OF FABRICATING THE SAME

(75) Inventors: Takashi Kuroi, Hyogo (JP); Shuichi Ueno, Hyogo (JP); Hidekazu Oda, Hyogo (JP); Satoshi Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/922,663

(22) Filed: Aug. 7, 2001

Related U.S. Application Data

(62) Division of application No. 08/880,508, filed on Jun. 23, 1997, now Pat. No. 6,300,664, which is a continuation of application No. 08/298,099, filed on Aug. 30, 1994.

(30) Foreign Application Priority Data

Sep. 2, 1993 (JP) .................. 5-218624(P)
Oct. 29, 1993 (JP) .................. 5-271961(P)
Mar. 15, 1994 (JP) .................. 6-044173(P)

(51) Int. Cl.[7] ............................... H01L 21/44
(52) U.S. Cl. ................ 438/652; 438/597; 438/454
(58) Field of Search ................ 438/584, 597, 438/454, 652

(56) References Cited

U.S. PATENT DOCUMENTS

| 4,151,011 A | * | 4/1979 | Mihashi et al. ............ 148/1.5 |
| 4,755,865 A | | 7/1988 | Wilson et al. |
| 4,774,197 A | | 9/1988 | Haddad et al. |
| 4,806,498 A | | 2/1989 | Fuji |
| 4,868,619 A | | 9/1989 | Mukherjee et al. |
| 4,888,246 A | | 12/1989 | Kuwata et al. |
| 4,897,368 A | | 1/1990 | Kobushi et al. |
| 5,027,185 A | | 6/1991 | Liauh |
| 5,103,272 A | | 4/1992 | Nishiyama |
| 5,134,447 A | | 7/1992 | Ng et al. |
| 5,189,504 A | | 2/1993 | Nakayama et al. |
| 5,218,211 A | * | 6/1993 | Okumura ................ 257/366 |
| 5,237,188 A | | 8/1993 | Iwai et al. |
| 5,237,196 A | | 8/1993 | Mikata et al. |
| 5,311,040 A | | 5/1994 | Hiramatsu et al. |
| 5,514,902 A | | 5/1996 | Kawasaki et al. |
| 5,554,871 A | | 9/1996 | Yamashita et al. |

FOREIGN PATENT DOCUMENTS

| JP | 61-263274 | 11/1986 |
| JP | 1-309320 | 12/1989 |
| JP | 2270335 | 5/1990 |
| JP | 3-44075 | 2/1991 |
| JP | 3-46238 | 2/1991 |
| JP | 4025176 | 1/1992 |
| JP | 4-157766 | 5/1992 |
| JP | 4157766 | 5/1992 |
| JP | 6029314 | 4/1994 |
| JP | 6151829 | 5/1994 |

OTHER PUBLICATIONS

"A P Poly–Si Gate with Nitrogen–Doped Poly–Si Layer for Deep Submicron PMOSFETS", Nakayama, ULSI Scient and Technology, 1991, pp. 9–16.

(List continued on next page.)

Primary Examiner—Amir Zarabian
Assistant Examiner—Pamela Perkins
(74) Attorney, Agent, or Firm—McDermott, Will & Emery

(57) ABSTRACT

Obtained are a semiconductor device which can prevent diffusion of an impurity contained in a gate electrode and a method of fabricating the same. In this semiconductor device, a gate oxide film and a P+-type gate electrode which are formed on a P-type silicon substrate are doped with nitrogen.

10 Claims, 76 Drawing Sheets

OTHER PUBLICATIONS

IEEE Electron Device Letters, vol. EDL–8, No. 2, Feb. 1987, New York, Hadad et al., "Improvement of Thin–Gate Oxide Integrity Using Through–Silicon–Gate Nitrogen Ion Implantation", pp. 58–60.

Technical Digest of the International Devices Meeting 1993, Washington, D.C., Dec. 5–8, pp. 325–328, T. Kuroi et al., "Novice NICE (Nitrogen Implantation into CMOS Gate Electrode and Source–Drain) Structure for High Reliability and High Performance 0.25 um Dual Gate CMOS".

"Extended Abstracts (The 40th Spring Meeting, 1993); The Japan Society of Applied Physics and Related Societies (Mar. 29, 1993).".

* cited by examiner

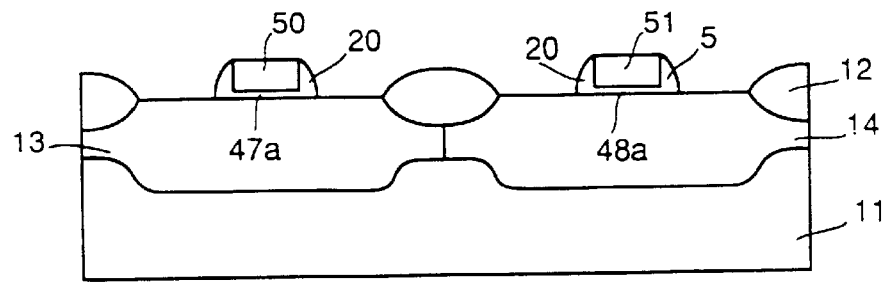
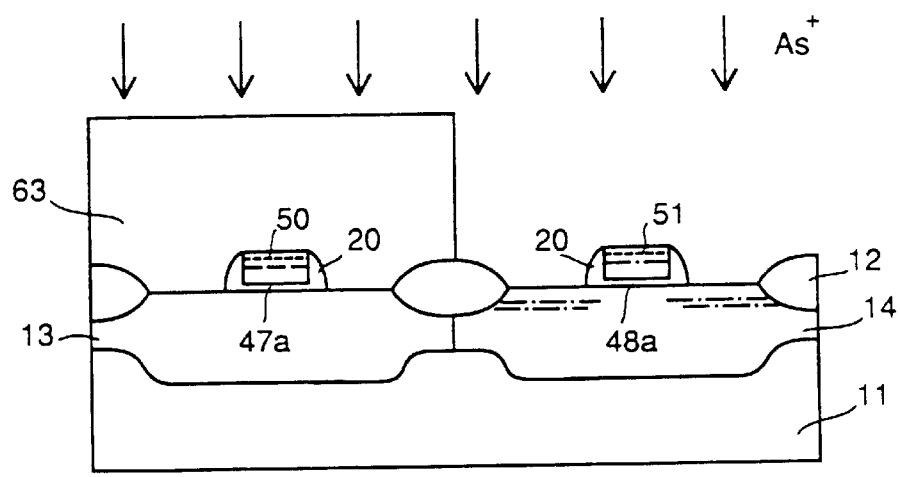
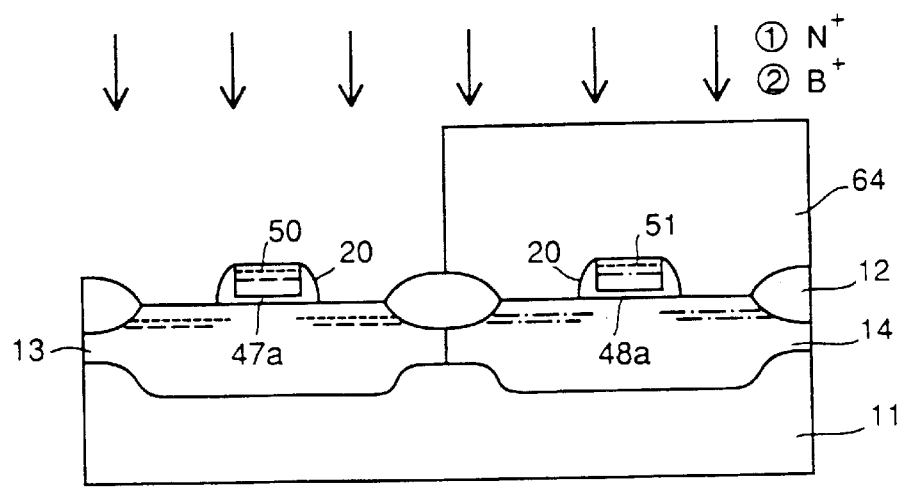

1

SEMICONDUCTOR DEVICE AND METHOD OF FABRICATING THE SAME

This application is a divisional of application Ser. No. 08/880,508 filed Jun. 23, 1997 U.S. Pat. No. 6,300,664 which is a continuation of Ser. No. 08/298,099, filed Aug. 30, 1994.

BACKGROUND OF THE INVENTION

1. Field of the Invention

The present invention relates to a semiconductor device and a method of fabricating the same, and more specifically, it relates to a semiconductor device which can improve element characteristics by a nitrogen implantation technique, and a method of fabricating the same.

2. Description of the Background Art

In general, it is known that source/drain regions of a MOS transistor are formed with shallow junction planes in order to suppress a short channel effect of the MOS transistor. In order to suppress a short channel effect of a P-channel MOS transistor (hereinafter referred to as "PMOS transistor"), it is effective to employ an electrode which is doped in a P type as an electrode material for the PMOS transistor. In order to suppress a short channel effect of an N-channel MOS transistor (hereinafter referred to as "NMOS transistor"), on the other hand, it is effective to employ an electrode which is doped in an N type as an electrode material for the NMOS transistor. A dual gate CMOS transistor is proposed in relation to application of these effects to a CMOS (complementary MOS) transistor which is formed by NMOS and PMOS transistors. In such a dual gate CMOS transistor, a gate electrode which is doped in an N type is employed for the NMOS transistor, while a gate electrode which is doped in a P type is employed for the PMOS transistor.

Conventional methods of forming source/drain regions of PMOS transistors with shallow junction planes are now described. FIG. 145 is a sectional view for illustrating a first conventional method of forming source/drain regions of a PMOS transistor with shallow junction planes, and FIGS. 146A and 146B are sectional views for illustrating a second method. Referring to FIG. 145, element isolation oxide film 7, a gate oxide film 2, a gate electrode 3, an oxide film 4 and side wall oxide films 5 are formed on a main surface of an N-type silicon substrate 1 through an ordinary process in the first method. Thereafter the element isolation oxide film 7, the oxide film 4 and the side wall oxide films 5 are employed as masks to ion-implant boron fluoride ions ($BF_2^+$) having a larger mass number than boron ions ($B^+$) into the N-type silicon substrate 1. Thus, source/drain regions 6 are formed with shallow junction planes.

In the second method, element isolation oxide film 7, an oxide film 4 and side wall oxide films 5 are employed as masks to implant silicon ions ($Si^+$) or germanium ions ($Ge^+$) into an N-type silicon substrate 1, as shown in FIG. 146A. Thus, ion-implanted regions of the N-type silicon substrate 1 are brought into amorphous states. Thereafter boron ions ($B^+$) are implanted into the N-type silicon substrate 1, as shown in FIG. 146B. Thus, source/drain regions 6 are formed with shallow junction planes. In the second method, the silicon ions or germanium ions are implanted in order to prevent a channeling phenomenon of the boron ions.

When the source/drain regions 6 are formed with shallow junction planes, however, the source/drain regions 6 are disadvantageously increased in sheet resistance. To this end, generally proposed is a countermeasure of providing titanium silicide films 8 having low resistance on surfaces of the source/drain regions 6, as shown in FIG. 147.

FIG. 148 is a sectional view showing an exemplary conventional dual gate CMOS transistor. Referring to FIG. 148, an N well 13 and a P well 14 are adjacently formed on a main surface of a P-type silicon substrate 11. Further, element isolation oxide film 12 are formed on the main surface of the P-type silicon substrate 11 at prescribed spaces. P-type source/drain regions 21 are formed on a main surface of the N well 13 at a prescribed space, to hold a channel region 10 therebetween. A gate electrode of a polycide gate structure formed by a polysilicon film 16 which is doped in a P type and a tungsten silicide film 18 which is formed on the polysilicon film 16 is provided on the channel region 10, through a gate oxide film 15. An oxide film 19 is formed on the tungsten silicide film 18. Side wall oxide films 20 are formed on side surfaces of the polysilicon film 16 and the tungsten silicide film 18.

On the other hand, N-type source/drain regions 22 are formed on a main surface of the P well 14 at a prescribed space, to hold a channel region 10 therebetween. A gate electrode of a polycide gate structure formed by a polysilicon film 17 which is doped in an N type and a tungsten silicide film 18 is provided on the channel region 10 in the P well 14, through a gate oxide film 15. An oxide film 19 is formed on the tungsten silicide film 18, while side wall oxide films 20 are formed on side surfaces of the polysilicon film 17 and the tungsten silicide film 18.

FIGS. 149 to 157 are sectional views for illustrating a fabrication process for the conventional dual gate CMOS transistor shown in FIG. 148. With reference to FIGS. 149 to 157, the fabrication process for the dual gate CMOS transistor shown in FIG. 148 is now described.

First, element isolation oxide film 12 are formed on a main surface of a P-type silicon substrate 11, as shown in FIG. 149. Further, an N well 13 serving as a PMOS transistor forming region and a P well 14 serving as an NMOS transistor forming region are formed on the main surface of the P-type silicon substrate 11, to be adjacent to each other.

Then, an oxide film 15a is formed to cover the N well 13 and the P well 14, as shown in FIG. 150. A polysilicon film 9 is formed on the oxide film 15a and the element isolation oxide film 12 by CVD, and a tungsten silicide film 18a is formed on the polysilicon film 9 by sputtering.

Then, the PMOS transistor forming region is covered with a resist film 25, as shown in FIG. 151. The resist film 25 is employed as a mask to implant arsenic ions ($As^+$) into a portion of the polysilicon film 9 located on the NMOS transistor forming region. Thereafter the resist film 25 is removed.

Then, the NMOS transistor forming region is covered with a resist film 26 as shown in FIG. 152, and this resist film 26 is employed as a mask to implant boron fluoride ions ($BF_2^+$) into a portion of the polysilicon film 9 located on the PMOS transistor forming region. Thereafter the resist film 26 is removed. An oxide film is formed by CVD, and thereafter this oxide film, the tungsten silicide film 18a and the polysilicon film 9 are patterned in the form of gate electrodes by photolithography and anisotropic etching. Thus, the oxide films 19, the tungsten silicide films 18 and polysilicon films 16a and 17a are formed as shown in FIG. 153. Thereafter an oxide film is formed on the overall surface by CVD, and this oxide film is etched back. Thus, side wall oxide films 20 are formed on side surfaces of the gate electrodes, as shown in FIG. 154.

Then, the PMOS transistor forming region is covered with a resist film 27, as shown in FIG. 155. This resist film 27 is employed as a mask to implant arsenic ions into the NMOS transistor forming region. Thereafter the resist film 27 is removed.

Then, the NMOS transistor forming region is covered with a resist film 28 as shown in FIG. 156, and this resist film 28 is employed as a mask to implant boron fluoride ions into the PMOS transistor forming region. Thereafter the resist film 28 is removed. Heat treatment is carried out for activating the ions as implanted. Thus, a polysilicon film 16 which is doped in an N type, a polysilicon film 17 which is doped in a P type, $N^+$-type source/drain regions 22 and $P^+$-type source/drain regions 21 are formed as shown in FIG. 157. Thus, the exemplary conventional dual gate CMOS transistor of a polycide gate structure is completed.

FIG. 158 is a sectional view showing another exemplary conventional dual gate CMOS transistor. Referring to FIG. 158, titanium silicide films 23 are formed in a self-aligned manner on source/drain regions 21 and 22 and polysilicon films 16 and 17. Such a structure obtained by bringing surfaces of the polysilicon films 16 and 17 and the source/drain regions 21 and 22 for forming gate electrodes into silicide states in a self-aligned manner is called a salicide (self aligned silicide) structure. According to this salicide structure, it is possible to suppress increase of sheet resistance in the source/drain regions 21 and 22, which comes into question when the source/drain regions 21 and 22 are formed with shallow junction planes.

FIGS. 159 to 163 are sectional views for illustrating a fabrication process for the conventional dual gate CMOS transistor shown in FIG. 158. With reference to FIGS. 159 to 163, the fabrication process for the dual gate CMOS transistor shown in FIG. 158 is now described.

First, element isolation oxide film 12 are formed on a main surface of a P-type silicon substrate 11, as shown in FIG. 159. Further, an N well 13 and a P well 14 are formed on the main surface of the P-type silicon substrate 11 to be adjacent to each other. Oxide films 15a and polysilicon films (not shown) are successively formed on the N well 13 and the P well 14, and thereafter the polysilicon films are patterned to form patterned polysilicon films 8 as shown in FIG. 160.

Then, side wall oxide films 20 are formed on side surfaces of the polysilicon films 8, and thereafter a PMOS transistor forming region is covered with a resist film 25, as shown in FIG. 161. The resist film 25 is employed as a mask to ion-implant arsenic into the P well 14 and the polysilicon film 8 provided thereon. Thereafter the resist film 25 is removed.

Then, an NMOS transistor forming region is covered with a resist film 26, and this resist film 26 is employed as a mask to implant boron fluoride ions into the N well 13 and the polysilicon film 8 provided thereon, as shown in FIG. 162. Thereafter the resist film 26 is removed. A titanium layer (not shown) is formed on the overall surface by sputtering, and thereafter heat treatment is carried out to react silicon with titanium. Thus, titanium silicide films 23 are formed on source/drain regions 21 and 22 and polysilicon films 16 and 17, as shown in FIG. 163. Thus, the conventional dual gate CMOS transistor shown in FIG. 158 is completed.

As hereinabove described, the gate electrodes are brought into polycide gate structures of polysilicon films and tungsten silicide films, or brought into silicide states in the conventional dual gate CMOS transistor, in order to electrically connect the polysilicon film 16 which is doped in a P type with the polysilicon film 17 which is doped in an N type. In particular, it is possible to relieve the source/drain regions from increase of sheet resistance by employing a salicide structure for the dual gate CMOS transistor.

A thin film transistor (hereinafter referred to as "TFT") employing a polysilicon film is known as one of semiconductor devices. This TFT is an important device as a load transistor for a highly integrated SRAM or a driving transistor for a liquid crystal display. In relation to requirement for further improvement in integration and performance of an applied element of such a TFT, however, the TFT itself must be refined in structure and improved in electrical property as well as reliability.

Important subjects for refinement of the TFT are suppression of a short channel effect which is caused by impurity ions, forming source/drain regions, diffused into a channel region, and improvement of hot carrier resistance.

FIG. 164 is a sectional view showing a conventional PMOS-TFT. Referring to FIG. 164, an insulating film 102 is formed on a semiconductor substrate 101 in the conventional PMOS-TFT. A gate electrode 103 which is doped in a P type is formed on the insulating film 102. A gate insulating film 104 is formed to cover the gate electrode 103. A polysilicon layer 105 is formed on the gate insulating film 104. A P-type source region 105b and a P-type drain region 105c are formed in the polysilicon layer 105 at a prescribed space, to hold a channel region 105a therebetween. FIG. 165 is a perspective view showing an upper portion of the TFT shown in FIG. 164 including the gate electrode 103.

FIGS. 166 to 169 are sectional and perspective views for illustrating a fabrication process for the TFT shown in FIG. 164. With reference to FIGS. 166 to 169, the fabrication process for the conventional TFT is now described.

First, an insulating film 102 of a high temperature oxide film is formed on a semiconductor substrate 101 by CVD or the like, as shown in FIG. 166. A non-doped polysilicon layer 103a is formed on the insulating film 102 by CVD or the like. P-type impurity ions such as boron ions, for example, are ion-implanted into the nondoped polysilicon layer 103a. Thereafter a resist film 107 shown in FIG. 167 is formed on a prescribed region of the polysilicon layer 103a, and this resist film 107 is employed as a mask to anisotropically etch the polysilicon layer 103a (see FIG. 166). Thus, a gate electrode 103b is formed. Thereafter the resist film 107 is removed. A gate insulating film (not shown) is formed by thermal oxidation, and a non-doped polysilicon layer (not shown) is formed on the gate insulating film by CVD or the like. Thereafter arsenic ions for adjusting a threshold voltage are implanted into the non-doped polysilicon layer. A resist film (not shown) is formed on a prescribed region of the non-doped polysilicon layer, and thereafter the non-doped polysilicon layer and the gate insulating film are patterned. Thus, a gate insulating film 104 and a polysilicon layer 105 patterned as shown in FIG. 168 are formed. Thereafter the resist film is removed.

Then, a resist film 108 is formed on a region of the polysilicon layer 105 for forming a channel region. The resist film 108 is employed as a mask to ion-implant $BF_2^+$ into the polysilicon layer 105. Heat treatment is carried out for activating the impurity as implanted. Thus, a gate electrode 103, a source region 105b and a drain region 105c are formed. Thus, the conventional TFT shown in FIG. 164 is completed.

Another exemplary semiconductor device is a nonvolatile semiconductor memory device. In relation to such a nonvolatile semiconductor memory device, known is an EEPROM (electrically erasable and programmable read only memory) which can freely program data as well as electrically write and erase data. While this EEPROM can advantageously electrically write and erase data, it is difficult to highly integrate this memory since two transistors are required for a memory cell. To this end, there has been proposed a flash EEPROM having a memory cell formed by a single transistor, which can batch-erase written information charges. Such a flash EEPROM is disclosed in U.S. Pat. No. 4,868,619, for example.

FIG. 170 is a sectional view showing a conventional stack gate type flash EEPROM. Referring to FIG. 170, a drain region 208 and a source region 209 are formed on a main surface of a P-type silicon substrate 201 at a prescribed space, to hold a channel region 215 therebetween. A floating gate electrode 203 is formed on the channel region 215 through a thin oxide film 202 having a thickness of about 100 Å. A control gate electrode 205 is formed on the floating gate electrode 203 through an interlayer insulating film 204. The floating gate electrode 203 and the control gate electrode 205 are formed by polysilicon layers. A thermal oxide film 216 is formed to cover the floating gate electrode 203, the control gate electrode 205 and the silicon substrate 201. A smooth coating film 212 of an oxide film or the like is formed on the thermal oxide film 216. Further, a wiring layer 214 of an aluminum alloy or the like is formed to cover the smooth coating film 212.

FIG. 171 is a schematic diagram for illustrating a conventional write operation of the flash EEPROM employing CHE (channel hot electrons). Referring to FIG. 171, a voltage $V_{B1}$ of 6 to 8 V is applied to the drain region 208, and a voltage $V_{G1}$ of 10 to 15 V is applied to the control electrode 205. Due to such application of the voltages $V_{B1}$ and $V_{G1}$, electrons having high energy are generated in the vicinity of the drain region 208 and the oxide film 202. Parts of the electrons are attracted to the gate electrode 203 by an electric field which is caused by the voltage $V_{G1}$ applied to the control gate electrode 205, and injected into the floating gate electrode 203. When the electrons are thus stored in the floating gate electrode 203, a threshold voltage $V_{TH}$ of a control gate transistor exceeds a prescribed value. This state is a written state, which is called a state "0".

FIG. 172 is a schematic diagram for illustrating a conventional write operation of a flash EEPROM employing SHE (substrate hot electrons). With reference to FIG. 172, the write operation employing SHE is now described. In the flash EEPROM shown in FIG. 172, an N-channel control gate transistor is formed in a P well 222 which is provided on an N-type silicon substrate 221. In this case, a drain region 208 and a source region 209 are grounded, and a voltage $V_{G2}$ of 10 to 15 V is applied to a control gate electrode 205. Further, a voltage $V_{B2}$ of −5 to −10 V is applied to a substrate electrode 223. Due to such application of the voltages $V_{G2}$ and $V_{B2}$, a P-N junction which is formed by the N-type silicon substrate 221 and the P well 222 is biased in the forward direction. Thus, an ON-state current is generated. Parts of electrons forming the ON-state current are attracted to a floating gate electrode 203 by an electric field which is caused by the voltage $V_{G2}$ applied to the control gate electrode 205, and injected into the floating gate electrode 203.

FIG. 173 is a schematic diagram for illustrating a write operation of a flash EEPROM employing an F-N (Fowler-Nordheim) tunnel phenomenon. With reference to FIG. 173, the write operation employing the F-N tunnel phenomenon is described. In F-N writing on a drain end, for example, a voltage $V_{D3}$ of −10 to −12 V is applied to a drain region 208.

Further, a control gate electrode 205 is held at a ground potential, and a source region 209 is maintained in a floating state. Due to an electric field caused by the voltage $V_{D3}$ which is applied to the drain region 208, electrons pass through a thin oxide film 202 by an F-N tunnel phenomenon, to be injected into a floating gate electrode 203. Thus, the electrons are stored in the floating gate electrode 203, whereby a threshold voltage $V_{TH}$ of a control gate transistor is increased.

An erase operation is now described. A voltage $V_S$ of 10 to 12 V is applied to the source region 209, while the control gate electrode 205 is held at the ground potential and the drain region 208 is maintained in a floating state. Due to an electric field caused by the voltage $V_S$ which is applied to the source electrode 209, the electrons stored in the floating gate electrode 203 pass through the thin oxide film 202 by an F-N tunnel phenomenon. Thus, the electrons are extracted from the floating gate electrode 203, whereby the threshold voltage $V_{TH}$ of the control gate transistor is reduced. Data are erased when the threshold voltage $V_{TH}$ is reduced below a prescribed value. This state is called a state "1".

In read operation, further, a voltage $V_{G4}$ of 5 V is applied to the control gate electrode 205 and a voltage $V_{D4}$ of 1 to 2 V is applied to the drain region 208. Determination of the aforementioned state "0" or "1" is made depending on whether or not a current flows in a channel region of the control gate transistor, i.e., whether the control gate transistor is in an ON or OFF state. Thus, information is read out.

FIG. 174 is a model diagram for illustrating a coupling ratio of a conventional flash EEPROM. Referring to FIG. 174, the conventional flash EEPROM has a gate electrode of a two-layer structure, whereby a voltage which is applied to a control gate electrode 205 is applied to a channel region through a floating gate electrode 203. In other words, the potential of the floating gate electrode 203 is varied with the structures of an interlayer insulating film 204 and an oxide film 202, regardless of the amount of charges stored in the floating gate electrode 203 and values of potentials applied to respective terminals. A potential $V_{FG}$ of the floating gate electrode 203 depends on a threshold voltage $V_{TH}$, a capacitance $C_{FC}$ between the floating gate electrode 203 and a control gate electrode 205, a capacitance $C_{FB}$ between the floating gate electrode 203 and a substrate 201, a capacitance $C_{FS}$ between the floating gate electrode 203 and a source region 209, and a capacitance $C_{FD}$ between the floating gate electrode 203 and a drain region 208, in addition to potentials applied to the respective terminals such as a control gate voltage $V_{CG}$, a source voltage Vs and a drain voltage $V_D$. The potential $V_{FG}$ of the floating gate electrode 203 is approximately supplied by the following equation (1):

$$V_{FG}=C_{FC}V_{CG}/C_{TOTAL}+C_{FD}V_D/C_{TOTAL}+(C_{FD}+C_{FB})V_S/C_{TOTAL}+C_{FB}\cdot V_{TH}/C_{TOTAL}+Q_{FG}/C_{TOTAL} \quad (1)$$

$$Q_{FG}=C_{FC}(V_{FG}-V_{CG})+C_{FD}(V_{FG}-V_D)+C_{FS}(V_{FG}-V_S)+C_{FB}(V_{FG}-V_{TH}-V_S)$$

where $C_{TOTAL}=C_{FC}+C_{FD}+C_{FS}+C_{FB}$

Referring to the above equation (1), the potential $V_{CG}$ of the control gate electrode 205 exerts an influence on the potential $V_{FG}$ of the floating gate electrode 203 in multiplication by $C_{FC}/C_{TOTAL}$, which is called a coupling ratio. When the coupling ratio is large, therefore, the potential $V_{CG}$ of the floating gate electrode 203 is increased regardless of the potential which is applied to the control gate electrode 205. Therefore, the transistor operation can be readily controlled by the potential which is applied to the control gate electrode 205, as the coupling ratio is increased.

When data are written and erased through F-N tunnel phenomenons in the aforementioned flash EEPROM, the oxide film 202 is broken in a certain probability, and hence element reliability is disadvantageously reduced. Due to tunneling of electrons through the oxide film 202, further, the electrons injected into the oxide film 202 are trapped therein in a certain probability. Thus, an interfacial level is formed in the interface between the silicon substrate 201 and the oxide film 202. Due to the interfacial level as formed, reliability of the oxide film 202 is so reduced that the threshold voltage is changed or current drivability is reduced as the result. Since a high potential is applied to the floating gate electrode 203, further, the source region 209 or the drain region 208 in data writing or erasing, a high electric field is caused in the interface between the drain region 208 or the source region 209 and the oxide film 202. In particular, adjacent memory cells share the drain region 208 in common, and hence a potential is applied also to the drain region 208 of a nonselected cell in data writing. Since the control gate electrode 205 of the nonselected cell is held at the ground potential, a high electric field is caused between the floating gate electrode 203 and the drain region 208. Interband tunneling is caused by the high electric field as shown in FIG. 175, leading to generation of electron-hole pairs. The holes as generated are injected into the oxide film 202 in a certain probability, resulting in an interfacial level which is caused in the interface between the silicon substrate 201 and the oxide film 202. Thus, the oxide film 202 is reduced in reliability.

In order to prevent such reduction in reliability of the oxide film 202, there has been proposed a method of suppressing generation of an interfacial level in the interface between the silicon substrate 201 and the oxide film 202. For example, there has been proposed a method of carrying out RTN (rapid thermal nitridation) treatment after formation of the oxide film 202, to introduce nitrogen into the oxide film 202. Since nitrogen terminates dangling bonds in the oxide film 202, whereby it is possible to prevent the oxide film 202 from trapping charges therein. The RTN treatment is adapted to carry out annealing for an extremely short time in a reactive gas atmosphere containing nitrogen such as ammonia (NH3), for example. Thus, nitrogen is incorporated into the silicon substrate 201 and the oxide film 202.

FIG. 176 is a sectional view showing a conventional buried channel type flash EEPROM. Referring to FIG. 176, an N-type impurity layer 217 is formed on a surface of a channel region 215, and a P-type impurity layer 218 is formed under the N-type impurity layer 217 in this buried channel type flash EEPROM. A buried channel layer is formed by the N-type and P-type impurity layers 217 and 218. In such a buried channel type flash EEPROM, no high electric field is applied across a source region 209 or a drain region 208 and an oxide film 202 dissimilarly to a surface channel type flash EEPROM, whereby it is possible to suppress occurrence of interband tunneling in this region. Therefore, it is possible to prevent generation of holes caused by interband tunneling in data writing or erasing, thereby preventing the oxide film 202 from injection of holes.

However, the conventional MOS transistors have the following problems:

In the conventional method of forming source/drain regions of a PMOS transistor shown in FIG. 145, boron fluoride ions having a large mass are implanted for forming the source/drain regions 6 with shallow junction planes. However, fluorine contained in the boron fluoride ions disadvantageously hinders reaction between titanium and silicon in formation of titanium silicide. Thus, excellent titanium silicide films cannot be formed on the surfaces of the source/drain regions 6 and the gate electrode 3.

In the conventional method of forming source/drain regions of a PMOS transistor shown in FIGS. 146A and 146B, the surface of the N-type silicon substrate 1 is brought into a preamorphous state by implantation of silicon ions or germanium ions, and hence high temperature heat treatment is required for crystal recovery. However, it is necessary to reduce the heat treatment in order to form the source/drain regions 6 with shallow junction planes, and hence crystal recovery is rendered insufficient, leading to increase of a junction leakage current. This problem is similarly caused also in formation of source/drain regions of an NMOS transistor.

In the conventional method of forming source/drain regions, further, it is difficult to form source/drain regions having shallow junction planes since impurities as implanted are diffused by heat treatment for activation in both of PMOS and NMOS transistors.

In the conventional NMOS and PMOS transistors, further, impurities doped in the gate electrodes are diffused in heat treatment steps to deteriorate the gate oxide films. Consequently, no sufficient hot carrier resistance can be attained upon progress of element refinement.

In each of the dual gate CMOS transistors shown in FIGS. 148 and 158, boron ions disadvantageously enter the channel region from the gate electrode of the PMOS transistor which is doped in a P type through the gate oxide film in the heat treatment step. Therefore, the threshold voltage of the transistor is disadvantageously changed. Particularly in the dual gate CMOS transistor of the polycide gate structure, arsenic ions and boron ions are mutually diffused in the silicide from the gate electrodes which are doped in N and P types respectively during the heat treatment step. Thus, work functions of the gate electrodes are varied, leading to fluctuation of the threshold voltages of the transistors.

In the conventional TFT shown in FIG. 164, on the other hand, the following problems are caused along progress of refinement. Namely, the impurity which is ion-implanted for forming the source/drain regions 105b and 105c is thermally diffused by the later heat treatment and disadvantageously diffused toward the channel region 105a. Thus, a punch-through phenomenon is caused to inhibit an original transistor operation. The punch-through phenomenon is such a phenomenon that a depletion layer in the vicinity of a drain is spread toward a source region when a channel length is small, and hence no current can be controlled by a gate voltage.

In the conventional TFT, further, hot carriers are generated when the electric field which is applied to the drain region 105c is increased in an OFF state, resulting in deterioration of element reliability.

On the other hand, the conventional flash EEPROM shown in FIG. 170 has the following problems: In general, RTN treatment is employed as a method of introducing nitrogen into the oxide film 202. However, the RTN treatment is generally adapted to carry out annealing in an ammonia atmosphere, and hence not only nitrogen but hydrogen is introduced into the oxide film 202, as shown in FIG. 177. The oxide film 202 is disadvantageously reduced in reliability due to such doping with hydrogen. Further, hydrogen and nitrogen are disadvantageously injected also into the silicon substrate 201 on the fabrication process.

In the RTN treatment, further, the silicon substrate 201 is exposed to a high temperature of about 1100° C. while the treatment is carried out in a short time, and hence the peripheral temperature to which the silicon substrate 201 is exposed is abruptly changed. Thus, temperature distribution is caused in a prescribed plane of the silicon substrate 201, to cause slit-shaped defects due to difference in coefficient of expansion.

Further, the potential which is applied to the control gate electrode 205 is applied to the floating gate electrode 203 in multiplication by the coupling ratio. Therefore, it is necessary to apply the potential to the control gate electrode 205 in consideration of reduction by the coupling ratio. In order to apply a voltage of 5 V to the floating gate electrode 203 for writing data in a device having a coupling ratio of 0.5, for example, it is necessary to apply a voltage of about 10 V to the control gate electrode 205. Namely, the voltage which is applied to the control electrode 205 must be increased as the coupling ratio is reduced in order to guarantee a stable operation, and hence it is difficult to reduce the voltage of a power source for the flash EEPROM.

In general, there has been proposed a method of employing preparing the interlayer insulating film 204 from a nitride film having a higher dielectric constant than an oxide film, in order to improve the coupling ratio. When the interlayer insulating film 204 is formed only by a nitride film, however, a leakage current is disadvantageously increased. When the interlayer insulating film 204 is prepared from a composite film of a nitride film and an oxide film in order to prevent the problem of a leakage current, the interlayer insulating film 204 is disadvantageously increased in thickness. Thus, it is impossible to increase the coupling ratio.

In the conventional buried channel type flash EEPROM shown in FIG. 176, it is difficult to form a shallow buried channel layer by diffusion of an impurity which is implanted into the buried channel region. Thus, it is impossible to control the current between the source region 209 and the drain region 208 by the potential which is applied to the control gate electrode 205, and hence inconvenience such as a punch-through phenomenon is caused as the result.

SUMMARY OF THE INVENTION

An object of the present invention is to provide a semiconductor device including source/drain regions having shallow junction planes.

Another object of the present invention is to provide a semiconductor device which can prevent diffusion of an impurity doped into a gate electrode.

Still another object of the present invention is to provide a semiconductor device (nonvolatile semiconductor memory device) having a large coupling ratio.

A further object of the present invention is to provide a semiconductor device (nonvolatile semiconductor memory device) which can effectively prevent interband tunneling, as well as improve an oxide film and an interlayer insulating film in reliability.

A further object of the present invention is to provide a method of fabricating a semiconductor device which can easily form source/drain regions having shallow junction planes.

A further object of the present invention is to provide a method of fabricating a semiconductor device which can prevent diffusion of an impurity in a gate electrode caused by thermal diffusion.

In a first aspect of the present invention, a semiconductor device comprises a semiconductor substrate, source/drain regions, a first insulating film, and a first electrode. The source/drain regions are formed on a main surface of the semiconductor substrate at a prescribed space, to define a channel region therebetween. The first insulating film is formed on the channel region. The first electrode, which is provided on the first insulating film, has a first conductivity type. The first insulating film and the first electrode are doped with nitrogen.

In this semiconductor device, the first electrode (gate electrode) is doped with nitrogen, whereby nitrogen previously occupies holes which are diffusion paths for an impurity when the impurity is introduced into the gate electrode. Thus, the impurity is inhibited from diffusion. Consequently, the impurity is inhibited from being mixed into the gate insulating film (first insulating film) or passing through the gate insulating film. Further, nitrogen is deposited in the gate insulating film, thereby suppressing occurrence of an interfacial level in the interface between the gate insulating film and the semiconductor substrate. Thus, the gate insulating film of the semiconductor device is improved in reliability and hot carrier resistance. When the semiconductor device is an electrically erasable and programmable semiconductor memory device, further, it is possible to prevent occurrence of an interfacial level in the interface between the gate insulating film and the semiconductor substrate caused by interband tunneling or an F-N tunnel phenomenon, since nitrogen is deposited in the first insulating film provided under the floating gate electrode.

In a method of fabricating a semiconductor device according to a second aspect of the present invention, an insulating film is formed on a semiconductor substrate. An electrode layer is formed on the insulating film. Nitrogen is ion-implanted into the electrode layer. Further, an impurity is ion-implanted into the electrode layer. Heat treatment is carried out after nitrogen and the impurity are implanted into the electrode layer, so that nitrogen is deposited in the insulating film.

According to this method of fabricating a semiconductor device, heat treatment is carried out after nitrogen is ion-implanted into a gate electrode (electrode layer) which is formed on a gate insulating film (insulating film) so that nitrogen is deposited in the gate insulating film, whereby nitrogen is implanted into the gate insulating film without damaging the same. Further, no hydrogen is introduced into the gate insulating film. Thus, an effect of nitrogen introduction is attained with no bad influence exerted by hydrogen.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 51 to 59 are sectional views for illustrating an exemplary fabrication process for the dual gate CMOS transistor according to the sixth embodiment shown in FIG. 50;

DESCRIPTION OF THE PREFERRED EMBODIMENTS

Embodiments of the present invention are now described with reference to the drawings.

Figure 1:
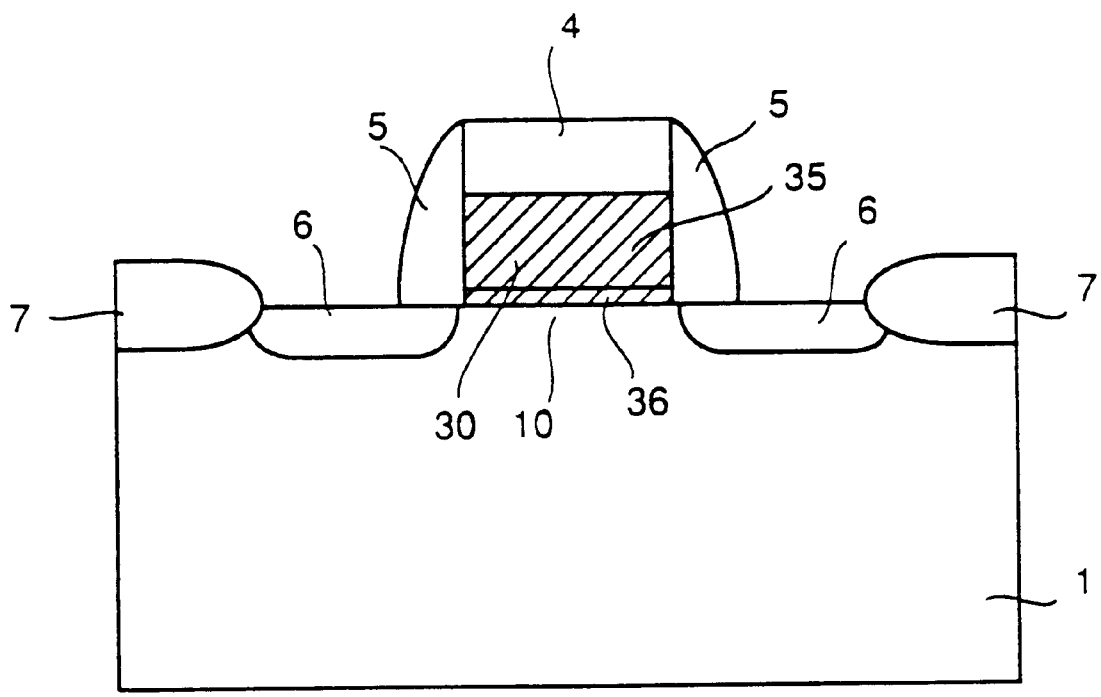
FIG. 1 is a sectional view showing a PMOS transistor according to a first embodiment of the present invention.

Referring to FIG. 1, element isolation oxide film 7 are formed on a main surface of an N-type silicon substrate 1 in a PMOS transistor according to a first embodiment of the present invention. Source/drain regions 6 are formed on a portion of the main surface of the N-type silicon substrate 1 which is held between the element isolation oxide film 7 at a prescribed space, to define a channel region 10 therebetween. A $P^+$-type gate electrode 35 is formed on the channel region 10 through a gate oxide film 36. An oxide film 4 is formed on the $P^+$-type gate electrode 35. Side wall oxide films 5 are formed on side surfaces of the $P^+$-type gate electrode 35 and the oxide film 4.

Figure 2:
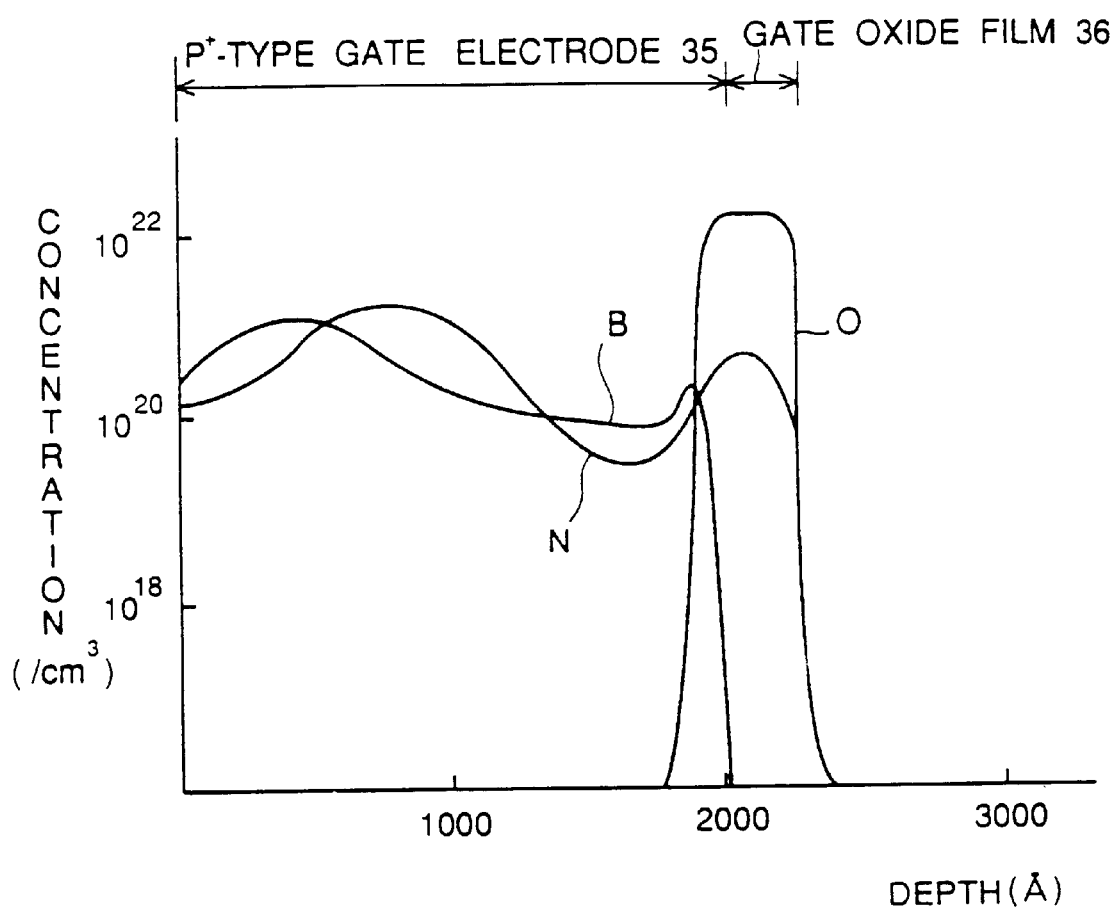
FIG. 2 illustrates an impurity profile in a depth direction of a gate electrode of the PMOS transistor shown in FIG. 1.

In the PMOS transistor according to the first embodiment, a nitrogen-doped region 30 shown by slant lines is doped with nitrogen. Namely, nitrogen is introduced into the $P^+$-type gate electrode 35 and the gate oxide film 36. Referring to FIG. 2, it is understood that nitrogen (N) is deposited in the gate oxide film 36. The wording "deposition of nitrogen" indicates such a state that nitrogen is trapped in a certain constant position to be increased in concentration.

With reference to FIGS. 3 to 7, a method of fabricating the PMOS transistor according to the first embodiment shown in FIG. 1 is now described.

Figure 3:
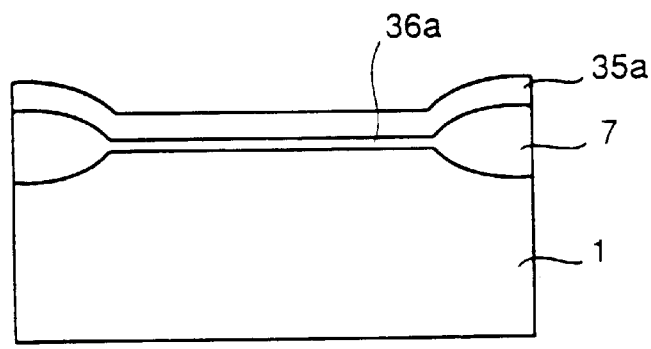
FIGS. 3 to 7 are sectional views for illustrating a fabrication process for the PMOS transistor according to the first embodiment shown in FIG. 1.

First, element isolation oxide film 7 are formed on an N-type substrate 1 by an ordinary element isolation step, as shown in FIG. 3. Thereafter an oxide film 36a of about 100 Å in thickness is formed on the overall surface by thermal oxidation. A polysilicon film 35a of about 200 Å in thickness is formed on the overall oxide film 36a by CVD.

Figure 4:
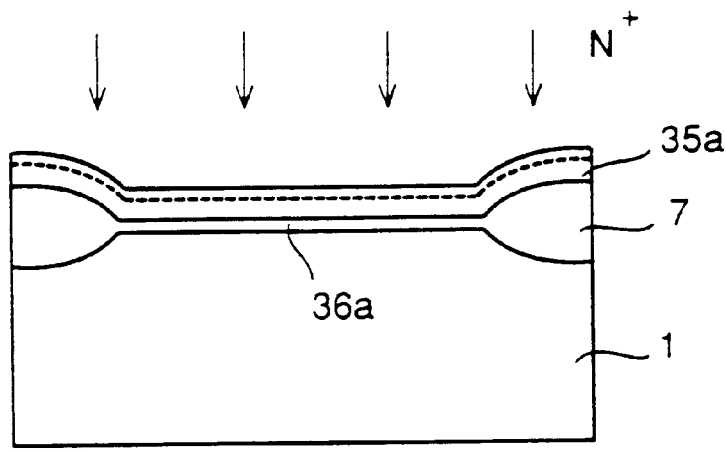
Figure 5:
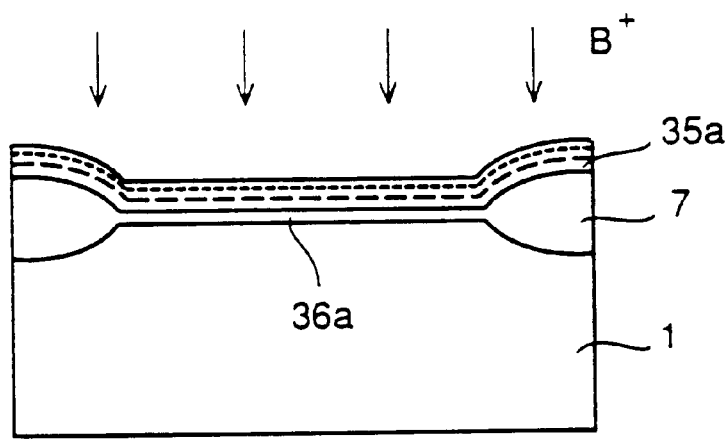
Figure 6:
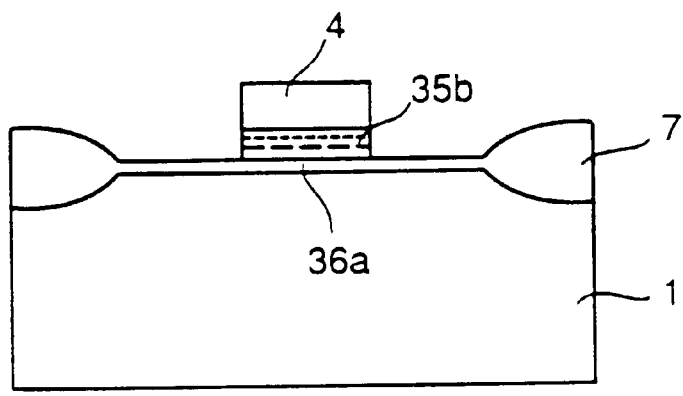

Then, nitrogen ions are implanted into the polysilicon film 35a under conditions of 20 keV and $4 \times 10^{15}/cm^2$, so that a range center of the nitrogen ions comes to an upper portion of the polysilicon film 35a, as shown in FIG. 4. Thereafter boron ions are implanted into the polysilicon film 35a under conditions of 20 keV and $4 \times 10^{15}/cm^2$, as shown in FIG. 5. An oxide film (not shown) of about 2000 Å in thickness is formed by CDV, and this oxide film and the polysilicon film 35a are patterned by photolithography and dry etching. Thus, a gate electrode 35b and an oxide film 4 are formed as shown in FIG. 6.

Figure 7:
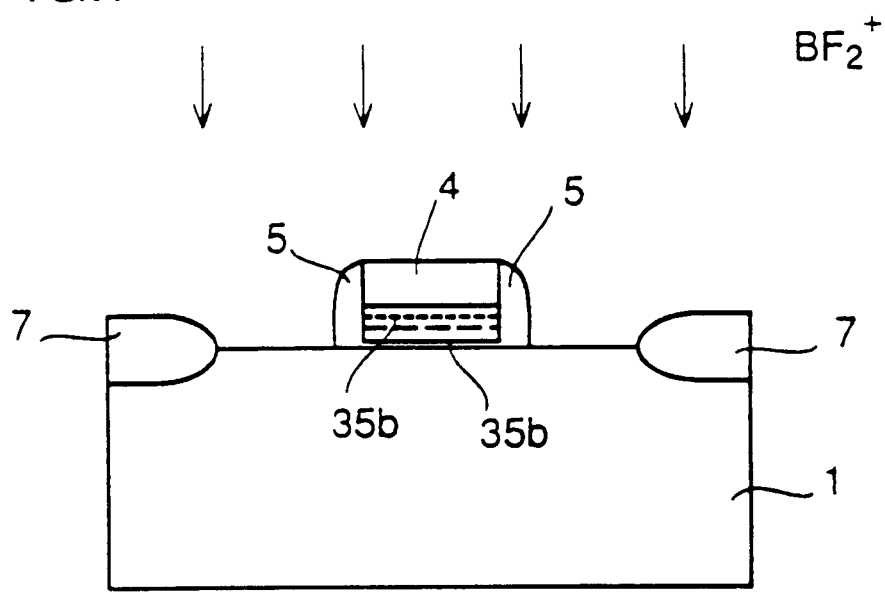

An oxide film (not shown) of about 800 Å in thickness is formed by CDV, and this oxide film is thereafter etched back to form side wall oxide films 5 and a gate oxide film 36b as shown in FIG. 7. The side wall oxide films 5 and the element isolation oxide film 7 are employed as masks to implant boron fluoride ions into the N-type silicon substrate 1 under conditions of 20 keV and $4 \times 10^{15}/cm^2$. Heat treatment is carried out at 850° C. for about 20 minutes, thereby activating the impurities as implanted. Thus, the source/drain regions 6 and the P$^+$-type gate electrode 35 are formed as shown in FIG. 1. In this heat treatment, nitrogen which is doped into an upper portion of the gate electrode 35b is thermally diffused, while nitrogen segregates in the gate oxide film 36b. Thus, a concentration peak of nitrogen exists in the gate oxide film 36, as shown in FIG. 2.

Figure 8:
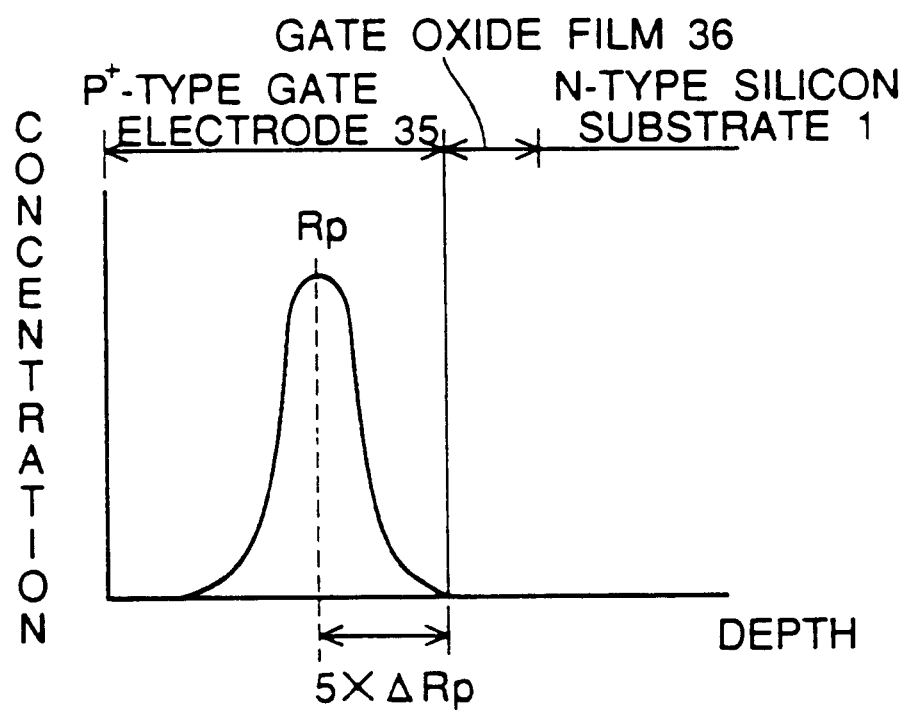
FIG. 8 is a graph for illustrating nitrogen implantation conditions in a step of fabricating the PMOS transistor according to the first embodiment.

The nitrogen implantation conditions in the aforementioned fabrication process are now described in further detail with reference to FIG. 8. A projection range $R_P$ of nitrogen is set to come to a position of the P$^+$-type gate electrode 35 upward beyond a position separated by $5 \times \Delta R_P$ from the interface between the P$^+$-type gate electrode 35 and the gate oxide film 36 toward the P$^+$-type gate electrode 35, assuming that $\Delta R_P$ represents its standard deviation. If the projection range $R_p$ is set downward beyond the said position, the gate oxide film 36 may be damaged by nitrogen implantation.

While the P$^+$-type gate electrode 35 and the source/drain regions 6 are doped through different steps in the aforementioned fabrication process, the P$^+$-type gate electrode 35 may alternatively be doped with nitrogen simultaneously with the source/drain regions 6. Further, the P$^+$-type gate electrode 35 may alternatively be doped by implantation of boron fluoride ions. While the first embodiment has been described with reference to a PMOS transistor alone, this embodiment may also be applied to a PMOS transistor which is included in a CMOS transistor.

Effects of the aforementioned first embodiment are now described. The P$^+$-type gate electrode 35 is doped with nitrogen, whereby diffusion of boron is suppressed. Namely, nitrogen is in the same hole diffusion mechanism as boron, and has a larger diffusion coefficient than boron. When nitrogen is mutually diffused with boron, therefore, nitrogen occupies holes, which are diffusion paths, in advance. Consequently, it is possible to suppress diffusion of boron, thereby inhibiting boron from punching through the channel region 10. Thus, it is possible to effectively suppress fluctuation of the threshold voltage. Further, the depth and concentration distribution of nitrogen as doped can be readily controlled through ion implantation.

The P$^+$-type gate electrode 35 is doped with nitrogen in its upper portion and heat treated, whereby nitrogen is deposited in the gate oxide film 36. Consequently, an interfacial level is reduced in the interface between the gate oxide film 36 which is formed by a silicon oxide film and the N-type silicon substrate 1 which is made of silicon. Thus, it is possible to improve reliability of the gate oxide film 36, while effectively improving hot carrier resistance.

Figure 9:
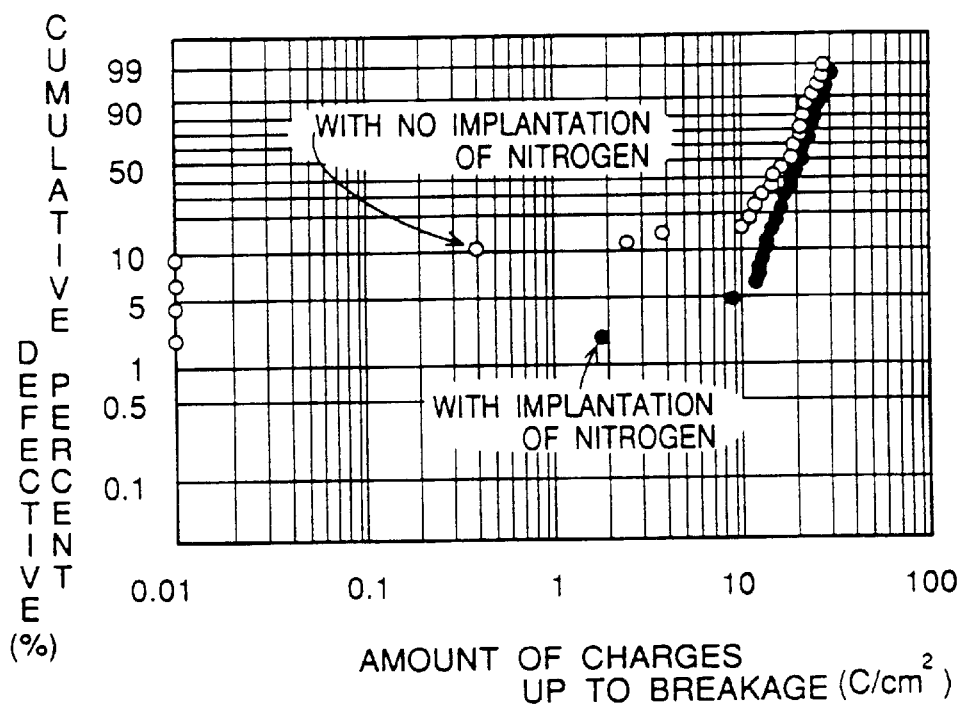
FIG. 9 is a graph for illustrating improvement in reliability of an oxide film by nitrogen implantation.

FIG. 9 shows levels of reliability of gate oxide films provided in a conventional MOS transistor and a MOS transistor having a gate electrode doped with nitrogen, which were evaluated by a constant current stress method. Referring to FIG. 9, it is understood that dielectric breakdown resistance is improved when nitrogen is implanted into the gate electrode 35 so that nitrogen is deposited in the gate oxide film 36. Thus, the gate oxide film 36 is improved in reliability.

Figure 10:
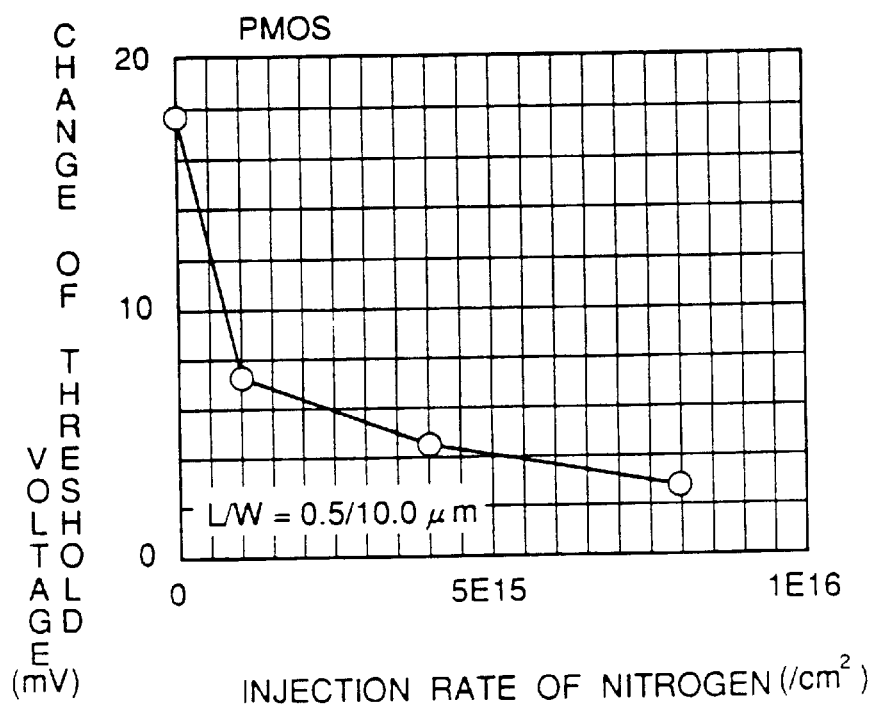
FIG. 10 is a graph for illustrating dependence of change of a threshold voltage by hot carrier injection on an injection rate of nitrogen in the PMOS transistor.

FIG. 10 shows dependence of change in threshold voltage of a PMOS transistor, caused by hot carrier implantation, on a nitrogen injection rate. Referring to FIG. 10, the change of threshold voltage was measured after application of a constant stress voltage for about 1000 seconds. It is understood that the change of the threshold voltage is reduced when the nitrogen injection rate for the gate electrode 35 is increased. In other words, it is understood that hot carrier resistance of the PMOS transistor is improved when the gate electrode 35 is doped with nitrogen to deposit nitrogen in the gate oxide film 36.

A nitrogen concentration peak in the nitrogen-doped region 30 in the gate electrode 35 and the gate oxide film 36 is preferably set in a range of $10^{19}/cm^3$ to $10^{21}/cm^3$. Therefore, the injection rate for nitrogen ions may be set in a range of $10^{14}/cm^2$ to $10^{16}/cm^2$ in the fabrication step. The aforementioned effects cannot be attained if the nitrogen concentration peak is lower than $10^{19}/cm^3$. When the nitrogen concentration peak in the gate oxide film 36 is higher than $10^{21}/cm^3$, mobility of channel electrons is deteriorated and hence electrical properties of the MOS transistor are deteriorated.

Figure 11:
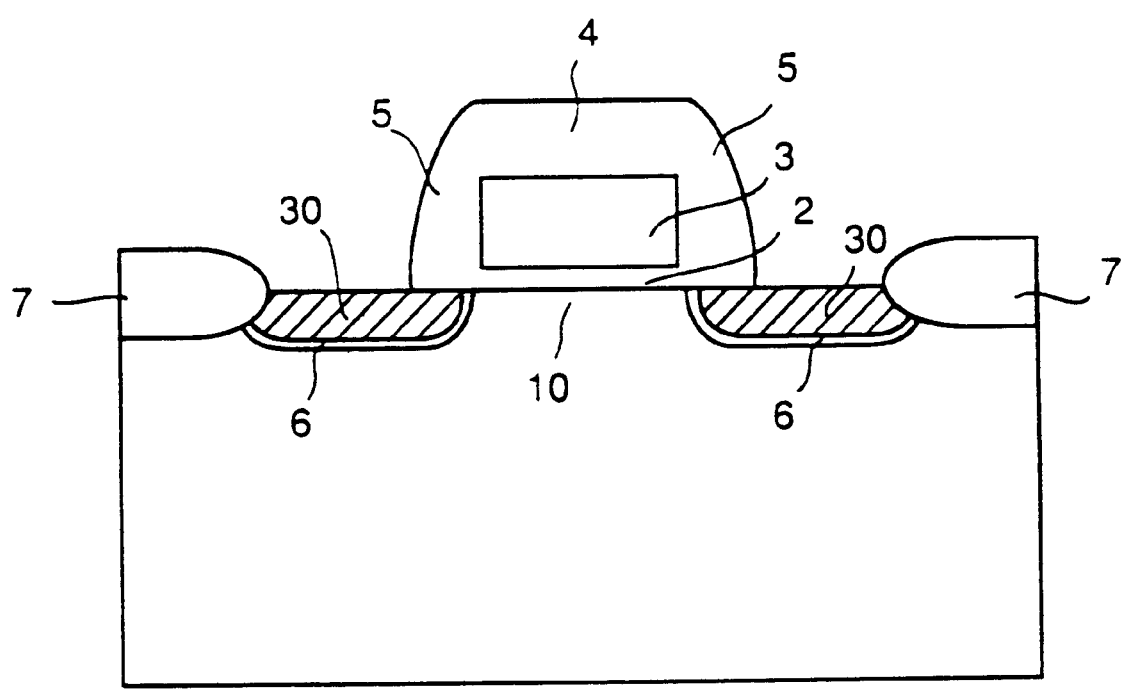
FIG. 11 is a sectional view showing a PMOS transistor according to a second embodiment of the present invention.
Figure 12:
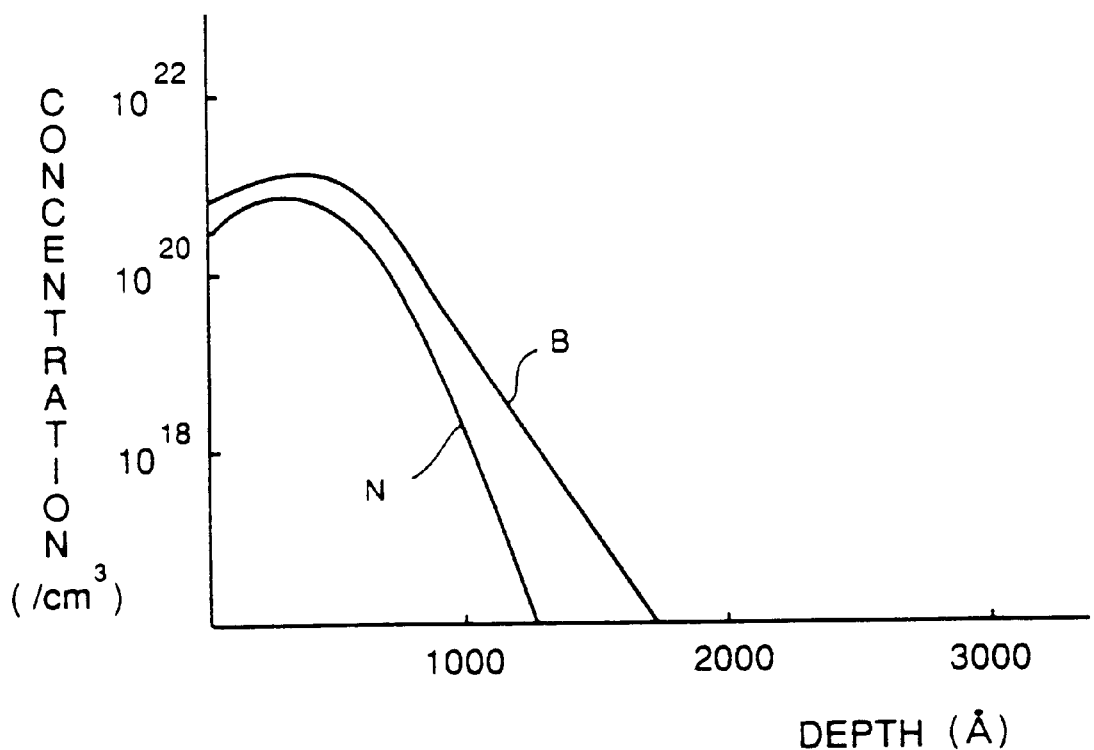
FIG. 12 illustrates an impurity profile in a depth direction of a source/drain region of the PMOS transistor according to the second embodiment shown in FIG. 11.

With reference to FIG. 11, a PMOS transistor according to a second embodiment of the present invention is now described. As shown in FIG. 11, nitrogen-doped regions 30 are formed in source/drain regions 6 according to the second embodiment. Referring to FIG. 12, it is understood that junction planes of the source/drain regions 6 shown in FIG. 11 are not doped with nitrogen but contains only boron. Namely, it is understood that the nitrogen-doped regions 30 exist in the source/drain regions 6 which are doped with boron.

With reference to FIGS. 13 to 17, an exemplary fabrication process for the PMOS transistor according to the second embodiment shown in FIG. 11 is now described.

Figure 13:
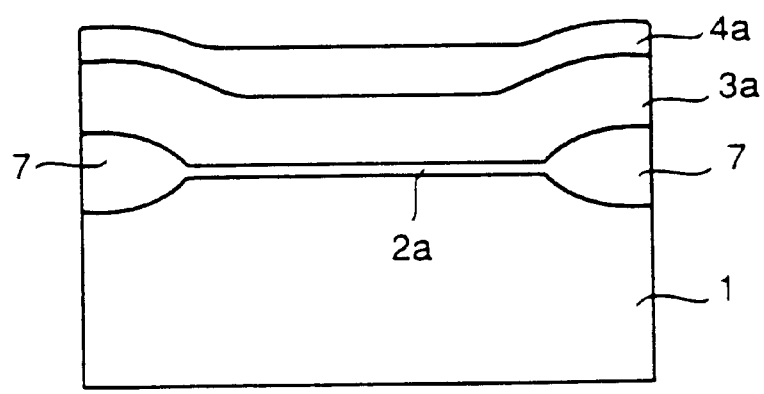
FIGS. 13 to 17 are sectional views for illustrating an exemplary fabrication process for the PMOS transistor according to the second embodiment shown in FIG. 11.

First, element isolation oxide film 7 are formed on an N-type silicon substrate 1, as shown in FIG. 13. Then, an oxide film 2a of about 100 Å in thickness is formed by thermal oxidation. Thereafter a polysilicon film 3a which is doped with phosphorus by about $5 \times 20/cm^3$ is formed in a thickness of about 2000 Å by CDV. Further, an oxide film 4a of about 2000 Å in thickness is formed on the polysilicon film 3a by CDV. The oxide film 4a and the polysilicon film 3a are patterned by photolithography and anisotropic etching, thereby forming a gate electrode 3 and an oxide film 4 shown in FIG. 14.

Figure 15:
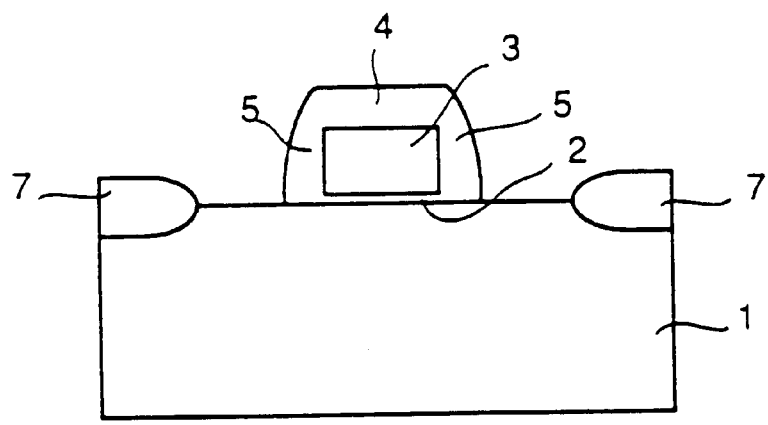

An oxide film (not shown) of about 800 Å in thickness is formed on the overall surface by CDV, and thereafter this oxide film is etched back to form side wall oxide films 5, as shown in FIG. 15.

Figure 16:
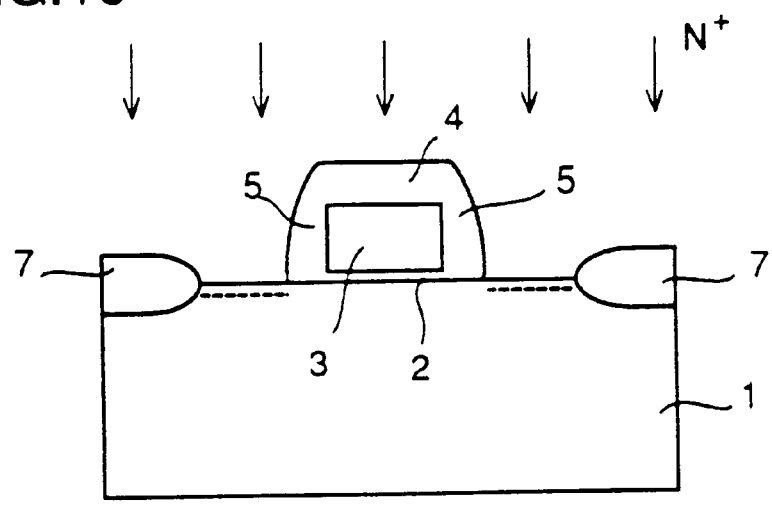
Figure 17:
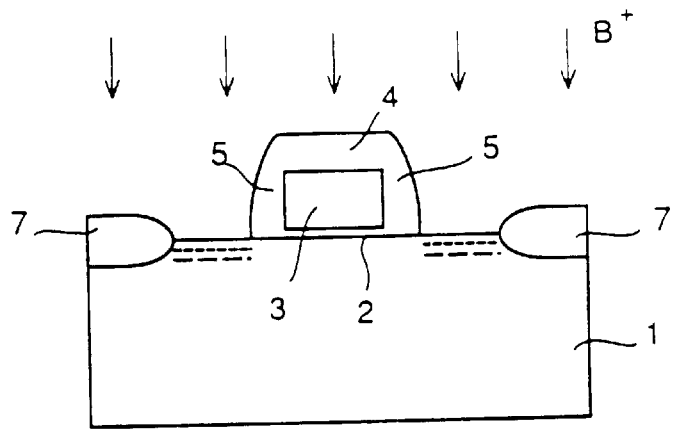

Then, the side wall oxide films 5 and the element isolation oxide film 7 are employed as masks to implant nitrogen into the N-type silicon substrate 1 under conditions of 10 keV and $2 \times 10^{15}/cm^2$, as shown in FIG. 16. Thereafter the side wall oxide films 5 and the element isolation oxide film 7 are again employed as masks to ion-implant boron into the N-type silicon substrate 1, as shown in FIG. 17. Then heat treatment is carried out at 850° C. for about 20 minutes, thereby activating the impurities as implanted. Thus, the source/drain regions 6 and the nitrogen-doped regions 30 are formed as shown in FIG. 11.

Figure 18:
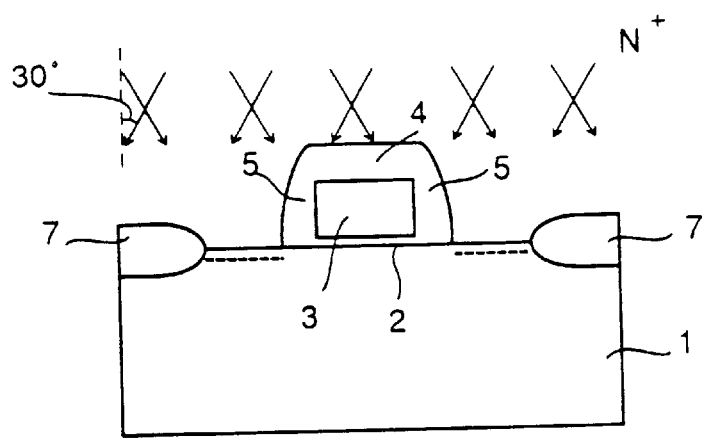
FIGS. 18 and 19 are sectional views for illustrating another exemplary fabrication process for the PMOS transistor according to the second embodiment shown in FIG. 11.
Figure 19:
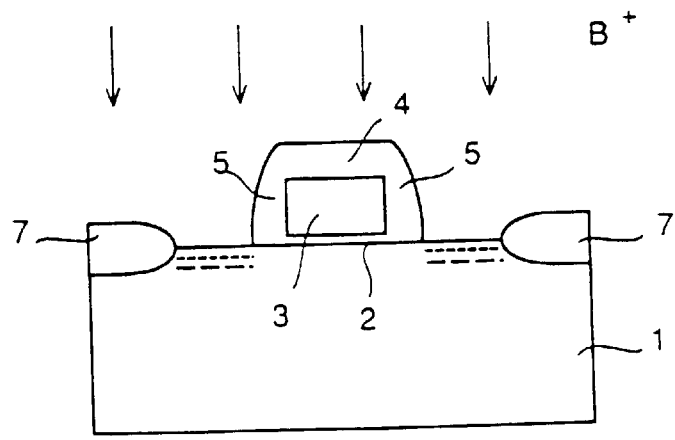

With reference to FIGS. 18 and 19, another exemplary fabrication process for the PMOS transistor according to the second embodiment shown in FIG. 11 is now described.

Figure 14:
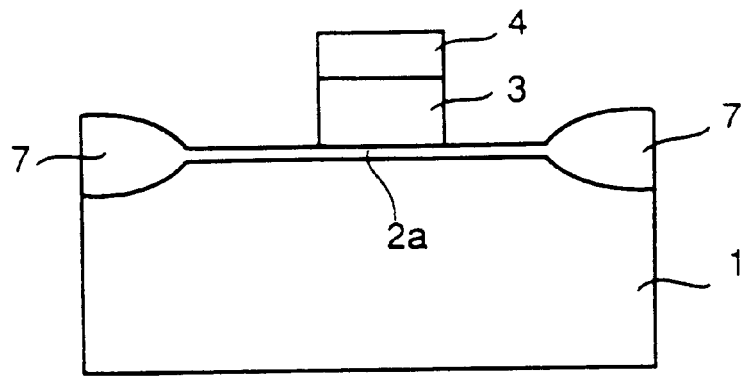

A process up to formation of side wall oxide films 5 is similar to that described with reference to FIGS. 13 to 15. Thereafter the side wall films 5 and element isolation oxide film 7 are employed as masks to implant nitrogen ions into an N-type silicon substrate 1 at an angle of incidence of 30°. In more concrete terms, the N-type silicon substrate 1 is rotated so that nitrogen ions are implanted into the same under conditions of 12 keV and $2.5 \times 10^{15}/cm^2$.

Then, boron ions are implanted into the N-type silicon substrate 1 under conditions of 10 keV and $4 \times 10^{15}/cm^2$, as shown in FIG. 19. Thereafter heat treatment is carried out at 850° C. for about 20 minutes, thereby activating the impurities as implanted. Thus, the source/drain regions 6 and the nitrogen-doped regions 30 are formed as shown in FIG. 11.

The nitrogen implantation conditions in the fabrication process for the PMOS transistor according to the second embodiment are now described in further detail. Nitrogen is implanted at such energy that the projection range of nitrogen is smaller than that of boron, so that no defects are caused in the junction planes between the source/drain regions 6 and the N-type silicon substrate 1 in nitrogen implantation and no junction leakage current is caused in element operation.

Figure 20:
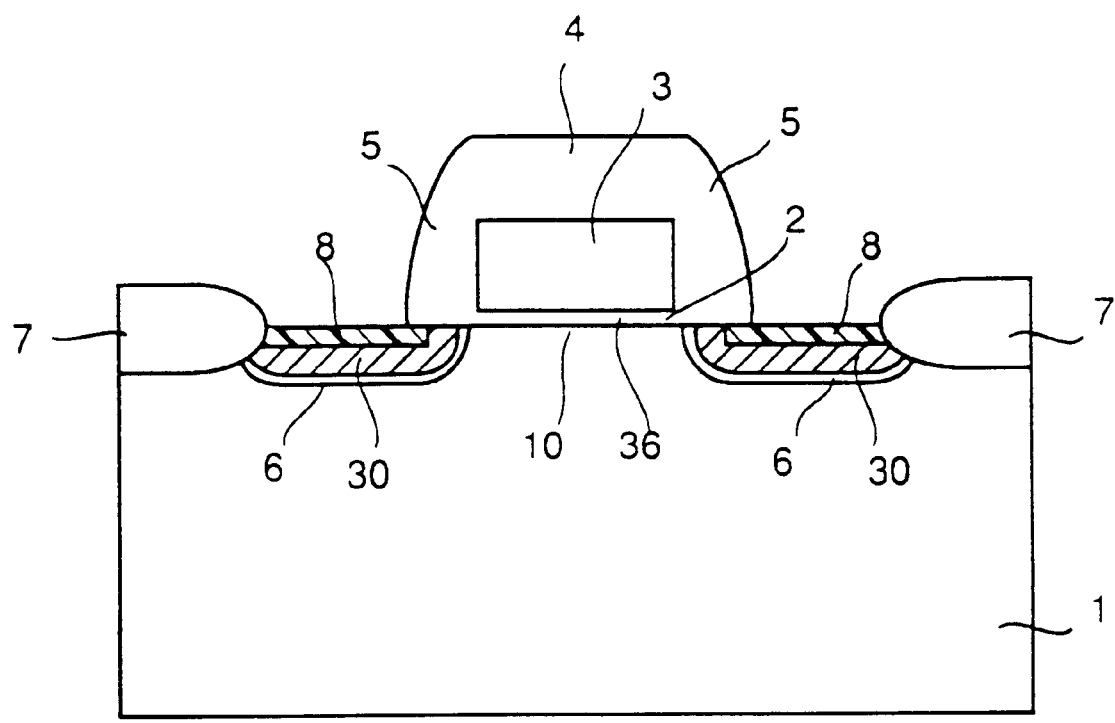
FIG. 20 is a sectional view showing a modification of the PMOS transistor according to the second embodiment shown in FIG. 11.

While the N-type gate electrode 3 is employed in the above description, the same may be replaced by a P-type gate electrode, or a gate electrode having a layered structure of a metal silicide layer and a polysilicon layer so that the gate electrode is reduced in sheet resistance. Further, titanium silicide films 8 may be formed on the source/drain regions 6 as shown in FIG. 20, in order to reduce the source/drain regions 6 in resistance. These titanium silicide films 8 can be readily formed by employing a titanium salicide step after the step described with reference to FIG. 19. While boron is ion-implanted in formation of the source/drain regions 6 in the aforementioned fabrication process for the PMOS transistor according to the second embodiment, further, boron fluoride ions may alternatively be implanted into the source/drain regions 6 if no titanium silicide films 8 shown in FIG. 20 are formed thereon. While the second embodiment has been described with reference to a PMOS transistor alone, this embodiment may also be applied to a CMOS transistor including a PMOS transistor.

Figure 21:
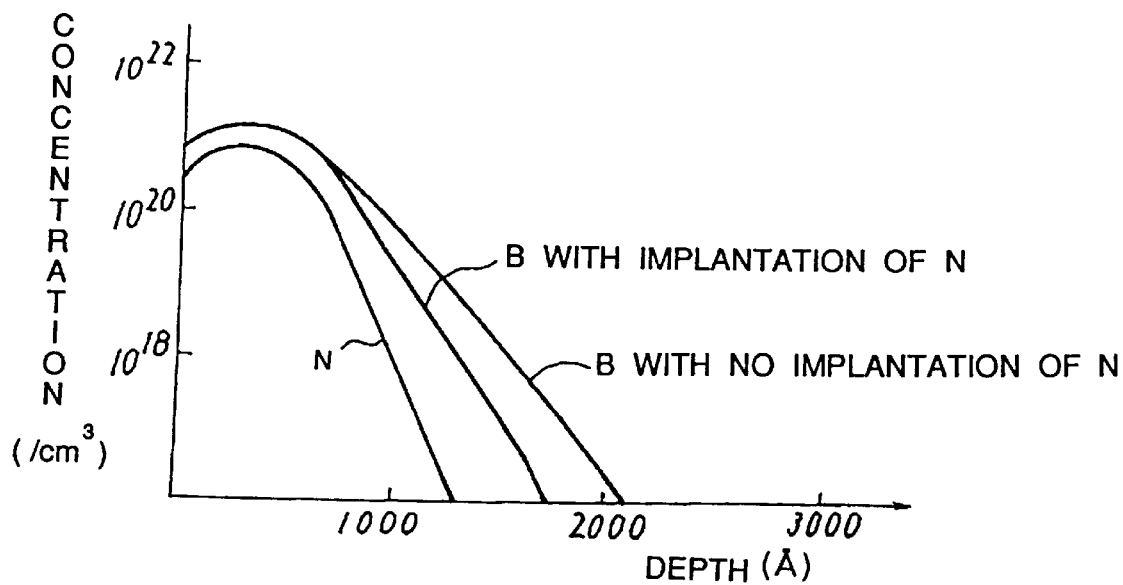
FIG. 21 illustrates an impurity profile along a depth direction of the source/drain region of the PMOS transistor according to the second embodiment shown in FIG. 11.

Effects of the second embodiment are now described. The $P^+$-type source/drain regions 6 are doped with nitrogen, whereby diffusion of boron is suppressed. Namely, nitrogen is in the same hole diffusion mechanism as boron and has a larger diffusion coefficient than boron, and hence nitrogen and boron are mutually diffused. Thus, nitrogen occupies holes, which are diffusion paths, in advance, whereby it is possible to suppress diffusion of boron. Thus, it is possible to form the source/drain regions 6 with shallow junction planes. In the second embodiment, nitrogen is implanted at such energy that the projection range of nitrogen is smaller than that of boron, in order to prevent damage caused by nitrogen implantation. Also in this case, it is possible to sufficiently suppress diffusion of boron even if the end of nitrogen concentration distribution in nitrogen implantation is not deeper than that of boron concentration distribution in boron implantation, as shown in FIG. 21.

When nitrogen is doped by ion implantation, further, the N-type silicon substrate 1 is brought into an amorphous state, whereby it is possible to suppress a channeling phenomenon in subsequent ion implantation of boron. Thus, it is possible to form the source/drain regions 6 with shallow junction planes. Further, the N-type silicon substrate 1 is brought into an amorphous state by nitrogen at a smaller degree, as compared with an amorphous state implemented by ion implantation of germanium and silicon, whereby no high temperature heat treatment is required for crystal recovery. Thus, this method is further effective for formation of shallow junction planes. Further, the source/drain regions 6 can be formed with no implantation of boron fluoride, whereby it is possible to eliminate prevention of a silicide reaction caused by fluorine contained in boron fluoride when the source/drain regions 6 are reduced in resistance through a salicide step. Consequently, it is possible to form an excellent metal silicide film. Further, it is possible to further suppress transverse diffusion of boron by doping nitrogen by oblique rotation implantation. As the result, it is possible to increase the effective gate length of the transistor.

A nitrogen concentration peak in the nitrogen-doped region 30 in each source/drain region 6 is preferably set in a range of $10^{19}/cm^3$ to $10^{21}/cm^3$. Therefore, the injection rate for nitrogen ions in the fabrication process may be set in a range of $10^{14}/cm^2$ to $10^{16}/cm^2$. None of the aforementioned effects can be attained if the nitrogen concentration peak is lower than $10^{19}/cm^3$, while the rate of activation of boron is reduced and each source/drain region 6 is increased in resistance if the nitrogen concentration peak is higher than $10^{21}/cm^3$.

Figure 22:
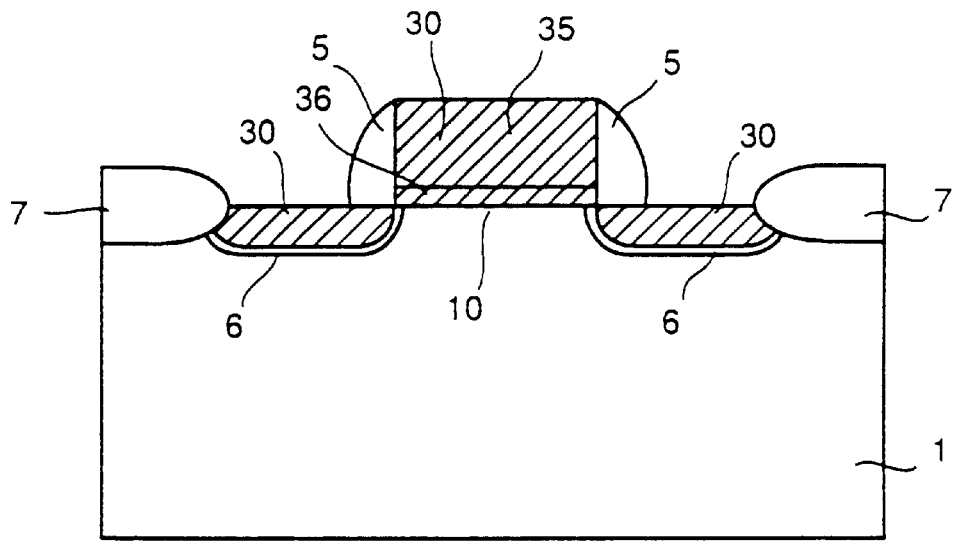
FIG. 22 is a sectional view showing a PMOS transistor according to a third embodiment of the present invention.

With reference to FIG. 22, a PMOS transistor according to a third embodiment of the present invention is now described. As shown in FIG. 22, the third embodiment has a structure obtained by combining the first and second embodiments with each other.

With reference to FIGS. 23 to 26, an exemplary fabrication process for the PMOS transistor according to the third embodiment shown in FIG. 22 is now described.

Figure 23:
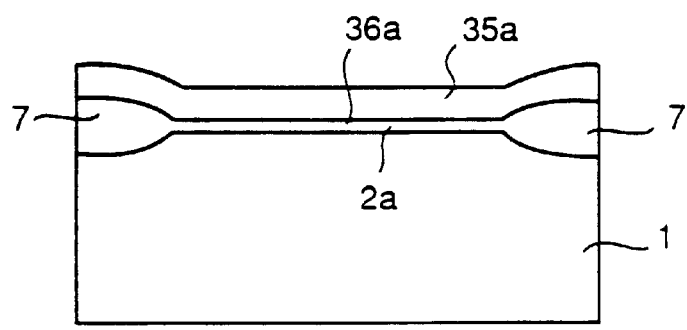
FIGS. 23 to 26 are sectional views for illustrating an exemplary fabrication process for the PMOS transistor according to the third embodiment shown in FIG. 22.
Figure 24:
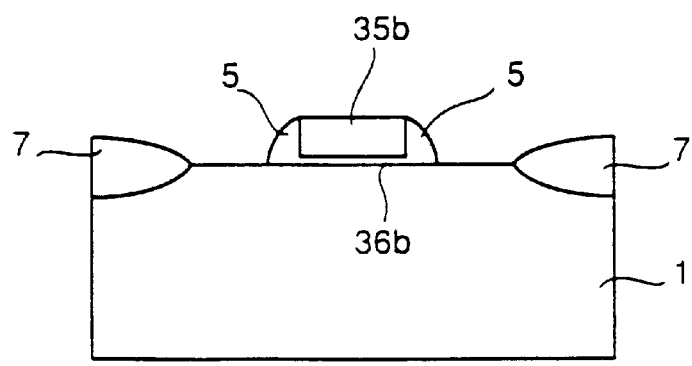

First, element isolation oxide film 7 and an oxide film 36a of about 100 Å in thickness are formed on an N-type silicon substrate 1, as shown in FIG. 23. A polysilicon substrate 35a of about 2000 Å in thickness is formed by CDV. The polysilicon film 35a and the oxide film 36a are patterned by photolithography and anisotropic etching. Thus, a patterned polysilicon film 35b is obtained as shown in FIG. 24. Thereafter an oxide film (not shown) of about 800 Å in thickness is formed by CVD and this oxide film is etched back, to form side wall oxide films 5 and a gate oxide film 36b.

Figure 25:
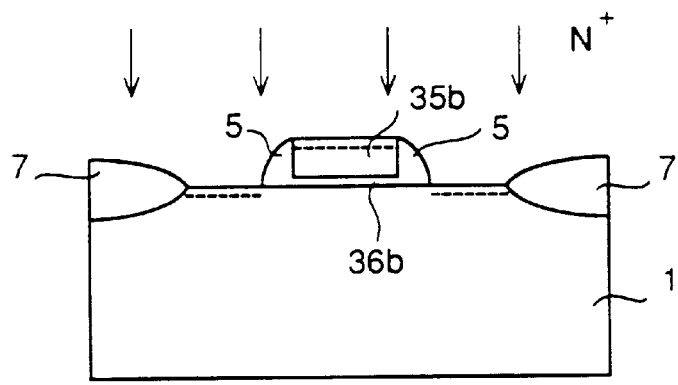

Then, nitrogen ions are implanted into the polysilicon film 35b and source/drain forming regions under conditions of 10 keV and $2 \times 10^{15}/cm^2$, so that a range center comes to an upper portion of the polysilicon film 35b, as shown in FIG. 25.

Figure 26:
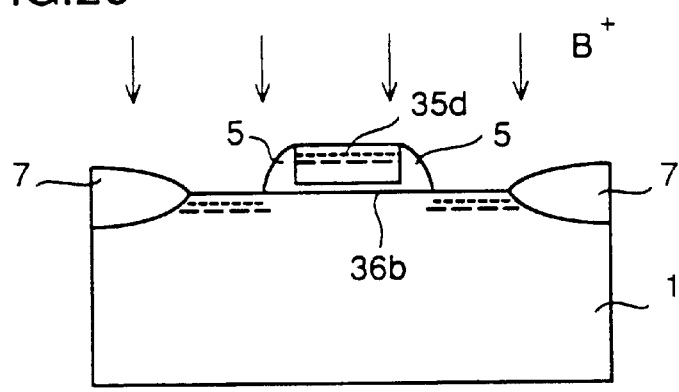

Then, boron ions are implanted into the polysilicon film 35b and the source/drain forming regions under conditions of 10 keV and $4 \times 10^{15}/cm^2$, as shown in FIG. 26. Thereafter heat treatment is carried out at 850° C. for about 20 minutes, thereby activating the impurities as implanted. Thus, source/drain regions 6, a gate electrode 35 and nitrogen-doped regions 30 are formed as shown in FIG. 22. While nitrogen which is doped into the upper portion of the gate electrode 35b is thermally diffused in the heat treatment, nitrogen segregates in the gate oxide film 36b. Thus, a gate oxide film 36 having a nitrogen concentration peak as shown in FIG. 2 is formed. The conditions of nitrogen implantation into the source/drain regions 6 and the gate electrode 35 are as described above with reference to the first and second embodiments.

With reference to FIGS. 27 to 32, another exemplary fabrication process for the PMOS transistor according to the third embodiment shown in FIG. 22 is now described.

Figure 27:
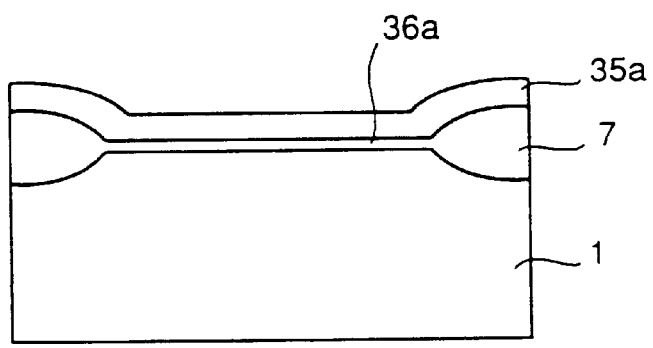
FIGS. 27 to 32 are sectional views for illustrating another exemplary fabrication process for the PMOS transistor according to the third embodiment shown in FIG. 22.

First, element isolation oxide film 7, an oxide film 36a of about 100 Å in thickness and a polysilicon film 35a of about 2000 Å in thickness are formed on an N-type silicon substrate 1, as shown in FIG. 27.

Figure 28:
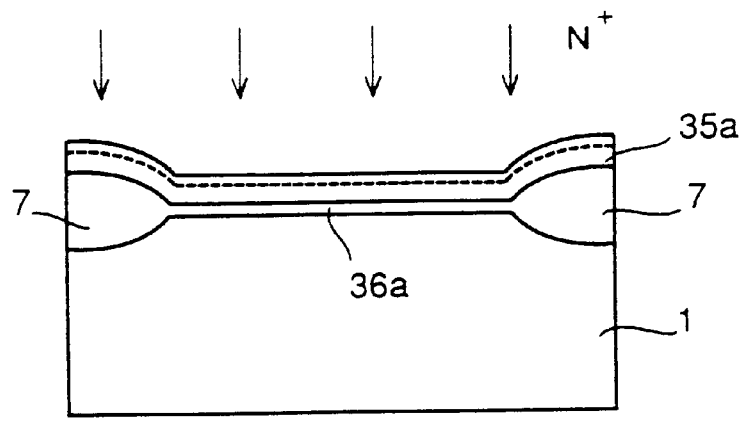
Figure 29:
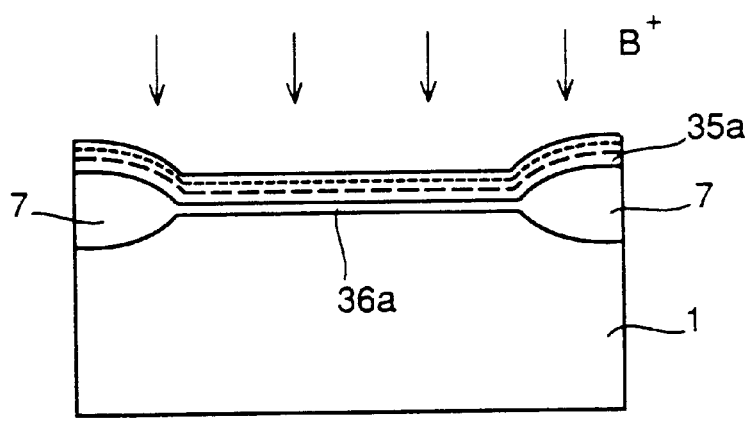
Figure 30:
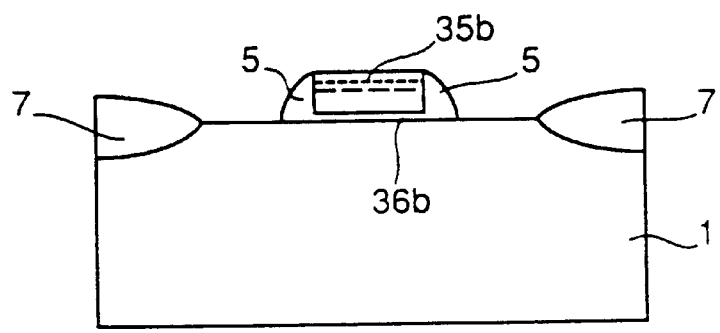

Then, nitrogen ions are implanted into the polysilicon film 35a under conditions of 20 keV and $4 \times 10^{15}/cm^2$, so that a projection range comes to a portion of the polysilicon film 35a upward beyond its thickness center, as shown in FIG. 28. Thereafter boron ions are further implanted into the polysilicon film 35a under conditions of 20 keV and $4 \times 10^{15}/cm^2$. Then, the polysilicon film 35a is patterned by photolithography and anisotropic etching, to form a gate electrode 35b shown in FIG. 30. Thereafter an oxide film (not shown) of about 800 Å in thickness is formed by CVD and this oxide film is etched back, to form side wall oxide films 5 and a gate oxide film 36b.

Figure 31:
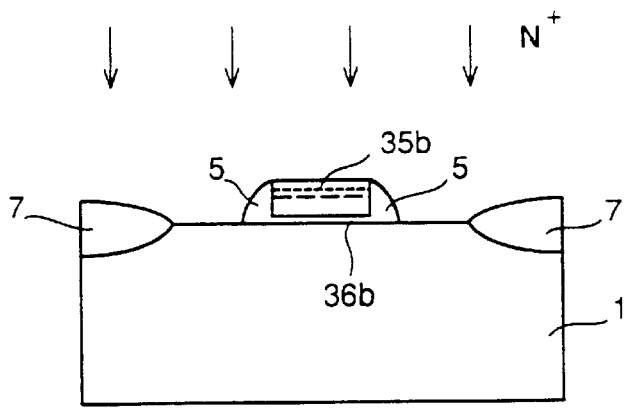
Figure 32:
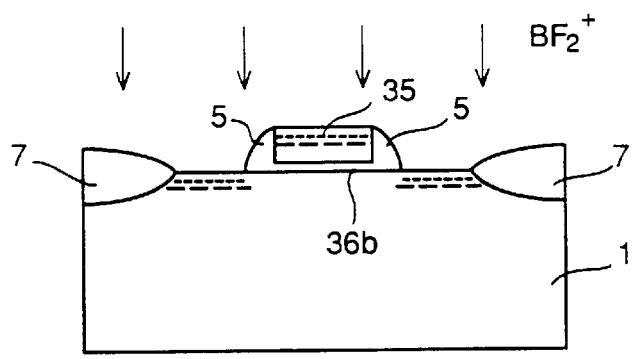

Then, nitrogen is ion-implanted into source/drain forming regions under conditions of 10 keV and $2 \times 10^{15}/cm^2$, as shown in FIG. 31. Thereafter boron ions are implanted into the source/drain forming regions under conditions of 10 keV and $4 \times 10^{15}/cm^2$, as shown in FIG. 32. Finally, heat treatment is carried out at 850° C. for about 20 minutes.

While nitrogen and boron are implanted into the gate electrode 35 twice in the aforementioned second fabrication process for the PMOS transistor according to the third embodiment, the present invention is not restricted to this but the following fabrication process is also employable: After the step shown in FIG. 29, an oxide film of about 2000 Å in thickness is formed on the polysilicon film 35a by CDV, and thereafter patterned. Thus, an oxide film is formed on the gate electrode 35 for serving as a stopper film for impurity introduction into the gate electrode 35. This oxide film may be employed as a mask for ion-implanting boron and nitrogen only into the source/drain regions 6. While boron ions are implanted before patterning of the gate electrode 35 in the aforementioned fabrication process for the PMOS transistor according to the third embodiment, this implantation step may alternatively be omitted so that boron ions are implanted into the gate electrode 35 simultaneously with implantation of boron ions into the source/drain regions 6.

Figure 33:
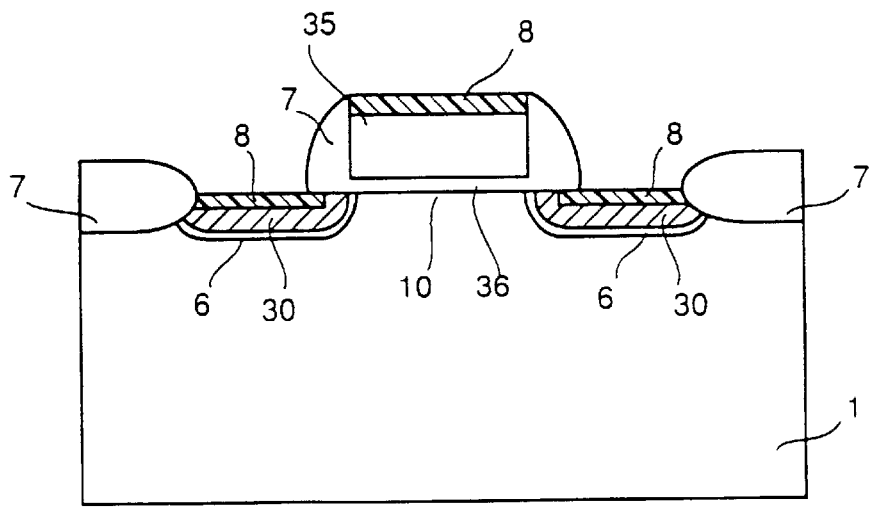
FIG. 33 is a sectional view for illustrating a modification of the PMOS transistor according to the third embodiment shown in FIG. 22.

While the third embodiment has been described with reference to a PMOS transistor alone, the present invention is not restricted to this but also applicable to a CMOS transistor including a PMOS transistor. Further, titanium silicide layers 8 may be formed on the source/drain regions 6 as shown in FIG. 33, in order to reduce the gate electrode 35 and the source/drain regions 6 in resistance. Such titanium silicide layers 8 can be readily formed on the gate electrode 35 and the source/drain regions 6 through a titanium salicide step, after the step shown in FIG. 26 or 32.

Effects of the PMOS transistor according to the third embodiment are similar to those of the first and second embodiments. According to the third embodiment, further, it is possible to change nitrogen profiles of the gate electrode 35 and the source/drain regions 6 by separately carrying out nitrogen implantation steps for the gate electrode 35 and the source/drain regions 6 although the number of steps is increased, thereby optimizing the respective nitrogen profiles. Thus, it is possible to further effectively prevent boron from punching through the gate oxide film 36 and from diffusion in the source/drain regions 6.

Figure 34:
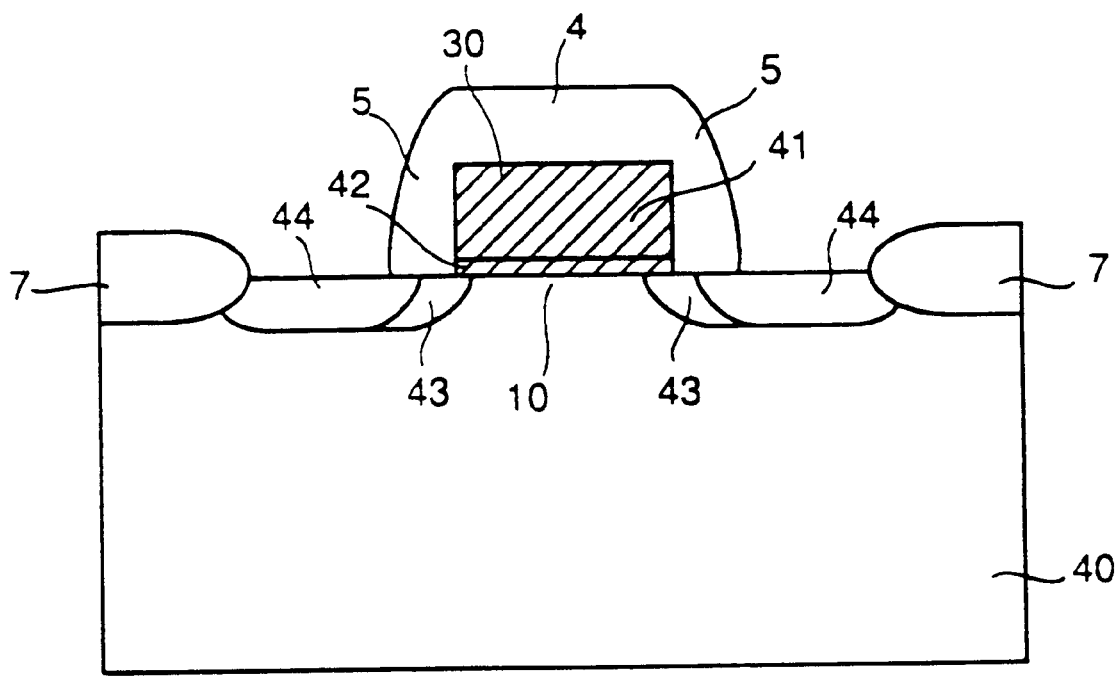
FIG. 34 is a sectional view showing an NMOS transistor according to a fourth embodiment of the present invention.
Figure 35:
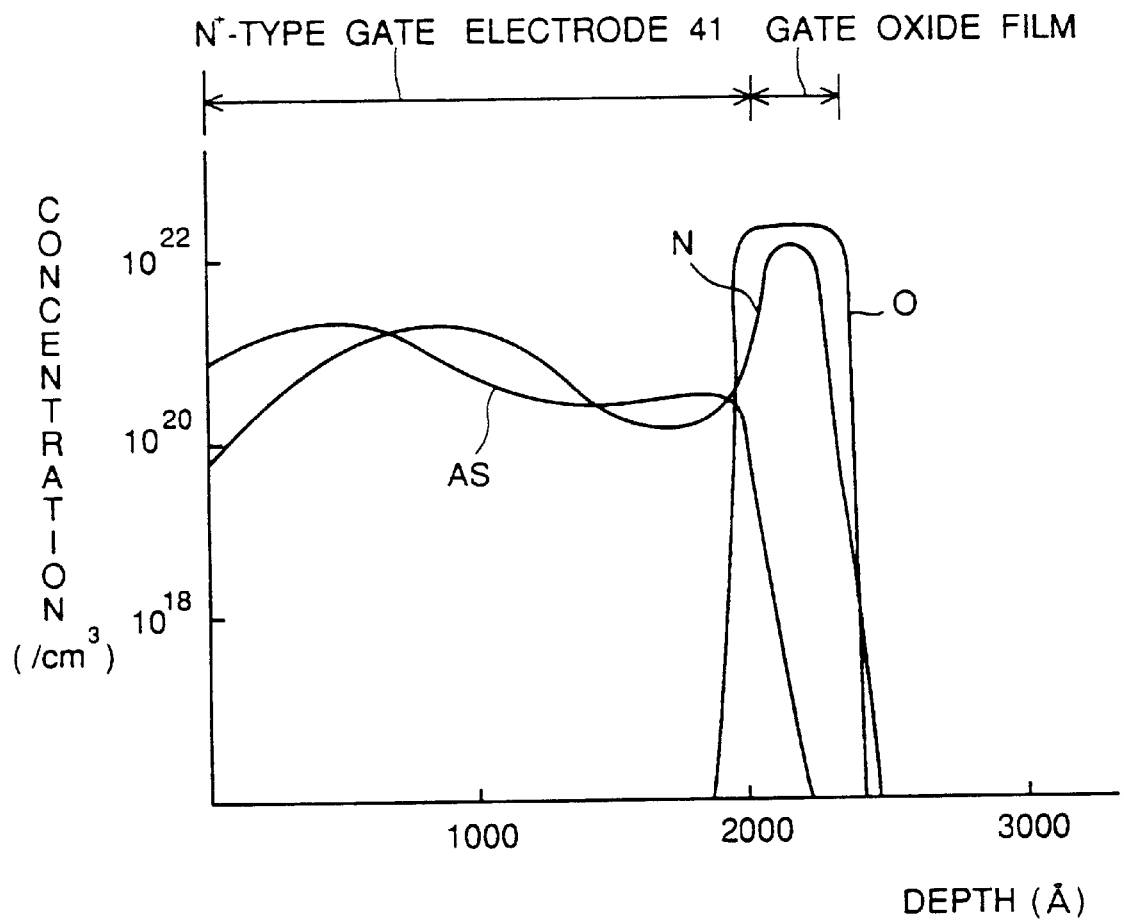
FIG. 35 illustrates an impurity profile along a depth direction of a gate electrode and a gate oxide film of the NMOS transistor according to the fourth embodiment shown in FIG. 34.

With reference to FIG. 34, an NMOS transistor according to a fourth embodiment of the present invention is now described. As shown in FIG. 34, element isolation oxide film 7 are formed on a main surface of a P-type silicon substrate 40 in the NMOS transistor according to the fourth embodiment. Further, N$^-$-type source/drain regions 43 are formed on an active region which is held between the element isolation oxide film 7 at a prescribed space, to hold a channel region 10 therebetween. N$^+$-type source/drain regions 44 are formed to be adjacent to the N$^-$-type source/drain regions 43. The N$^-$-type source/drain regions 43 and the N$^+$-type source/drain regions 44 form an NMOS transistor of an LDD (lightly-doped drain) structure. Referring to FIG. 35, it is understood that nitrogen is deposited in a gate oxide film 42 in the NMOS transistor according to the fourth embodiment.

With reference to FIGS. 36 to 41, a fabrication process for the NMOS transistor according to the fourth embodiment is now described.

Figure 36:
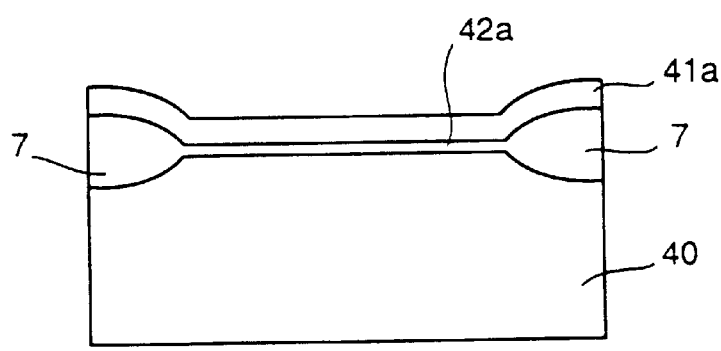
FIGS. 36 to 41 are sectional views for illustrating a fabrication process for the NMOS transistor according to the fourth embodiment shown in FIG. 34.
Figure 37:
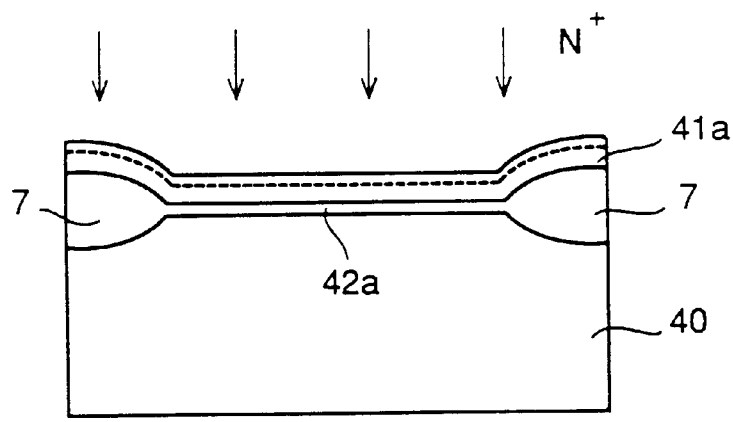

First, element isolation oxide film 7 are formed on a P-type silicon substrate 40 through an ordinary element isolation step, as shown in FIG. 36. An oxide film 42a of about 100 Å in thickness is formed by thermal oxidation, and thereafter a polysilicon film 41a of about 2000 Å in thickness is formed by CDV.

Figure 38:
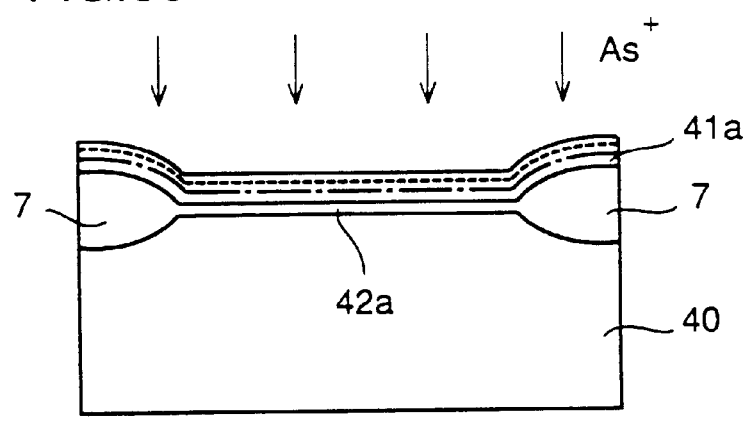

Then, nitrogen ions are implanted under conditions of 20 keV and $1 \times 10^{16}/cm^2$, so that a range center comes to an upper portion of the polysilicon film 41a. Thereafter arsenic ions are implanted into the polysilicon film 41a under conditions of 30 keV and $4 \times 10^{15}/cm^2$, as shown in FIG. 38. Then, the polysilicon film 41a is patterned by photolithography and anisotropic etching, to form a gate electrode 41.

Figure 39:
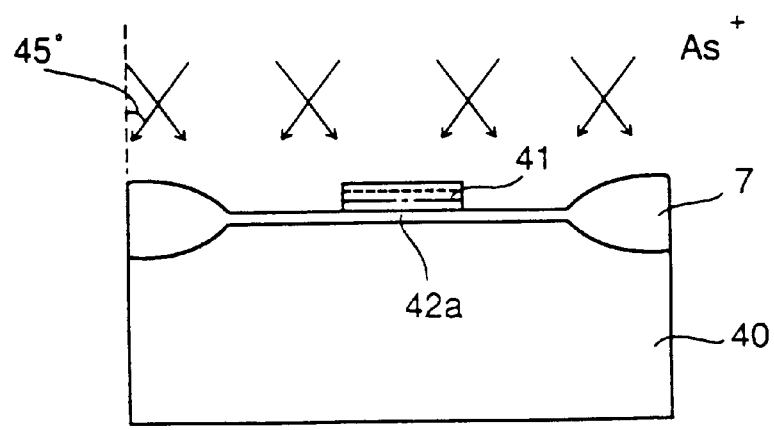
Figure 40:
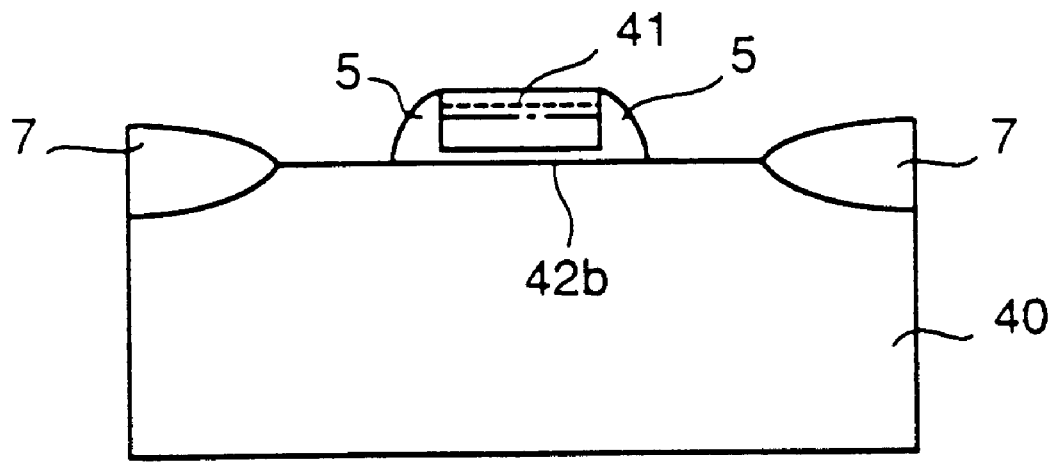
Figure 41:
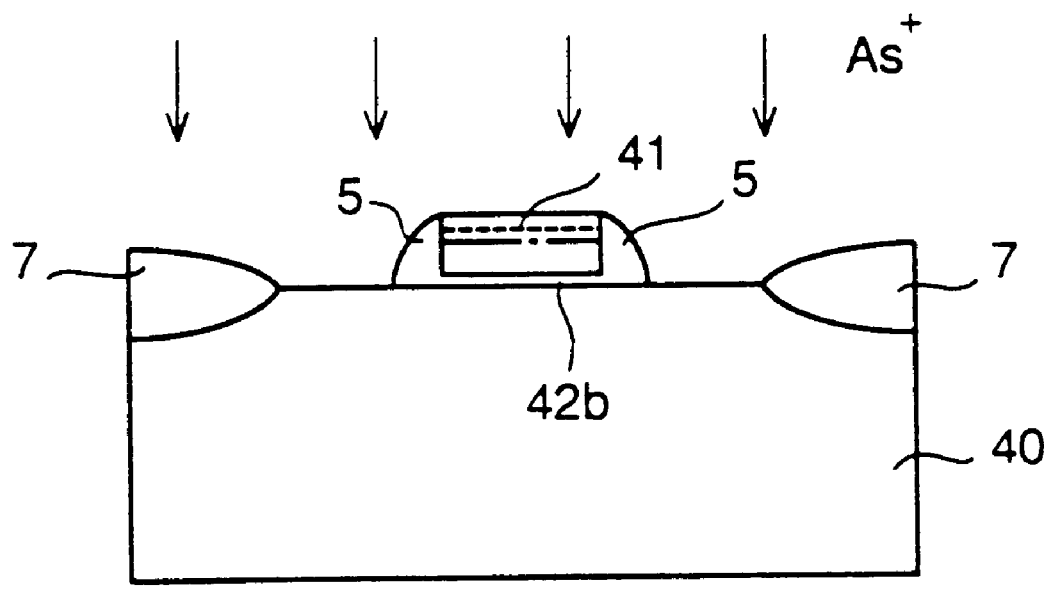

Then, arsenic ions are implanted into source/drain forming regions at an angle of incidence of 45°, as shown in FIG. 39. In more concrete terms, the P-type silicon substrate 40 is rotated, so that arsenic ions are implanted into the same under conditions of 50 keV and $4 \times 10^{13}/cm^2$. Thereafter an oxide film of about 800 Å in thickness is formed by CDV, and this oxide film is etched back. Thus, side wall oxide films 5 and a gate oxide film 42b are formed as shown in FIG. 40. Thereafter arsenic ions are implanted into N$^+$-type source/drain forming regions under conditions of 50 keV and $4 \times 10^{15}/cm^2$.

Finally, heat treatment is carried out at 850° C. for about 20 minutes, thereby activating the impurities as implanted. Thus, the N$^-$-type source/drain regions 43, the N$^+$-type source/drain regions 44, the gate electrode 41 and nitrogen-doped regions 30 are formed as shown in FIG. 34. Nitrogen segregates in the gate oxide film 42b, whereby a gate oxide film 36 having a nitrogen concentration peak as shown in FIG. 35 is formed. A projection range $R_P$ of nitrogen is set to come to a position of the gate electrode 41 upward beyond a position separated by $5 \times \Delta R_P$ from the interface between the $N^+$-type gate electrode 41 and the gate oxide film 42 toward the $N^+$-type source/drain regions 44, assuming that $\Delta R_P$ represents its standard deviation.

While arsenic is ion-implanted into the polysilicon film 41a to form the gate electrode 41 which is doped in an N type in the above description, the present invention is not restricted to this but the gate electrode 41 which is doped in an N type may alternatively be formed through a doped polysilicon film which is doped with phosphorus by about $5 \times 10^{20}/cm^3$. While the fourth embodiment has been described with reference to an NMOS transistor alone, this embodiment is also applicable to a CMOS transistor including an NMOS transistor.

Figure 42:
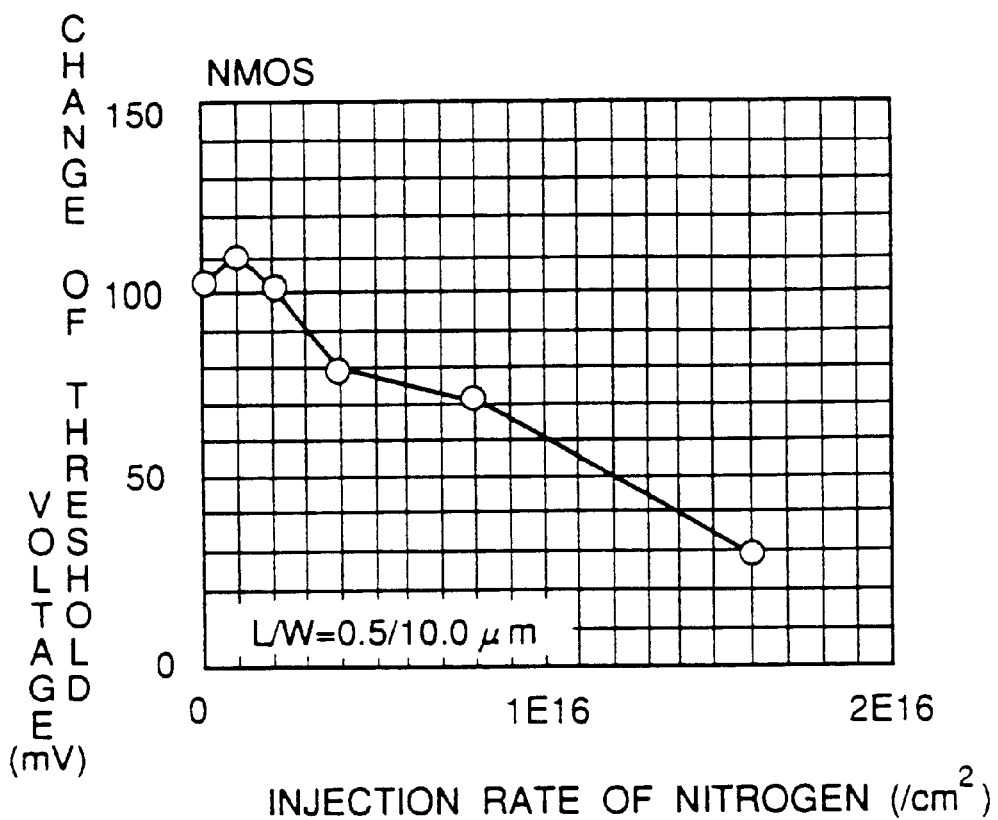
FIG. 42 is a graph showing relation between of an injection rate of nitrogen with respect to a gate electrode and a threshold voltage.

As to an effect of the fourth embodiment, nitrogen is deposited in the gate oxide film 42 in later heat treatment, since the gate electrode 41 is doped with nitrogen in its upper portion. Consequently, an interfacial level is reduced at the interface between the gate oxide film 42 which is formed by a silicon oxide film and the P-type substrate 40 which is made of silicon. Thus, the gate oxide film 42 is improved in reliability, while hot carrier resistance is effectively improved. Evaluation of reliability of the gate oxide film 42 is as described above with reference to FIG. 9. FIG. 42 shows dependence of a threshold voltage of the NMOS transistor, caused by hot carrier injection, on the nitrogen injection rate. Referring to FIG. 42, change of the threshold voltage was measured after a constant stress voltage was applied for 100 seconds. Change of the threshold voltage is reduced when the injection rate of nitrogen into the gate electrode 41 is increased. Thus, it is understood that hot carrier resistance of the NMOS transistor is improved when the gate electrode 41 is doped with nitrogen so that nitrogen is deposited in the gate oxide film 42.

A nitrogen concentration peak in the nitrogen-doped region 30 in each of the gate electrode 41 and the gate oxide film 42 is preferably set in a range of $10^{19}/cm^3$ to $10^{21}/cm^3$. Therefore, the injection rate of nitrogen ions in the fabrication steps may be set in a range of $10^{14}/cm^2$ to $10^{16}/cm^2$.

Figure 43:
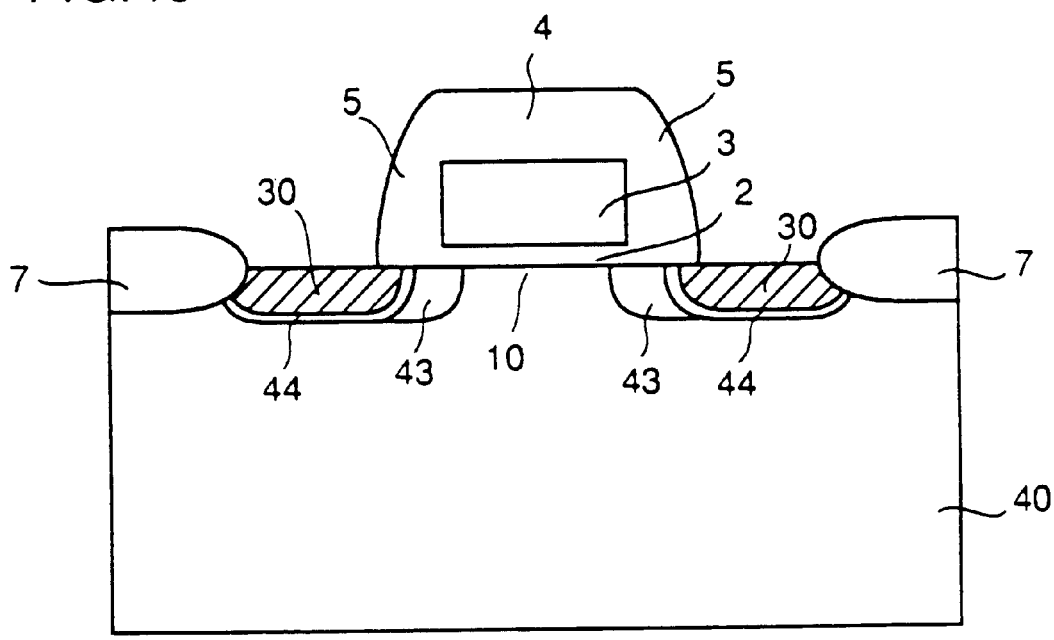
FIG. 43 is a sectional view showing an NMOS transistor according to a fifth embodiment of the present invention.
Figure 44:
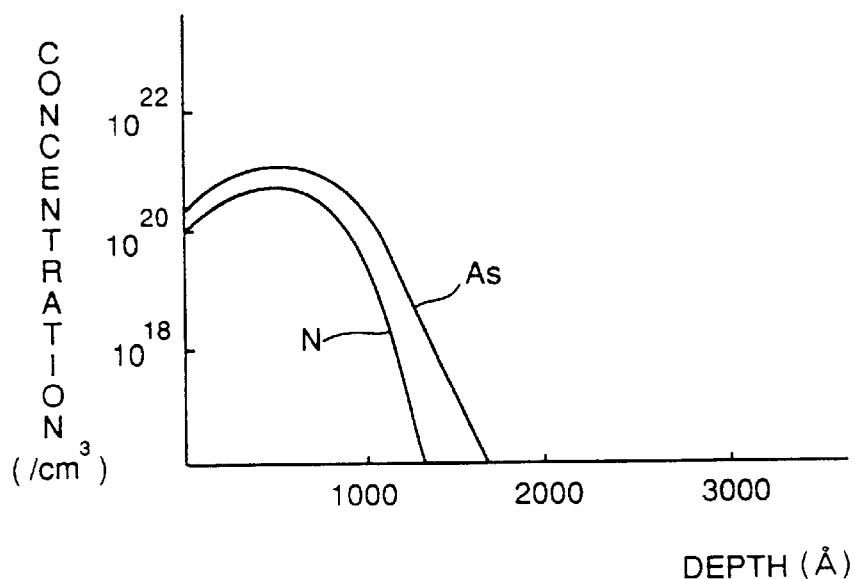
FIG. 44 illustrates an impurity profile in a depth direction of an $N^+$ source/drain region of the NMOS transistor shown in FIG. 43.

With reference to FIG. 43, an NMOS transistor according to a fifth embodiment of the present invention is now described. In the NMOS transistor according to the fifth embodiment, nitrogen-doped regions 30 are formed in $N^+$-type source/drain regions 44. Referring to FIG. 44, it is understood that junction planes of $N^-$-type source/drain regions 43 are not doped with nitrogen but the nitrogen-doped regions 30 exist in the $N^+$-type source/drain regions 44 which are formed by doping arsenic.

With reference to FIGS. 45 to 48, a fabrication process for the NMOS transistor according to the fifth embodiment shown in FIG. 43 is now described.

Figure 45:
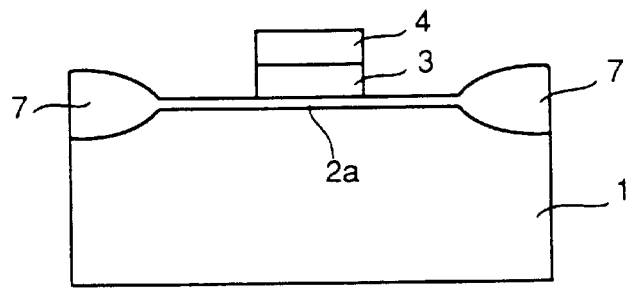
FIGS. 45 to 48 are sectional views for illustrating a fabrication process for the NMOS transistor according to the fifth embodiment shown in FIG. 43.

First, element isolation oxide film 7 and an oxide film 2a of about 100 Å in thickness are formed on a P-type silicon substrate 40, as shown in FIG. 45. Further, a polysilicon film (not shown) which is doped with phosphorus by about $5 \times 10^{20}/cm^3$ is formed on the oxide film 2a in a thickness of about 2000 Å by CDV. An oxide film (not shown) of about 2000 Å in thickness is formed on this polysilicon film. The oxide film and the polysilicon film are patterned in the form of a gate electrode by photolithography and anisotropic etching. Thus, an oxide film 4 and a gate electrode 3 are formed as shown in FIG. 45.

Figure 46:
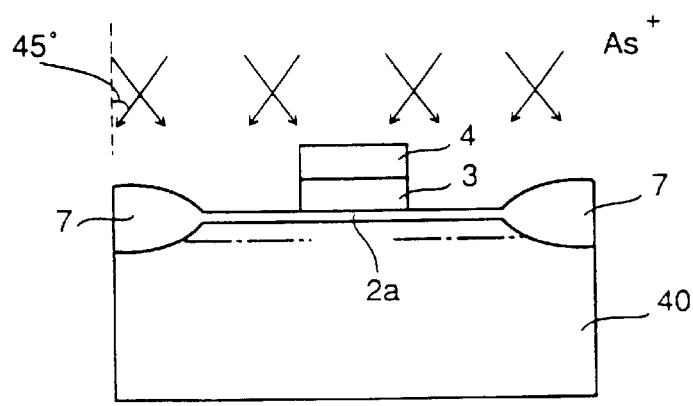
Figure 47:
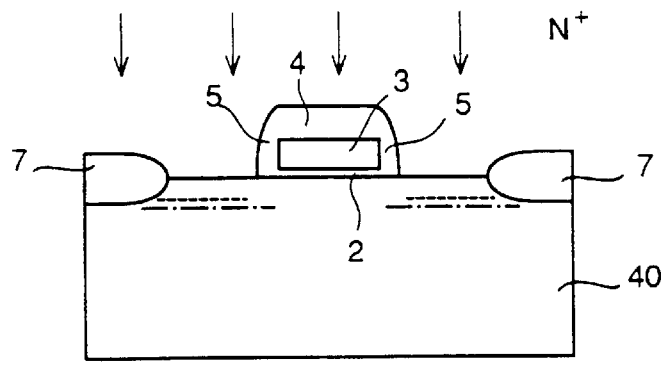
Figure 48:
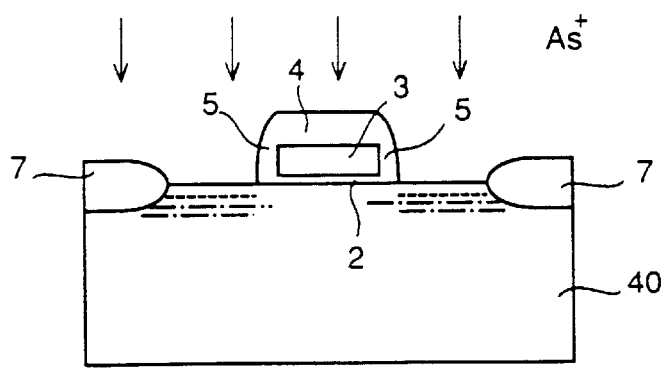

Then, the gate electrode 3, the oxide film 4 and the element isolation oxide film 7 are employed as masks to ion-implant arsenic ions into the P-type silicon substrate 40 at an angle of incidence of 45°, as shown in FIG. 46. In more concrete terms, the P-type silicon substrate 40 is rotated so that the arsenic ions are implanted into the same at the angle of incidence of 45° under conditions of 50 keV and $4 \times 10^{13}/cm^2$. Thereafter an oxide film (not shown) of about 800 Å in thickness is formed by CDV, and this oxide film is etched back. Thus, side wall oxide films 5 and a gate oxide film 2 are formed as shown in FIG. 47. Further, the side wall oxide films 5 and the element isolation oxide film 7 are employed as masks to implant nitrogen ions into the P-type silicon substrate 40 under conditions of 10 keV and $2 \times 10^{15}/cm^2$. Further, the side wall oxide films 5 and the element isolation oxide film 7 are again employed as masks to implant arsenic ions into the P-type silicon substrate 40 under conditions of 50 keV and $4 \times 10^{15}/cm^2$. Heat treatment is carried out at 850° C. for about 20 minutes, thereby activating the impurities as implanted. Thus, the $N^-$-type source/drain regions 43, the $N^+$-type source/drain regions 44 and the nitrogen-doped regions 30 are formed as shown in FIG. 42.

Conditions for nitrogen implantation in the aforementioned fabrication process for the NMOS transistor according to the fifth embodiment are identical to those described with reference to the first embodiment. Namely, nitrogen is implanted at such energy that its projection range is smaller than that of arsenic.

Figure 49:
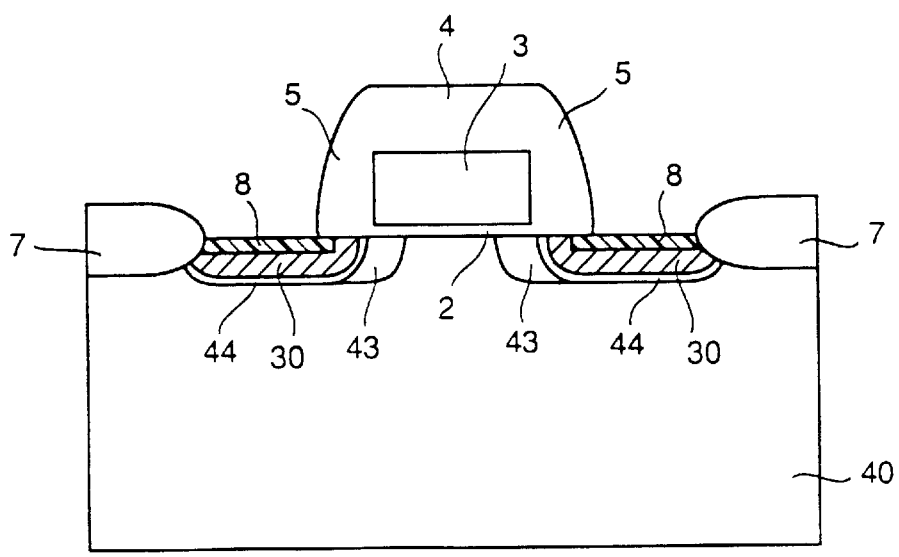
FIG. 49 is a sectional view for illustrating a modification of the NMOS transistor according to the fifth embodiment shown in FIG. 43.

While the gate electrode 3 is formed by a polysilicon film which is doped with phosphorus in the aforementioned fabrication process, the present invention is not restricted to this but a non-doped polysilicon film may be formed so that an N-type impurity is implanted into the same for forming a gate electrode. Further, a gate electrode having a layered structure of a metal silicide film and a polysilicon film may be employed so that the gate electrode is reduced in sheet resistance. As shown in FIG. 49, further, titanium silicide films 8 may be formed on the $N^+$-type source/drain regions 44, so that the source/drain regions 44 are reduced in resistance. As to an effect of the fifth embodiment, the $N^+$-type source/drain regions 44 are doped with nitrogen and hence diffusion of arsenic is suppressed. Namely, the relation between boron and nitrogen described with reference to the first embodiment also applies to relation between arsenic and nitrogen. Thus, it is possible to suppress diffusion of arsenic by mutually diffusing arsenic and nitrogen, thereby forming the source/drain regions with junction planes which are shallower than those of the prior art.

A nitrogen concentration peak in the nitrogen-doped region 30 of each $N^+$-type source/drain region 44 is preferably set in a range of $10^{19}/cm^3$ to $10^{21}/cm^3$. Therefore, the injection rate for nitrogen ions in the fabrication process may be set in a range of $10^{14}/cm^2$ to $10^{16}/cm^2$. The aforementioned effect cannot be attained if the nitrogen concentration peak is lower than $10^{19}/cm^3$, while an activation rate of arsenic is reduced and hence the $N^+$-type source/drain region 44 is increased in resistance if the nitrogen concentration peak is higher than $10^{21}/cm^3$.

Figure 50:
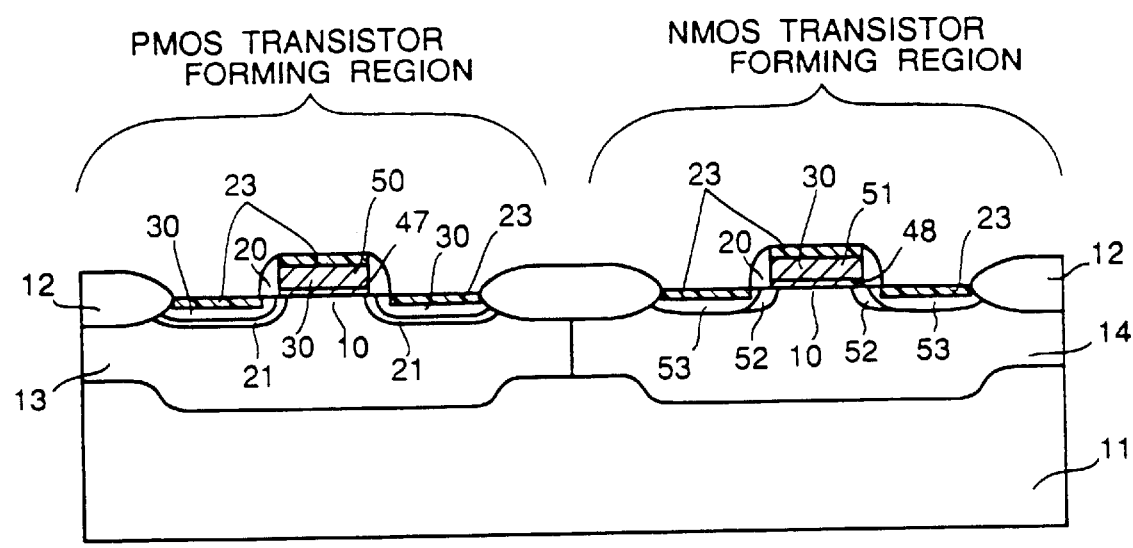
FIG. 50 is a sectional view showing a dual gate CMOS transistor according to a sixth embodiment of the present invention.

With reference to FIG. 50, a dual gate CMOS transistor according to a sixth embodiment of the present invention is now described. According to the sixth embodiment, element isolation oxide film 12 are formed on a main surface of a P-type silicon substrate 11. Further, an N well 13 and a P well 14 are formed on the main surface of the P-type silicon substrate 11, to be adjacent to each other. Source/drain regions 21 are formed on a main surface of the N well 13 at a prescribed space to hold a channel region 10 therebetween. A $P^+$-type gate electrode 50 is formed on the channel region 10 through a gate oxide film 47. Titanium silicide films 23 are formed on upper surfaces of the P⁺-type gate electrode 50 and the source/drain regions 21. Side wall oxide film s 20 are formed on side surfaces of the P⁺-type gate electrode 50. Further, nitrogen-doped regions 30 (slant portions) are formed in the source/drain regions 21, the gate oxide film 47 and the P⁺-type gate electrode 50.

On the other hand, N⁻-type source/drain regions 52 are formed on a main surface of the P well 14 at a prescribed space for holding a channel region 10 therebetween. N⁺-type source/drain regions 53 are formed in continuation to the N⁻-type source/drain regions 52. An N⁺-type gate electrode 51 is formed on the channel region 10 through a gate oxide film 48. Titanium silicide films 23 are formed on upper surfaces of the N⁺-type source/drain regions 53 and the N⁺-type gate electrode 51. Side wall oxide films 20 are formed on side surfaces of the N⁺-type gate electrode 51 and the titanium silicide film 23 provided thereon. According to the sixth embodiment, the titanium silicide films 23 are adapted to reduce the source/drain regions in resistance, while providing the gate electrodes 50 and 51 of polycide structures.

Figure 51:
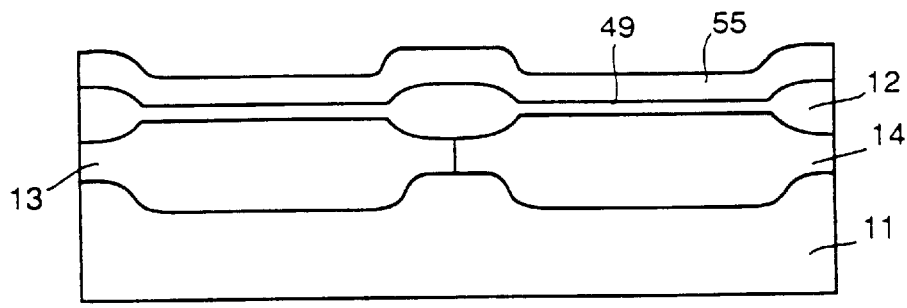

With reference to FIGS. 51 to 59, an exemplary fabrication process for the dual gate CMOS transistor according to the sixth embodiment is now described. First, an N well 13 and a P well 14 are formed in a P-type silicon substrate 11, as shown in FIG. 51. Thereafter element isolation oxide film 12 are formed on the P-type silicon substrate 11 by an ordinary element isolation step. Then, oxide films 49 of about 100 Å in thickness are formed on the N well 13 and the P well 14 by thermal oxidation. Then, a polysilicon film 55 of about 2000 Å in thickness is formed on the oxide films 49 and the element isolation oxide film 12 by CDV.

Figure 52:
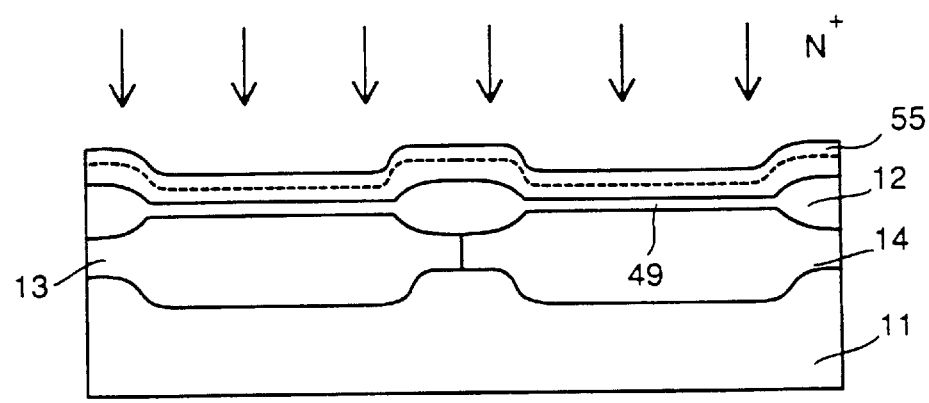
Figure 53:
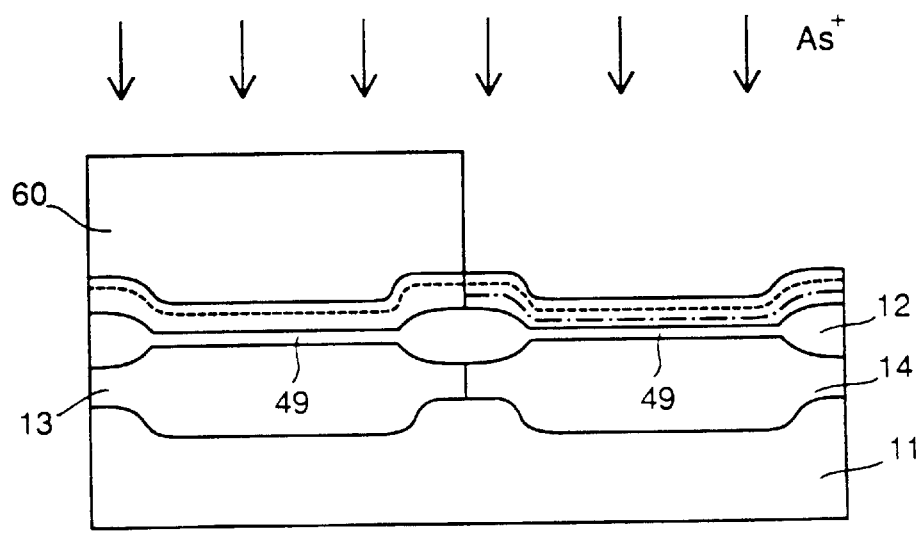

Then, nitrogen ions are implanted into the polysilicon film 55 under conditions of 20 keV and $4\times10^{15}/cm^2$, so that a range center comes to an upper portion of the polysilicon film 55, as shown in FIG. 52. Thereafter a PMOS transistor forming region is covered with a resist film 60 as shown in FIG. 53, and the resist film 60 is employed as a mask to implant arsenic ions into a portion of the polysilicon film 55 provided in an NMOS transistor forming region under conditions of 30 keV and $4\times10^{15}/cm^2$. Thereafter the resist film 60 is removed.

Figure 54:
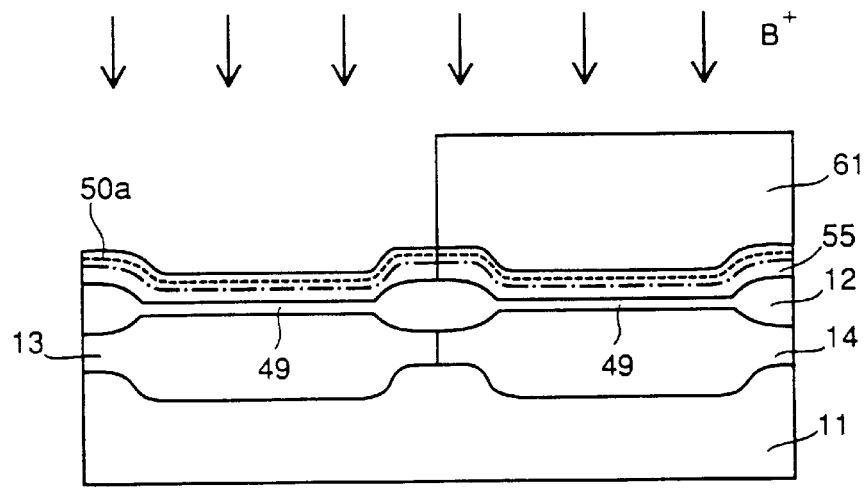
Figure 55:
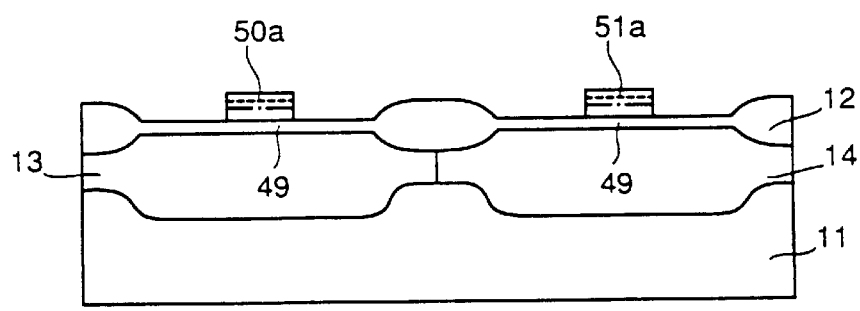

Then, the NMOS transistor forming region is covered with a resist film 61 as shown in FIG. 54, and the resist film 61 is employed as a mask to implant boron ions into a portion of the polysilicon film 55 provided in the PMOS transistor forming region under conditions of 20 kev and $4\times10^{15}/cm^2$. Thereafter the resist film 61 is removed. The polysilicon film 55 is patterned by photolithography and anisotropic etching, thereby forming polysilicon films 50a and 51a as shown in FIG. 55.

Figure 56:
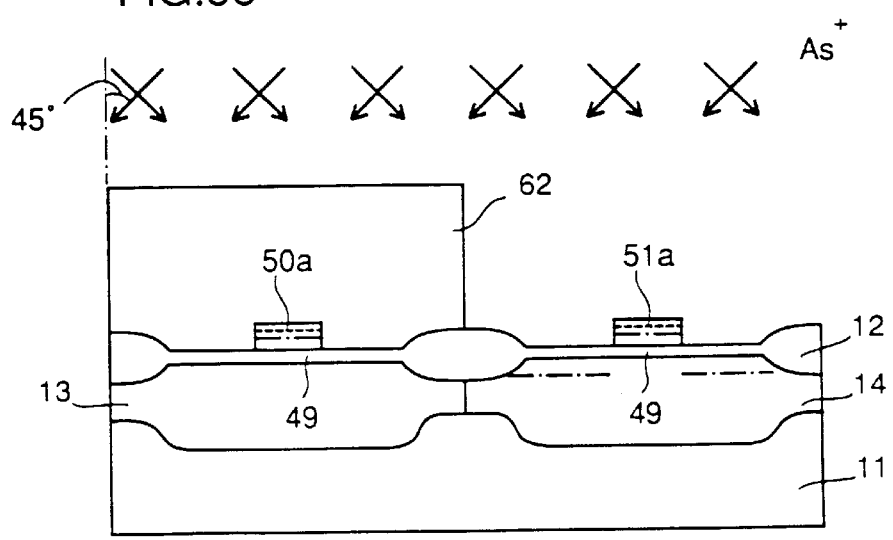

Then, the PMOS transistor forming region is covered with a resist film 62 as shown in FIG. 56, and the resist film 62 is employed as a mask to implant arsenic ions into N⁻-type source/drain regions on the P well 14, as shown in FIG. 56. In more concrete terms, the P-type silicon substrate 11 is rotated so that the arsenic ions are implanted into the same at an angle of incidence of 45° under conditions of 50 keV and $4\times10^{13}/cm^2$. Thereafter the resist film 62 is removed.

Then, an oxide film of about 800 Å in thickness is formed on the overall surface by CDV, and this oxide film is etched back to form side wall oxide films 20 and gate oxide films 47a and 48a, as shown in FIG. 57. Then, the PMOS transistor forming region is covered with a resist film 63, as shown in FIG. 58. The resist film 63 is employed as a mask to implant arsenic ions into N⁺-type source/drain forming regions on the P well 14 under conditions of 50 keV and $4\times10^{15}/cm^2$. Thereafter the resist film 63 is removed.

Then, the NMOS transistor forming region is covered with a resist film 64, as shown in FIG. 59. The resist film 64 is employed as a mask to implant nitrogen ions under conditions of 10 keV and $2\times10^{15}/cm^2$, and then boron ions are implanted under conditions of 10 keV and $4\times10^{15}/cm^2$. Thereafter the resist film 64 is removed. Heat treatment is carried out at 850° C. for about 20 minutes, thereby activating the impurities as implanted. Thus, the source/drain regions 21, the P⁺-type polysilicon film 50, the N⁻-type source/drain regions 52, the N⁺-type source/drain regions 53, the N⁺-type gate electrode 51 and the nitrogen-doped regions 30 are formed as shown in FIG. 50. During the heat treatment, nitrogen which is doped in the upper portions of the polysilicon films 50a and 51a is thermally diffused. At this time, nitrogen segregates in the gate oxide films 47a and 48a, thereby forming gate oxide films 47 and 48 having nitrogen concentration peaks therein. Then, titanium layers (not shown) of about 500 Å in thickness are formed by sputtering, and subjected to heat treatment at 700° C. for 30 seconds. Thus, the titanium silicide films 23 (see FIG. 50) are formed on the P⁺-type polysilicon films 50 and 51, the P⁺-type source/drain regions 21, and the N⁺-type source/ drain regions 53. Thereafter unreacted titanium layers are removed from the oxide films, thereby forming the dual gate CMOS transistor according to the sixth embodiment.

Figure 60:
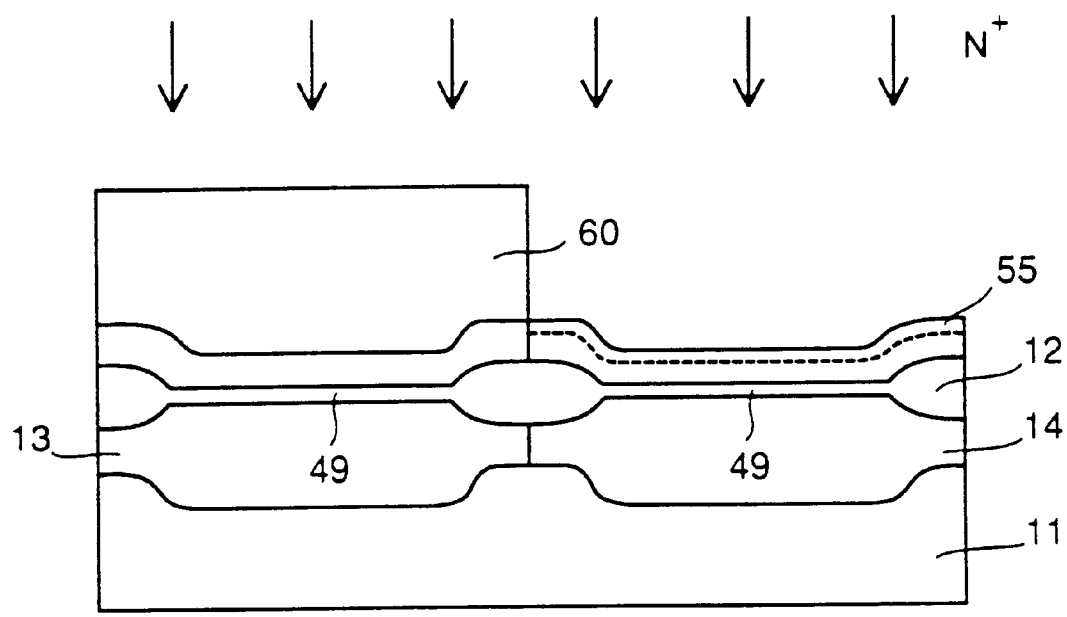
FIGS. 60 to 64 are sectional views for illustrating another exemplary fabrication process for the dual gate CMOS transistor according to the sixth embodiment shown in FIG. 50.

With reference to FIGS. 60 to 64, another exemplary fabrication process for the dual gate CMOS transistor according to the sixth embodiment shown in FIG. 50 is now described. First, elements up to a polysilicon film 55 are formed through a process which is similar to that shown in FIG. 51. Thereafter a PMOS transistor forming region is covered with a resist film 60, as shown in FIG. 60. This resist film 60 is employed as a mask to implant nitrogen ions into the polysilicon film 55 under conditions of 25 keV and $1\times10^{16}/cm^2$, so that a range center comes to an upper portion of the polysilicon film 55.

Figure 61:
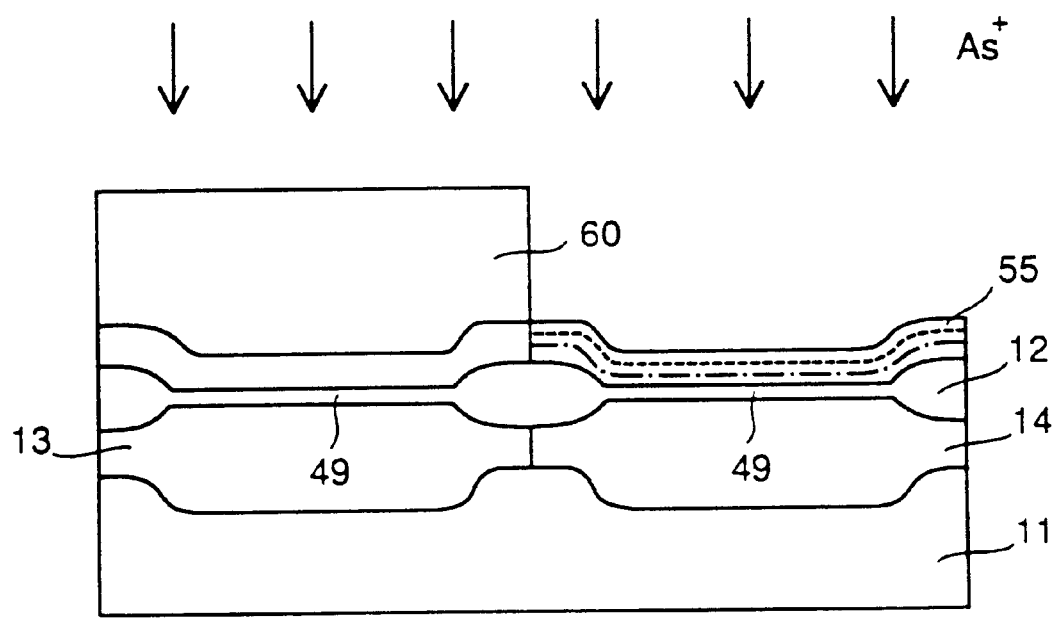

Then, the resist film 60 is employed as a mask to further implant arsenic ions into the polysilicon film 55 under conditions of 30 keV and $4\times10^{15}/cm^2$, as shown in FIG. 61. Thereafter the resist film 60 is removed.

Figure 62:
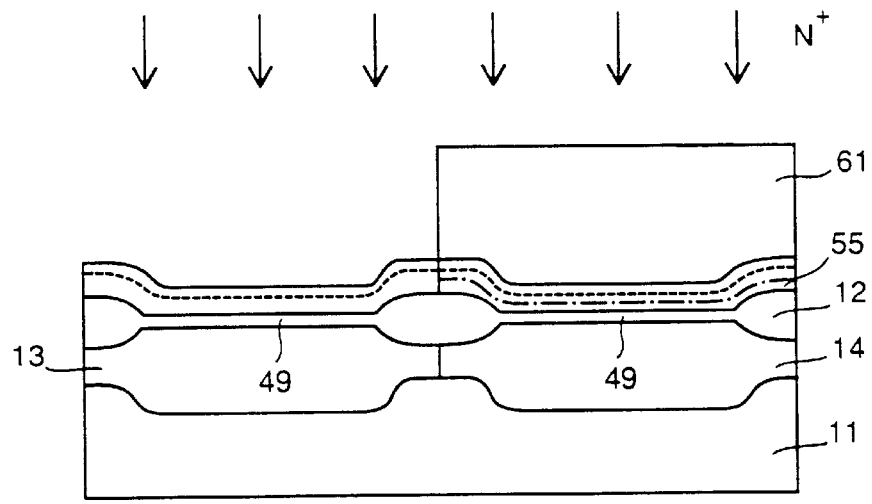
Figure 63:
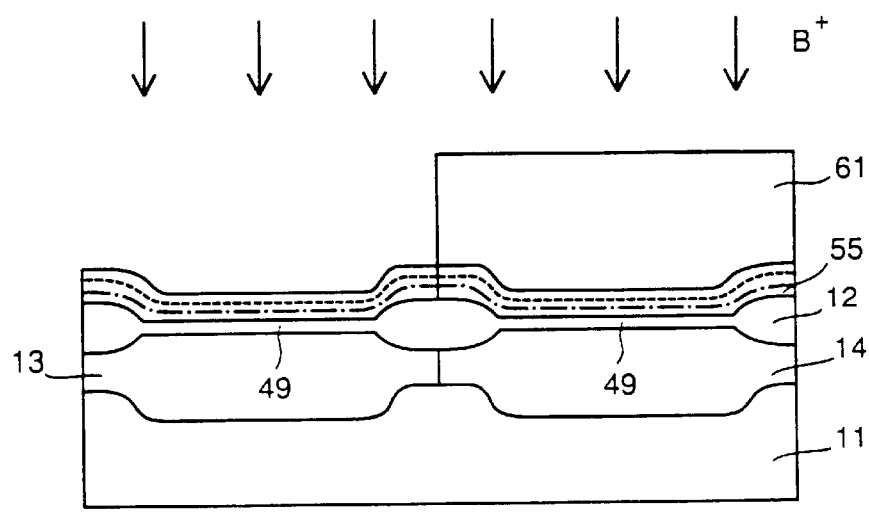
Figure 64:
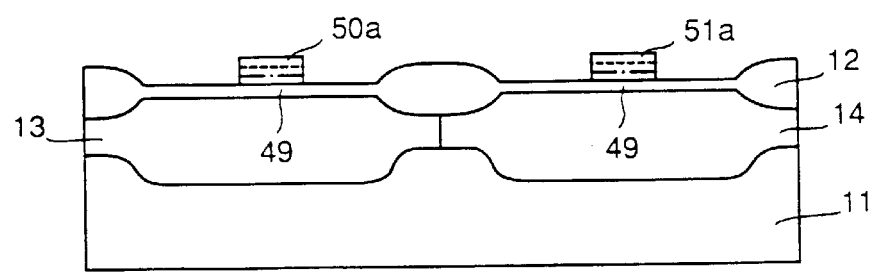

Then, an NMOS transistor forming region is covered with a resist film 61, as shown in FIG. 62. This resist film 61 is employed as a mask to implant nitrogen ions into the polysilicon film 55 under conditions of 15 keV and $4\times10^{15}/cm^2$, so that a range center comes to an upper portion of the polysilicon film 55. Then, the resist film 61 is employed as a mask to further implant boron ions into the polysilicon film 55 under conditions of 20 keV and $4\times10^{15}/cm^2$. Thereafter the resist film 61 is removed. The polysilicon film 55 is patterned by photolithography and anisotropic etching, thereby forming polysilicon films 50a and 51a shown in FIG. 64. Subsequent steps are similar to those shown in FIGS. 56 to 59.

While the step of doping the polysilicon film 50a with boron is carried out independently of that of doping the source/drain regions with boron in each of the aforementioned two fabrication processes, the polysilicon film 50a may alternatively be doped with boron in the step of doping the source/drain regions with boron. Further, the step of doping the polysilicon film 50a with arsenic may also be carried out with the step of doping the N⁻-type or N⁺-type source/drain regions with arsenic.

Effects of the sixth embodiment are now described. In the PMOS transistor region, the P⁺-type polysilicon film 50 and the P-type source/drain regions 21 are doped with nitrogen, whereby effects similar to those described above with reference to the first and second embodiments can be attained. In the NMOS transistor region, further, the N$^+$-type polysilicon film 51 is doped with nitrogen, whereby an effect similar to those described with reference to the fourth embodiment can be attained. When nitrogen ions are implanted into the polysilicon film 50a and the N$^+$-type polysilicon film 51 in separate steps, it is possible to optimize nitrogen profiles thereof in response to the properties of the ions which are implanted into these polysilicon films 50a and 51a. Thus, it is possible to further suppress punch-through of boron from the P$^+$-type polysilicon film 50 in the PMOS transistor region and generation of an interfacial level in the interface between the gate oxide film 47 and the silicon substrate 11 in the NMOS transistor region.

Figure 65:
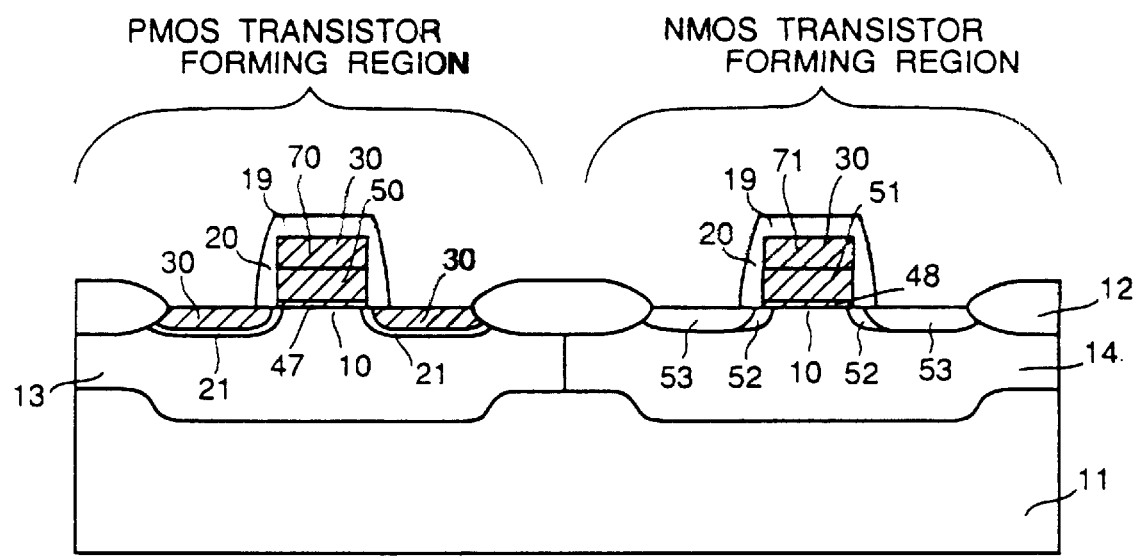
FIG. 65 is a sectional view showing a dual gate CMOS transistor according to a seventh embodiment of the present invention.

With reference to FIG. 65, a dual gate CMOS transistor according to a seventh embodiment of the present invention is now described. According to the seventh embodiment, a gate electrode of a PMOS transistor has a two-layer structure of a P$^+$-type polysilicon film 50 and a tungsten silicide film 70 which is formed thereon, while a gate electrode of an NMOS transistor also has a two-layer structure of an N$^+$-type polysilicon film 51 and a tungsten silicide film 71 which is formed thereon. Further, oxide films 19 are formed on the tungsten silicide films 70 and 71. Side wall oxide films 20 are formed on side surfaces of the gate electrodes.

Figure 66:
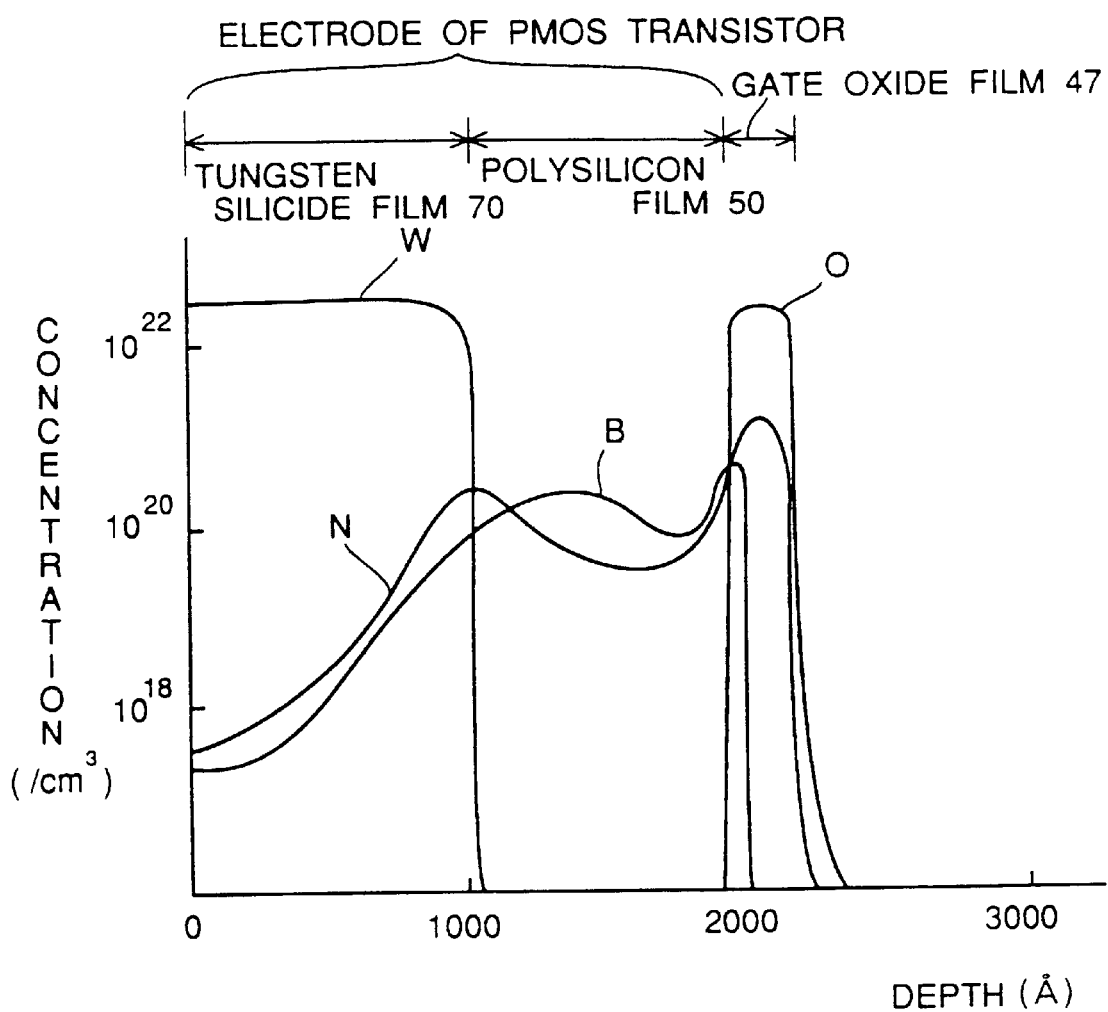
FIG. 66 illustrates an impurity profile along a depth direction of a gate electrode of a PMOS transistor provided in the seventh embodiment shown in FIG. 65.
Figure 67:
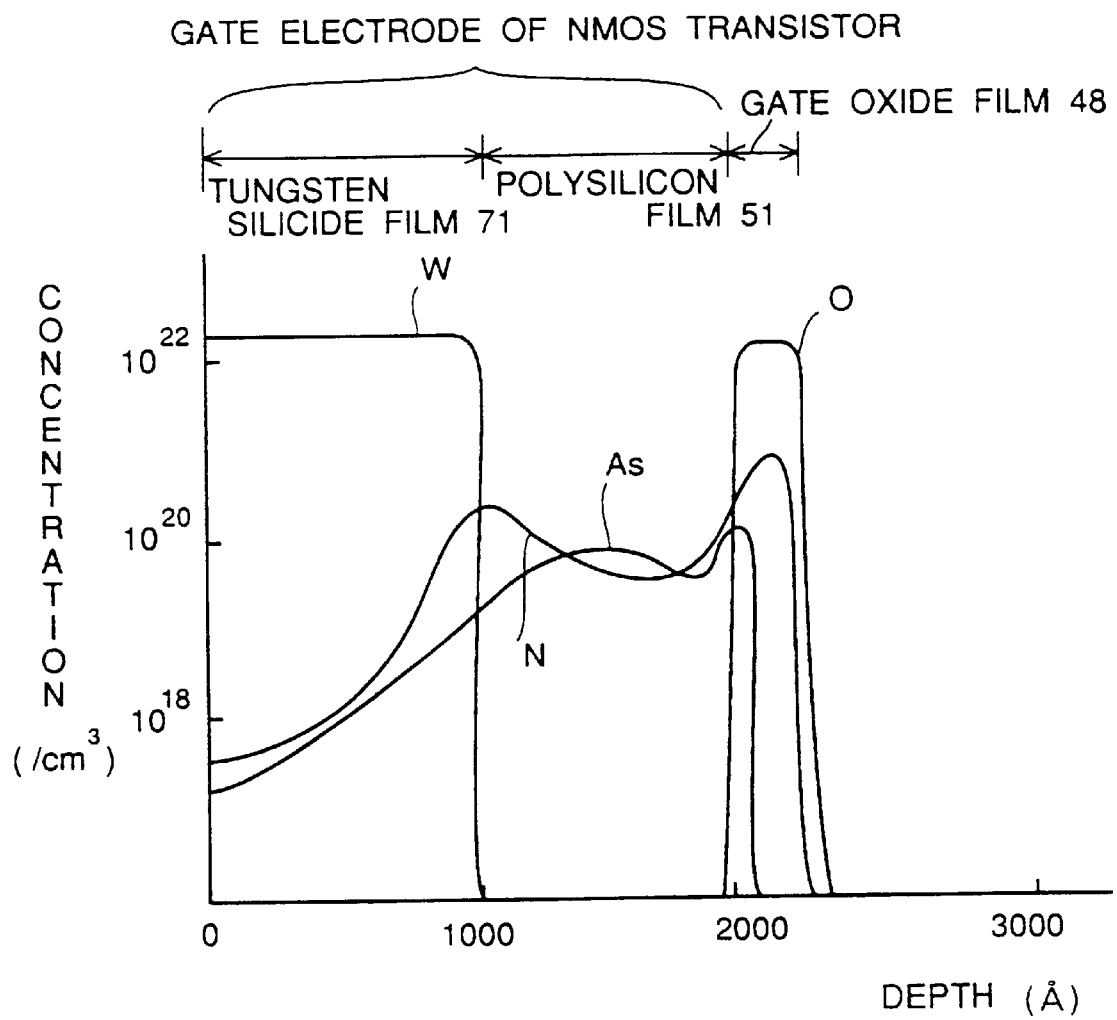
FIG. 67 illustrates an impurity profile in a depth direction of a gate electrode of an NMOS transistor provided in the seventh embodiment shown in FIG. 65.

According to the seventh embodiment, nitrogen-doped regions 30 are formed in the gate electrode and a gate oxide film 47 of the NMOS transistor, and P$^+$-type source/drain regions 21 of the PMOS transistor. Referring to FIG. 66, it is understood that a nitrogen concentration peak exists in the interface between the P$^+$-type polysilicon film 50 and the tungsten silicide film 70 and nitrogen is deposited in the gate oxide film 47, in the gate electrode of the PMOS transistor. Referring to FIG. 67, on the other hand, it is understood that a nitrogen concentration peak exists in the interface between the N$^+$-type polysilicon film 51 and the tungsten silicide film 71 and nitrogen is deposited in the gate oxide film 48, in the gate electrode of the NMOS transistor.

Figure 68:
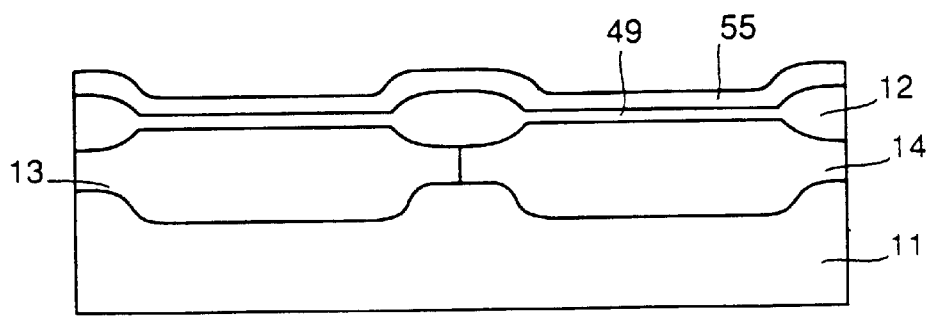
FIGS. 68 to 76 are sectional views for illustrating a fabrication process for the dual gate CMOS transistor according to the seventh embodiment shown in FIG. 65.

With reference to FIGS. 68 to 76, a fabrication process for the dual gate CMOS transistor according to the seventh embodiment shown in FIG. 65 is now described. First, an N well 13 and a P well 14 are formed on a P-type silicon substrate 11 as shown in FIG. 68, and element isolation oxide film 12 are formed on the P-type silicon substrate 11 through an ordinary element isolation step. Thereafter an oxide film 49 of about 100 Å in thickness is formed by thermal oxidation. A polysilicon film 55 of about 2000 Å in thickness is formed by CDV.

Figure 69:
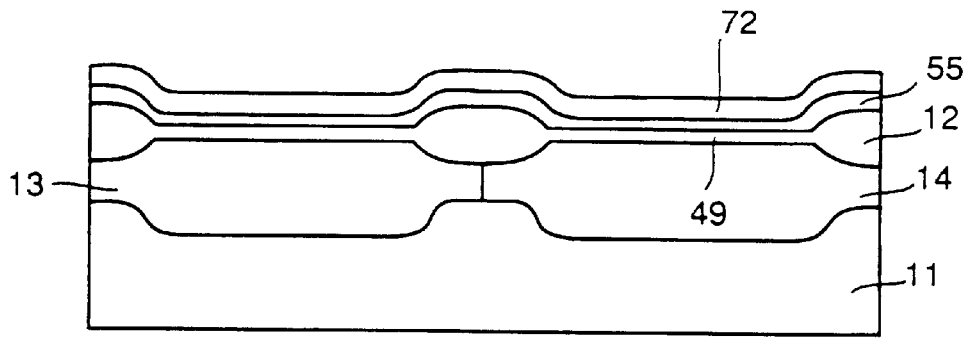

Then, a tungsten silicide film 72 of about 1000 Å in thickness is formed by sputtering, as shown in FIG. 69.

Figure 70:
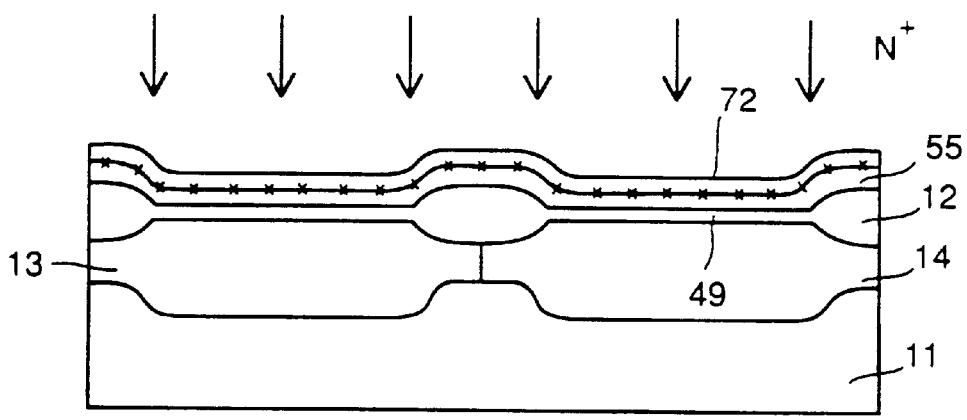
Figure 71:
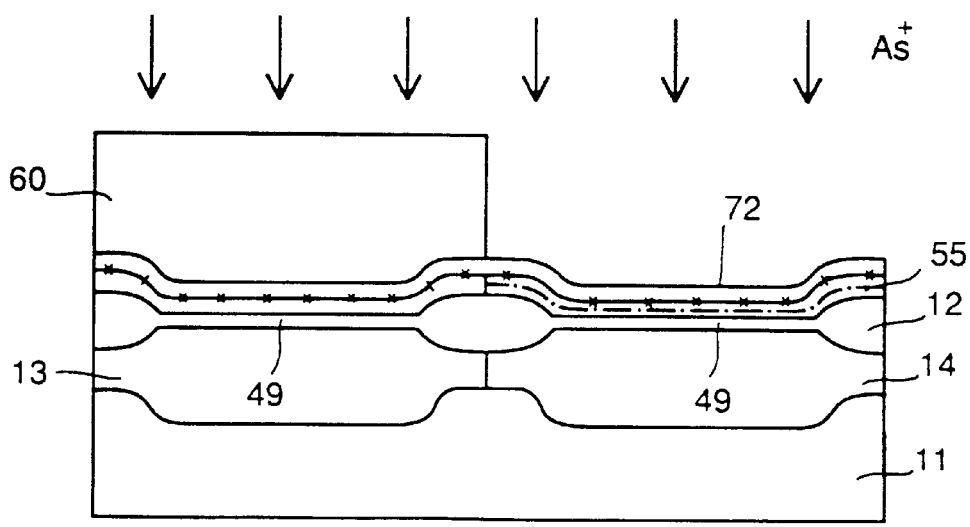

Then, nitrogenions are implanted under conditions of 40 keV and 1×10$^{16}$/cm$^2$, so that a range center comes to a position which is close to the interface between the polysilicon film 55 and the tungsten silicide film 72, as shown in FIG. 70. Then, a PMOS transistor forming region is covered with a resist film 60, as shown in FIG. 71. The resist film 60 is employed as a mask to implant arsenic ions into a portion of the polysilicon film 55 in an NMOS transistor forming region under conditions of 120 keV and 4×10$^{15}$/cm$^2$. Thereafter the resist film 60 is removed.

Figure 72:
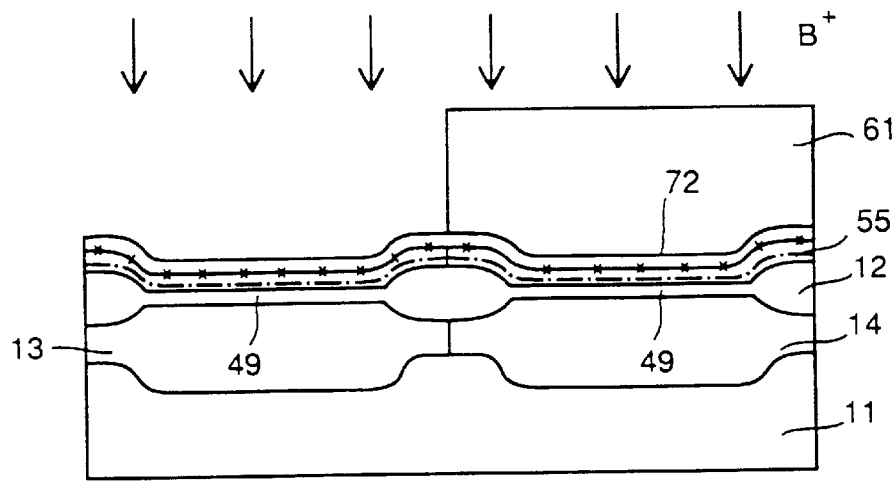
Figure 73:
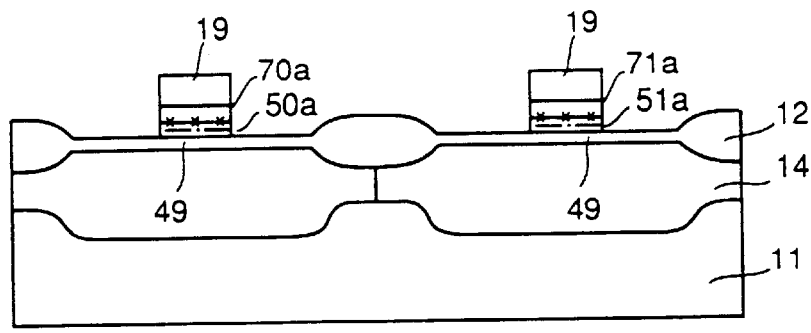

Then, the NMOS transistor forming region is covered with a resist film 61, as shown in FIG. 72. The resist film 61 is employed as a mask to implant boron ions into a portion of the polysilicon film 55 in the PMOS transistor forming region under conditions of 30 keV and 4×10$^{15}$/cm$^2$. Thereafter the resist film 61 is removed. An oxide film (not shown) of about 2000 Å in thickness is formed by CDV, and the oxide film, the tungsten silicide film 72 and the polysilicon film 55 are patterned into the form of gate electrodes. Thus, oxide films 19, tungsten silicide films 70a and 71a and polysilicon films 50a and 51a are formed as shown in FIG. 73.

Figure 74:
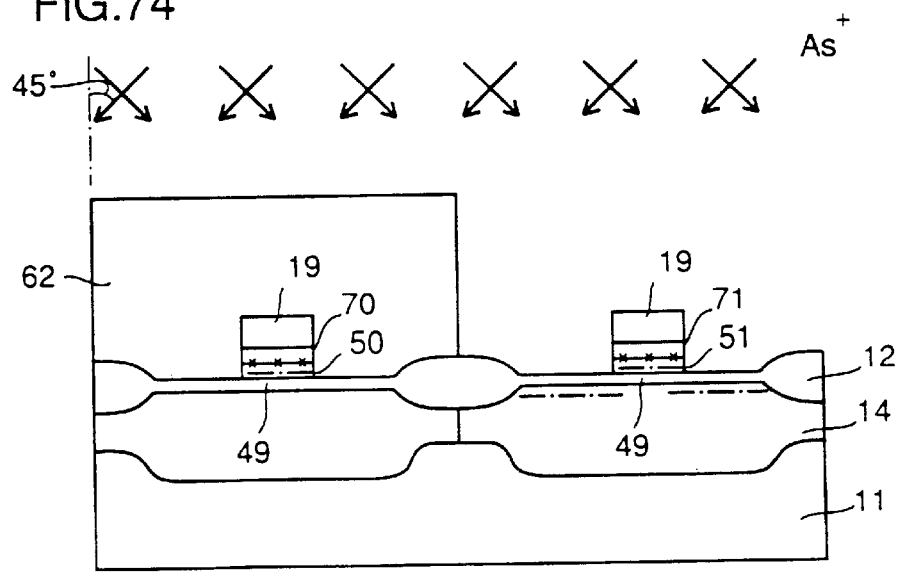

Then, the PMOS transistor forming region is covered with a resist film 62, as shown in FIG. 74. The resist film 62 is employed as a mask to implant arsenic ions into N$^-$-type source/drain regions. This ion implantation is carried out at an angle of incidence of 45° under conditions of 50 keV and 4×10$^{13}$/cm$^2$, while rotating the P-type silicon substrate 11. Thereafter the resist film 62 is removed.

Figure 75:
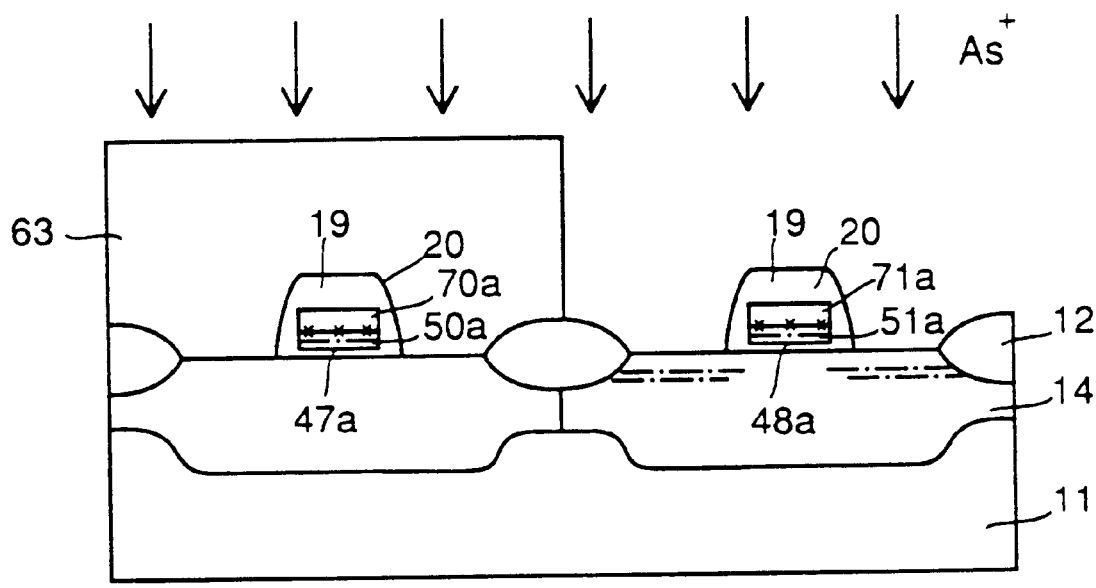

Then, an oxide film of about 800 Å in thickness is formed by CDV, and this oxide film is etched back to form side wall oxide films 20 and gate oxide films 47a and 48a as shown in FIG. 75. The PMOS transistor forming region is covered with a resist film 63, and this resist film 63 is employed as a mask to implant arsenic ions into N$^+$-type source/drain regions under conditions of 50 keV and 4×10$^{13}$/cm$^2$. Thereafter the resist film 63 is removed.

Figure 76:
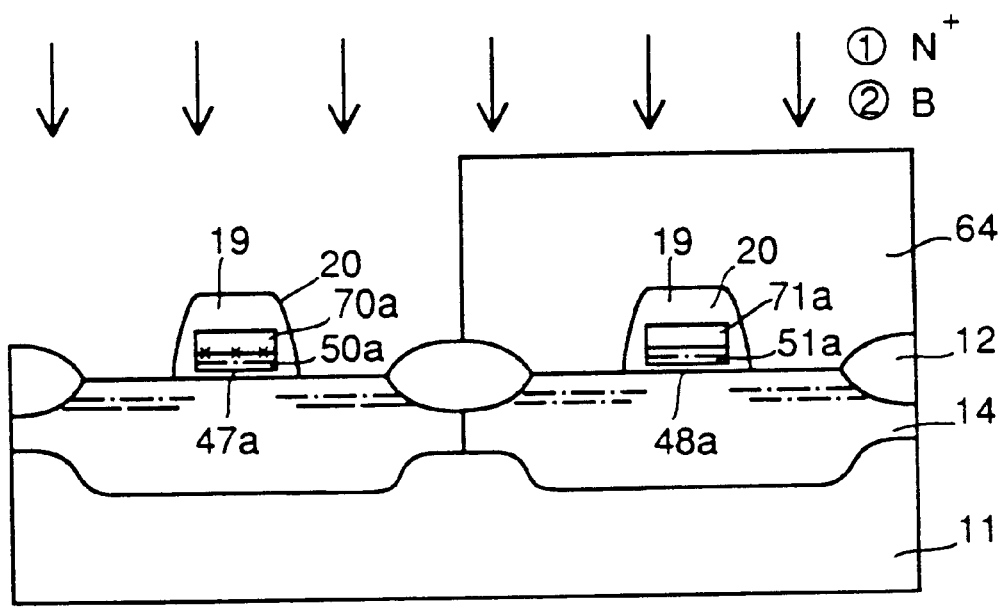

Then, the NMOS transistor forming region is covered with a resist film 64, as shown in FIG. 76. The resist film 64 is employed as a mask to implant nitrogen into source/drain regions of the PMOS transistor under conditions of 10 keV and 2×10$^{15}$/cm$^2$, and thereafter boron ions are implanted under conditions of 10 keV and 4×10$^{13}$/cm$^2$. Thereafter the resist film 64 is removed. Heat treatment is carried out at 850° C. for about 20 minutes, thereby activating the impurities as implanted. Thus, the tungsten silicide films 70 and 71, the P$^+$-type polysilicon film 50, the N$^+$-type polysilicon film 51, the source/drain regions 21, the N-type source/drain regions 52, the N$^+$-type source/drain regions 53 and the nitrogen-doped regions 30 are formed as shown in FIG. 65. During the heat treatment, nitrogen which is doped into the interface between the polysilicon film 50a and the tungsten silicide film 70a and that between the polysilicon film 51a and the tungsten silicide film 71a is thermally diffused. At this time, nitrogen segregates in the gate oxide films 47a and 48a, thereby forming gate oxide films 47 and 48 having nitrogen concentration peaks as shown in FIGS. 66 and 67.

As to an effect of the seventh embodiment, portions close to the interfaces between the P$^+$-type polysilicon film 50 and the tungsten silicide film 70 and between the N$^+$-type polysilicon film 51 and the tungsten silicide film 71 are doped with nitrogen, whereby boron and arsenic are inhibited from diffusion in the tungsten silicide films 70 and 71 respectively. Namely, nitrogen having a larger diffusion coefficient as compared with boron and arsenic occupies diffusion paths in advance. Consequently, it is possible to inhibit boron and arsenic from diffusion into the tungsten silicide films 70 and 71 respectively, thereby effectively suppressing fluctuation of a threshold voltage caused by change in working function resulting from mutual diffusion of boron and arsenic. While the nitrogen-doped regions 30 are formed in the source/drain regions 21 according to this embodiment, these nitrogen-doped regions 30 may not be formed when the source/drain regions 21 are formed by implanting boron fluoride ions under conditions of 20 keV an 4×10$^{15}$/cm$^2$, for example.

Figure 77:
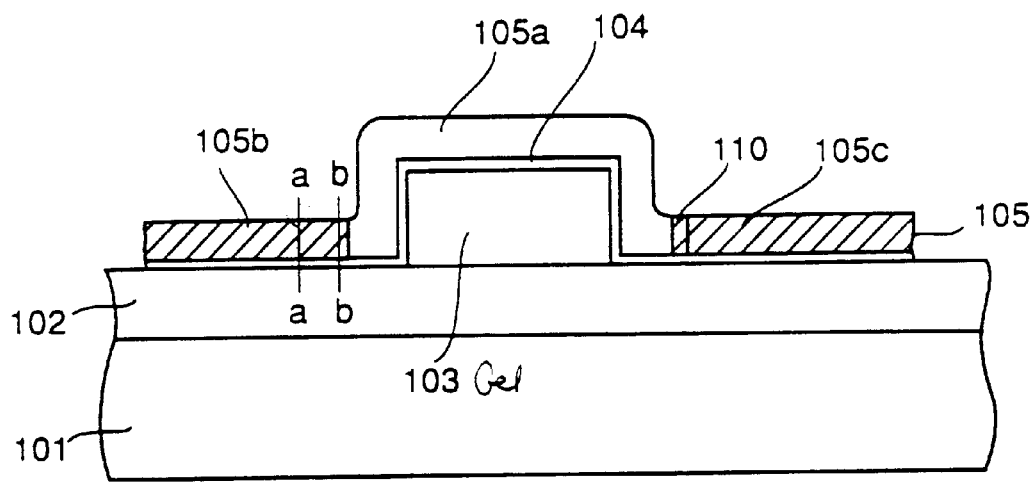
FIG. 77 is a sectional view showing a PMOS-TFT according to an eighth embodiment of the present invention.
Figure 78:
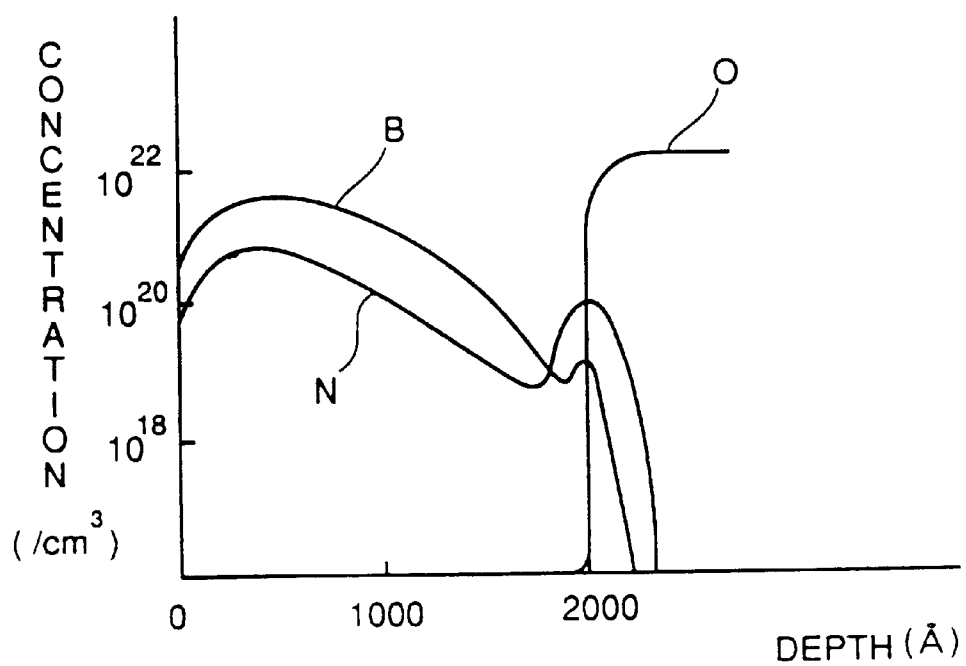
FIG. 78 illustrates an impurity profile along a depth direction of the line a—a in the PMOS-TFT according to the eighth embodiment shown in FIG. 77.
Figure 79:
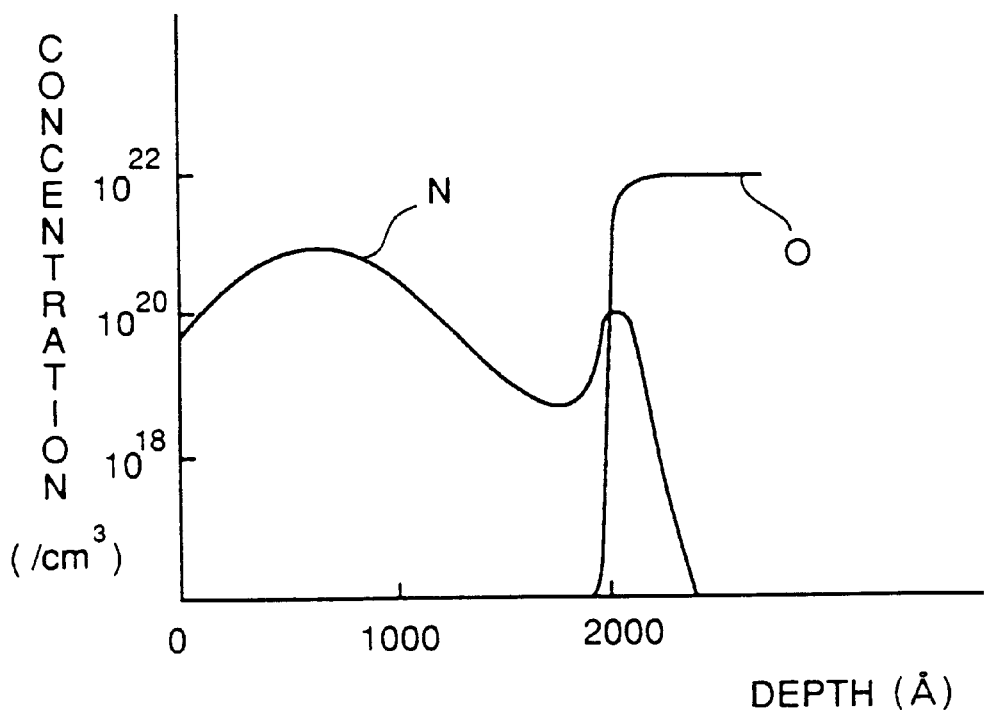
FIG. 79 illustrates an impurity profile along a depth direction of the line b—b in the PMOS-TFT according to the eighth embodiment shown in FIG. 77.

With reference to FIG. 77, a PMOS-TFT according to an eighth embodiment of the present invention is now described. In the PMOS-TFT according to the eighth embodiment, an insulating film 102 is formed on a semiconductor substrate 101. A gate electrode 103 is formed on a prescribed region of the insulating film 102. A gate insulating film 104 is formed on the gate electrode 103 and the insulating film 102. A polycrystalline silicon layer 105 is formed on the gate insulating film 104. The polysilicon layer 105 is provided with a source region 105b and a drain region 105c at a prescribed space, to hold a channel region 105a therebetween. Referring to FIG. 77, slant portions show nitrogen-doped regions 110. FIG. 78 illustrates an impurity profile of a depth direction in a section taken along the line a—a in FIG. 77. FIG. 79 illustrates an impurity profile of a depth direction in a section taken along the line b—b in FIG. 77. Referring to FIGS. 78 and 79, it is understood that the nitrogen-doped regions 110 reach portions of the channel region 105a located outside end surfaces of the source and drain regions 105b and 105c.

Figure 80:
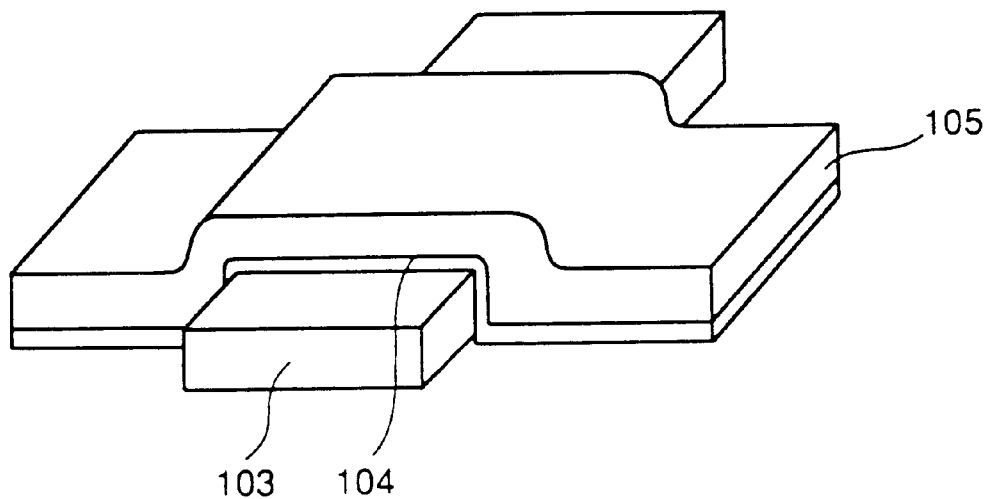
FIG. 80 is a perspective view for illustrating a fabrication process for the PMOS-TFT according to the eighth embodiment shown in FIG. 77.
Figure 81:
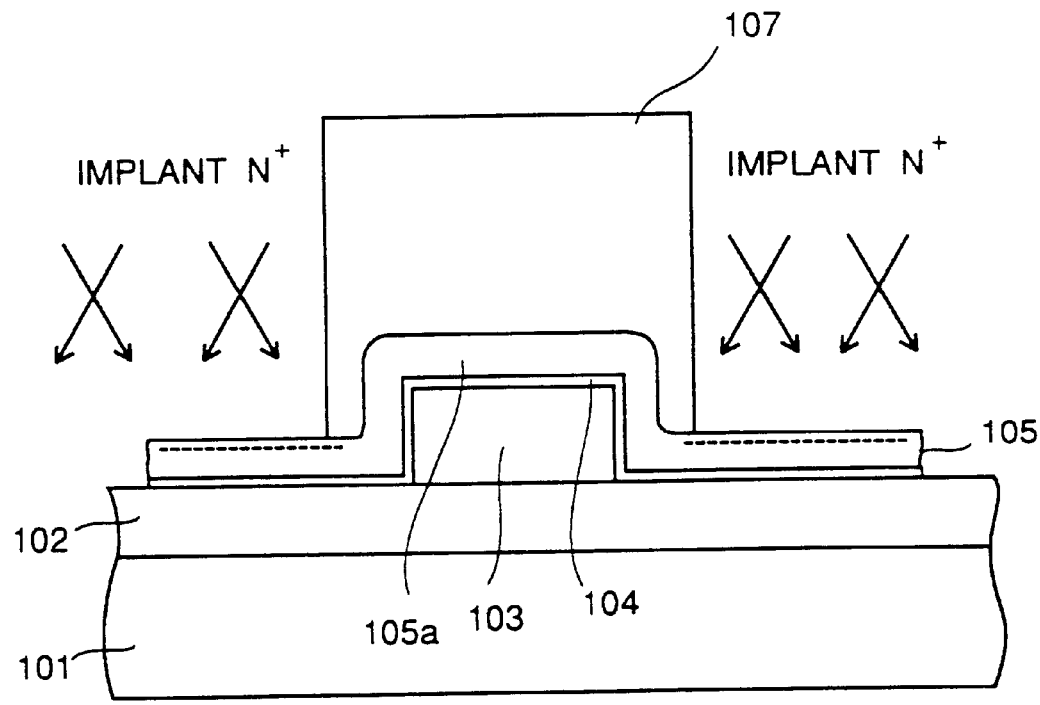
FIGS. 81 and 82 are sectional views for illustrating the fabrication process for the PMOS-TFT according to the eighth embodiment shown in FIG. 77.
Figure 82:
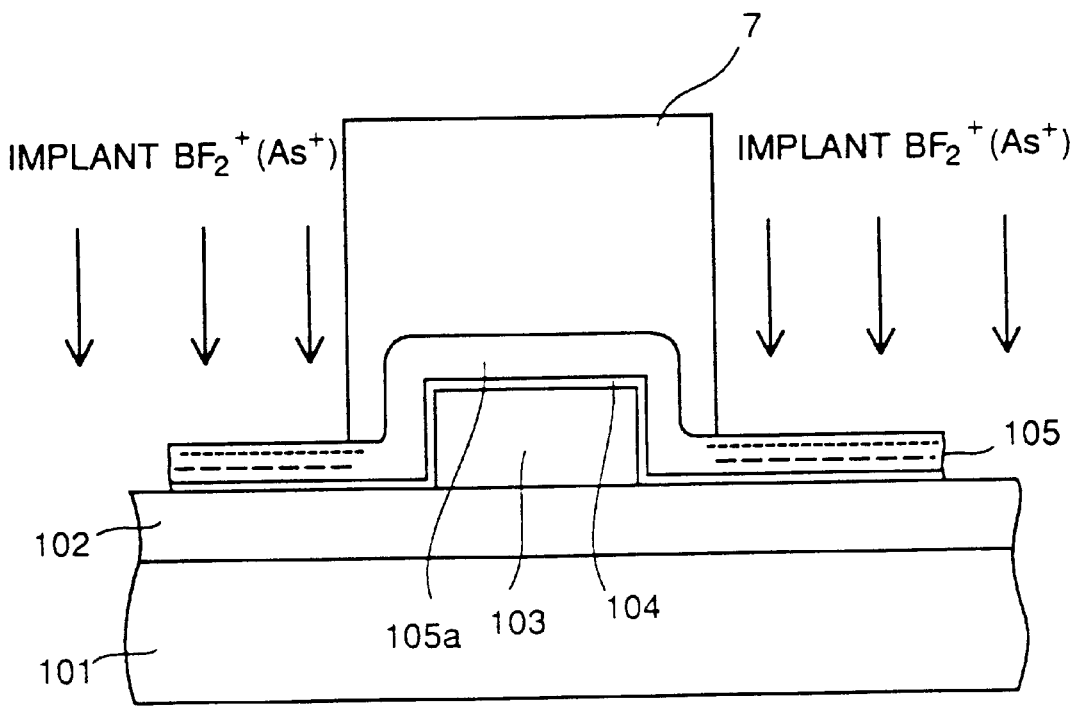

With reference to FIGS. 80 to 82, a fabrication process for the PMOS-TFT according to the eighth embodiment shown in FIG. 77 is now described. An insulating film 102 is formed on a surface of a semiconductor substrate 101, and then a non-doped polysilicon layer (not shown) is formed on the insulating film 102 in a thickness of about 2000 Å by CDV. Boron is ion-implanted into the non-doped polysilicon layer for forming a polysilicon layer which is doped in a P type, and the doped polysilicon layer is patterned in the form of a gate electrode by photolithography and anisotropic etching. Thus, a gate electrode 103 shown in FIG. 80 is formed. Then, a gate insulating film 104 of about 100 Å in thickness is formed by thermal oxidation, and a non-doped polysilicon layer (not shown) is formed on the gate insulating film 104 in a thickness of about 2000 Å by CDV. In order to control a threshold voltage, arsenic is ion-implanted into the non-doped polysilicon layer under conditions of 50 keV and $1 \times 10^{12}$ to $1 \times 10^{13}/cm^2$, thereby forming a polysilicon layer which is doped in an N type. Then, the polysilicon layer is patterned in a desired shape by photolithography and anisotropic etching. Thus, a polycrystalline silicon layer 105 is formed as shown in FIG. 80.

Then, a resist film 107 is formed on the channel region 105a by photolithography, as shown in FIG. 81. The resist film 107 is employed as a mask, to ion-implant nitrogen into the polysilicon layer 105. The ion implantation of nitrogen is carried out at an angle of incidence of 15 to 60° under conditions of 10 keV and $2 \times 10^{15}/cm^2$, while rotating the semiconductor substrate 101. Thereafter boron fluoride ions are implanted into the polysilicon layer 105 under conditions of 10 keV and $4 \times 10^{15}/cm^2$ as shown in FIG. 82. Heat treatment is carried out at 850° C. for about 20 minutes, thereby activating the impurities as implanted. Thus, nitrogen-doped regions 110 are formed simultaneously with formation of the P-type source and drain regions 105b and 105c shown in FIG. 77.

Relation between nitrogen implantation conditions and implantation conditions for the source/drain regions is now described. Implantation energy for nitrogen is so set that a range $R_P$ of nitrogen is smaller than that of boron fluoride. If the nitrogen-doped regions 110 as formed are deeper than junction planes of the source/drain regions, crystal defects formed in nitrogen implantation are contained in depletion layers which are formed in the junction planes of the source/drain regions, leading to generation of a junction leakage current. Therefore, the implantation energy for nitrogen must be set in the aforementioned manner.

While boron fluoride is ion-implanted into the gate electrode 103 in the above description, boron may alternatively be ion-implanted. Further, an N-type gate electrode may be employed in place of a P-type gate electrode. While boron fluoride ions are implanted also into the P-type source/drain regions, boron ions may alternatively be implanted into the same. While the above embodiment has been described with reference to a P-channel MOS-TFT, the present invention is also applicable to a CMOS-TFT including a P-channel MOS-TFT as a part thereof.

As to an effect of the eighth embodiment, the source and drain regions 105b and 105c are doped with nitrogen, whereby diffusion of boron is suppressed. Namely, nitrogen is in the same hole diffusion mechanism as boron, and has a larger diffusion coefficient than boron. Thus, nitrogen occupies holes, which are diffusion paths, due to mutual diffusion of nitrogen and boron, whereby it is possible to suppress diffusion of boron. Therefore, it is possible to suppress transverse diffusion of boron into the channel region 105a, thereby increasing an effective gate length. Thus, it is possible to prevent a punch-through phenomenon caused by a short channel effect. Further, it is possible to further suppress transverse diffusion of boron by carrying out oblique rotation implantation of nitrogen.

Figure 83:
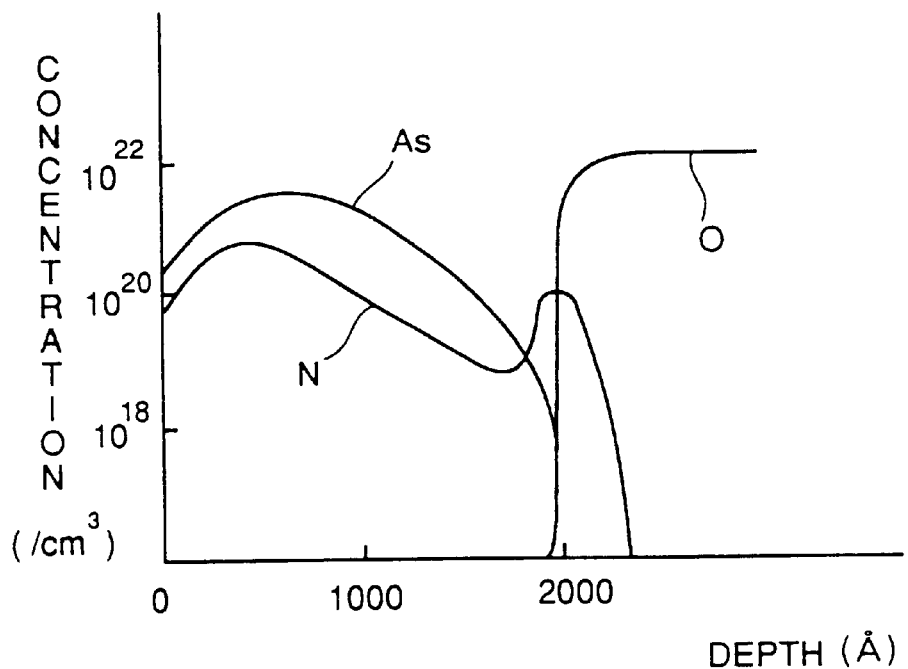
FIG. 83 illustrates an impurity profile along a depth direction of the line a—a (see FIG. 77) in an NMOS-TFT according to a ninth embodiment of the present invention.
Figure 84:
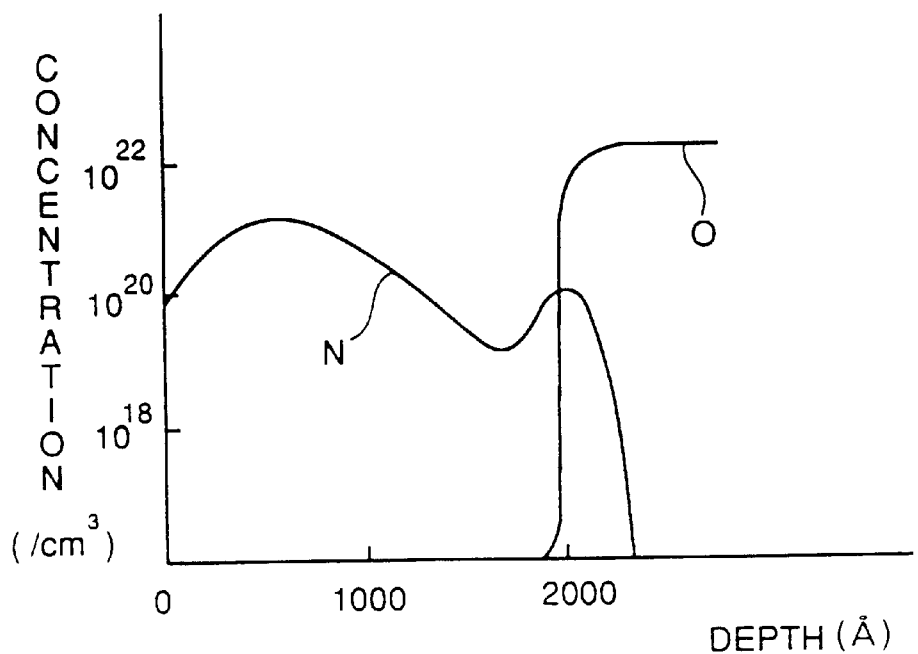
FIG. 84 illustrates an impurity profile along a depth direction of the line b—b (see FIG. 77) in the NMOS-TFT according to the ninth embodiment.

A ninth embodiment of the present invention is now described. While the present invention is applied to a PMOS-TFT in the eighth embodiment, the present invention is applied to an N-channel MOS-TFT (hereinafter referred to as "NMOS-TFT") in the ninth embodiment. In order to form such an NMOS-TFT, the conductivity types of the implanted impurities may be reversed to those employed for forming the PMOS-TFT in FIG. 77. Namely, the gate electrode 103, the source region 105b and the drain region 105c are doped in N types, while the channel region 105a is doped in a P type. FIG. 83 shows an impurity profile of a depth direction in a section taken along the line a—a, in a case of forming the TFT shown in FIG. 77 as an N-channel type one. FIG. 84 shows an impurity profile of a depth direction in a section taken along the line b—b. Referring to FIGS. 83 and 84, it is understood that the nitrogen-doped regions 110 reach portions of the channel region 105a located outside end surfaces of the source and drain regions 105b and 105c.

A fabrication process for the NMOS-TFT according to the ninth embodiment is basically identical to that for the PMOS-TFT according to the eighth embodiment. Therefore, this process is described with reference to FIGS. 80 to 82. However, this embodiment is different in impurity implantation condition from the eighth embodiment, and hence the impurity shown in parentheses in FIG. 82 is employed in the ninth embodiment. First, an insulating film 102 is formed on a semiconductor substrate 101, and a non-doped polysilicon layer is formed on the insulating film 102 in a thickness of about 2000 Å by CDV. Thereafter arsenic is ion-implanted into the non-doped polysilicon layer, thereby forming a polysilicon layer which is doped in an N type. The doped polysilicon layer is patterned in the form of a gate electrode by photolithography and anisotropic etching. Thus, a gate electrode 103 is formed. Then, a gate insulating film 104 of about 100 Å in thickness is formed by thermal oxidation, and a non-doped polysilicon layer is formed on the gate insulating film 104 in a thickness of about 2000 Å by CDV. In order to control a threshold voltage, boron fluoride is ion-implanted into the non-doped polysilicon layer under conditions of 20 keV and $1 \times 10^{12}$ to $1 \times 10^{13}/cm^2$. Thus, a polysilicon layer which is doped in a P type is formed. Then the polysilicon layer is patterned by photolithography and anisotropic etching, to leave regions for defining a channel region, a source region and a drain region. Thus, a polysilicon layer 105 having a prescribed shape is formed as shown in FIG. 80.

Then, a resist film 107 is formed on the channel region 105a by photolithography, as shown in FIG. 81. The resist film 107 is employed as a mask to ion-implant nitrogen into the polysilicon layer 105. This ion implantation is carried out at an angle of incidence of 15 to 60° under conditions of 10 keV and $2\times10^{15}/cm^2$, while rotating the semiconductor substrate 101. Then, arsenic is ion-implanted into the polysilicon layer 105 under conditions of 30 keV and $4\times10^{15}/cm^2$, as shown in FIG. 82. Heat treatment is carried out at 850° C. for about 20 minutes, thereby activating the impurities as implanted. Thus, N-type source and drain regions 105b and 105c as well as nitrogen-doped regions 110 are formed. Also in the ninth embodiment, relation between nitrogen implantation conditions and implantation conditions for the source/drain regions is similar to that in the eighth embodiment. Namely, implantation energy for nitrogen is so set that a range $R_P$ of nitrogen is smaller than that of arsenic.

While arsenic implantation is employed for the gate electrode in the above description, phosphorus may be employed in place of arsenic with no problem. Further, a P-type gate electrode may be employed in place of the N-type gate electrode. While arsenic is implanted also in the N-type source/drain regions, phosphorus may be employed in place of arsenic. While the ninth embodiment has been described with reference to an N-channel MOS-TFT, this embodiment is also applicable to a CMOS-TFT including an NMOS-TFT.

As to an effect of the ninth embodiment, the N-type source/drain regions are doped with nitrogen similarly to the eighth embodiment, whereby it is possible to suppress diffusion of arsenic or phosphorus. Namely, the description made on the relation between boron and nitrogen with reference to the eighth embodiment is also applicable to that between arsenic and boron, or that between phosphorus and nitrogen. Therefore, it is possible to suppress diffusion of arsenic by mutually diffusing nitrogen and arsenic. Thus, it is possible to suppress transverse diffusion of arsenic or phosphorus in the channel region by an action of nitrogen, thereby increasing an effective gate length. Consequently, it is possible to prevent a punch-through phenomenon caused by a short channel effect. Further, it is possible to further suppress transverse diffusion of phosphorus or arsenic by implanting nitrogen in an oblique rotation manner.

Figure 85:
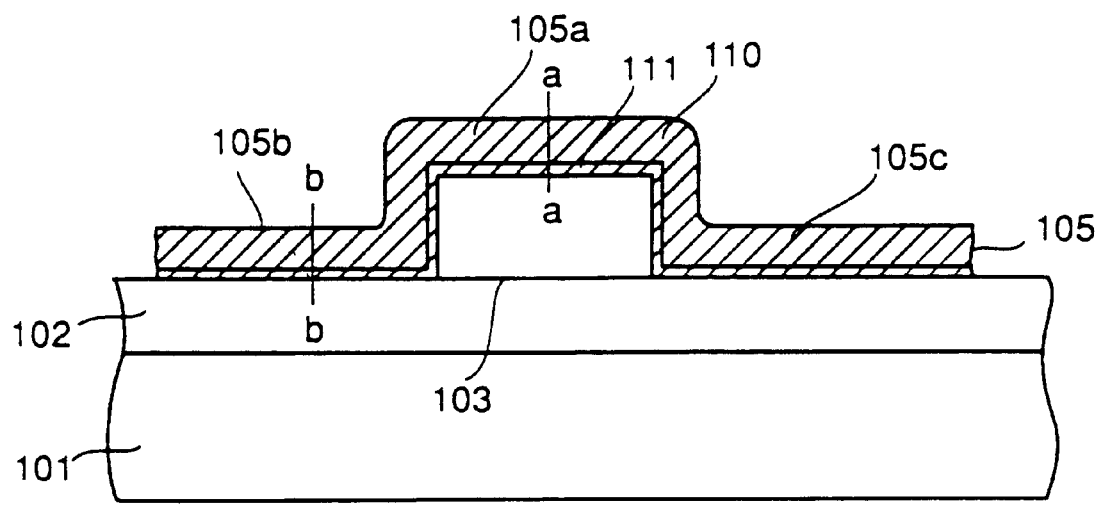
FIG. 85 is a sectional view showing a PMOS-TFT according to a tenth embodiment of the present invention.
Figure 86:
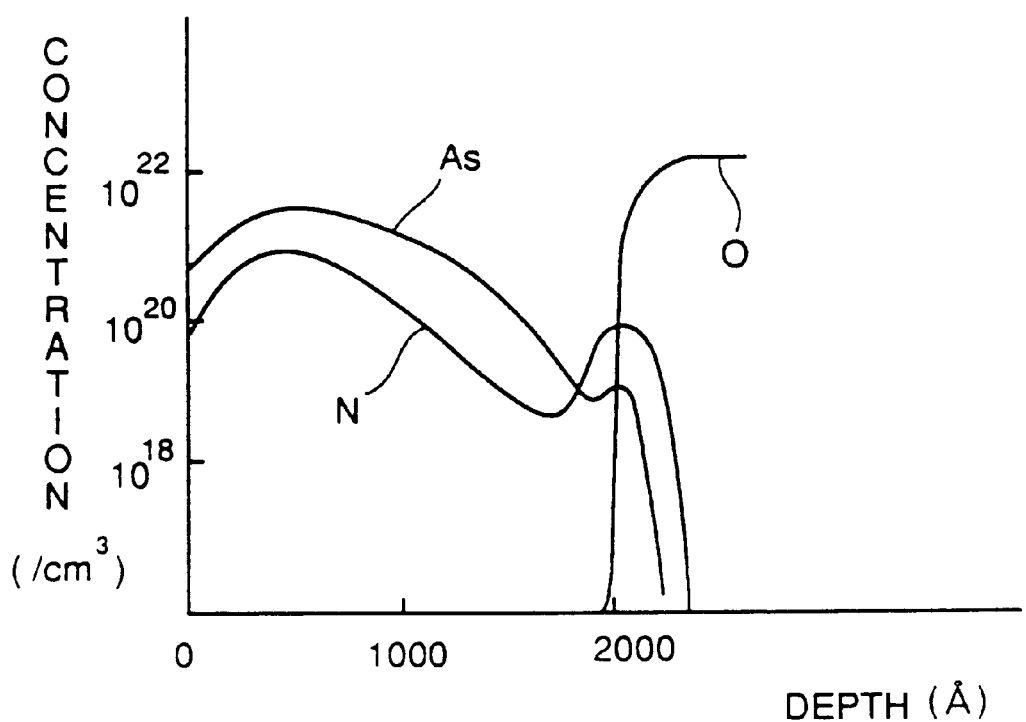
FIG. 86 illustrates an impurity profile along a depth direction of the line a—a in the PMOS-TFT shown in FIG. 85.

With reference to FIG. 85, a PMOS-TFT according to a tenth embodiment of the present invention is now described. According to the tenth embodiment, nitrogen-doped regions 110 are formed not only in source and drain regions 105b and 105c but a polysilicon layer 105 and a gate insulating film 111. FIG. 86 shows an impurity profile of a depth direction in a section taken along the line a—a in FIG. 85. An impurity profile of a depth direction in a section taken along the line b—b in FIG. 85 is identical to that shown in FIG. 78. Referring to FIG. 86, it is understood that nitrogen is deposited in the gate insulating film 111.

Figure 87:
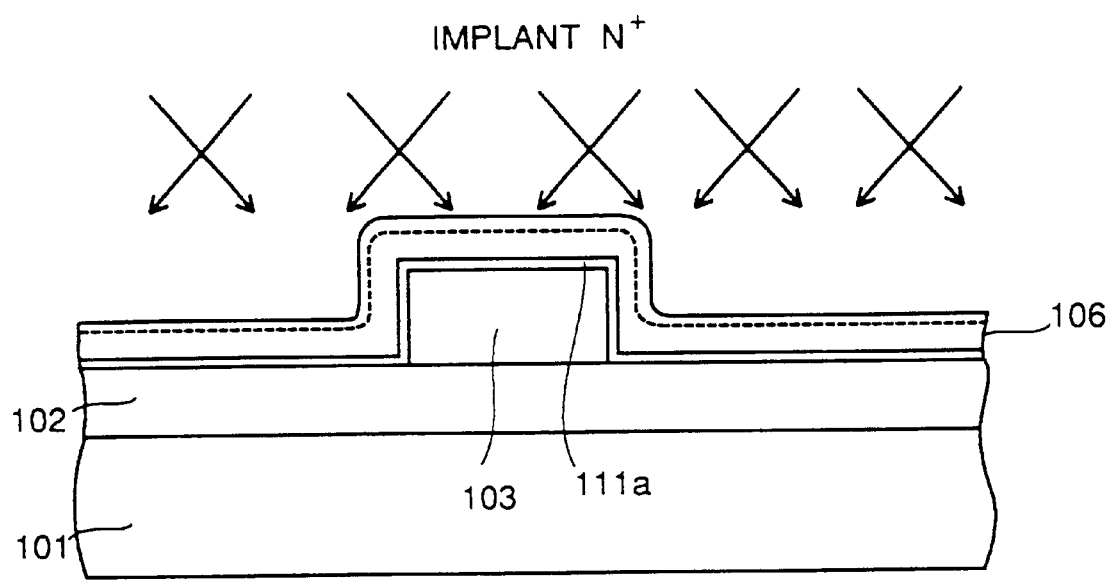
FIGS. 87 to 89 are sectional and perspective views for illustrating a fabrication process for the PMOS-TFT according to the tenth embodiment shown in FIG. 85.
Figure 88:
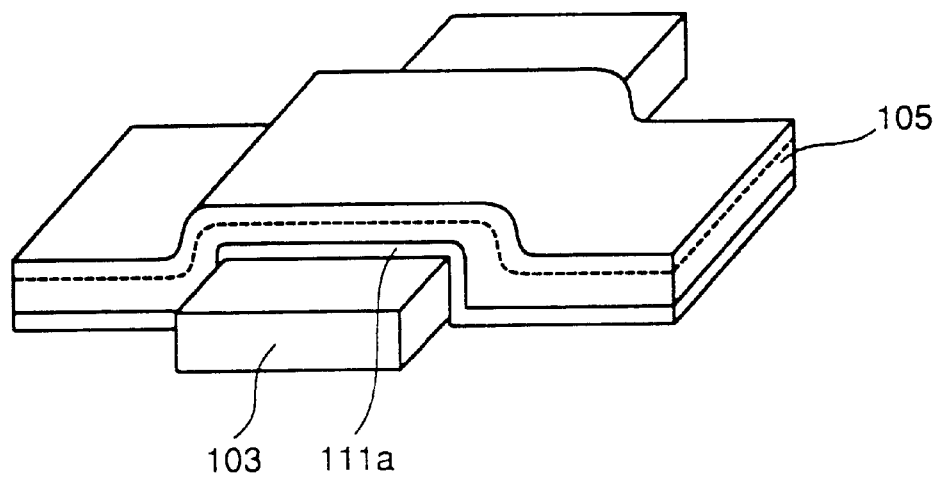
Figure 89:
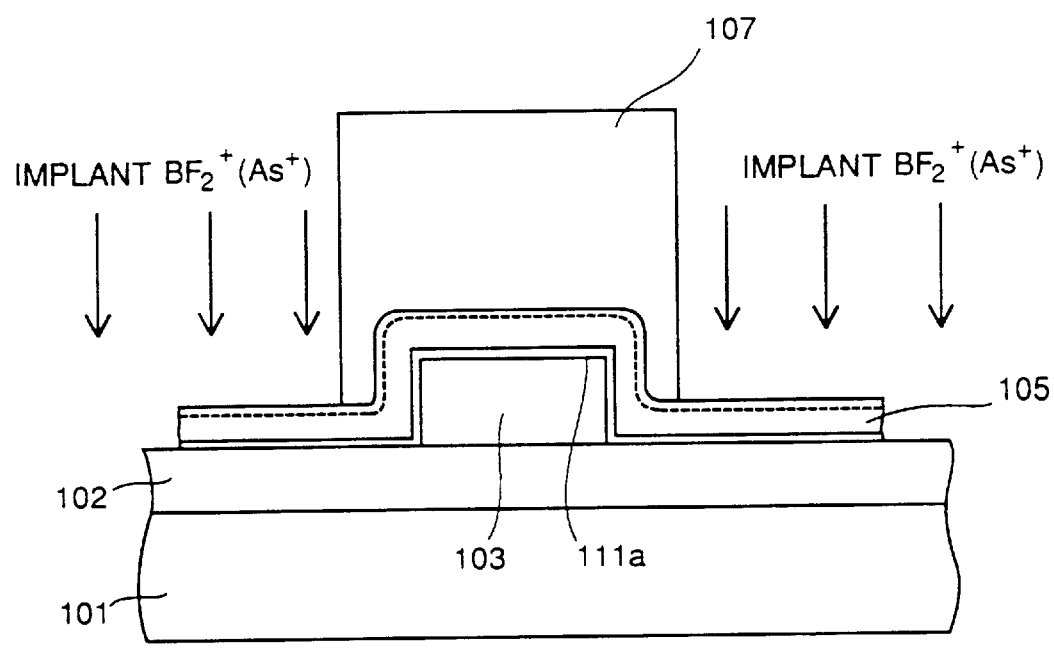

With reference to FIGS. 87 to 89, a fabrication process for the PMOS-TFT according to the tenth embodiment is now described. First, elements up to a gate electrode 103 are formed as shown in FIG. 87, through a process similar to the fabrication process described with reference to the eighth embodiment. Then, a gate insulating film 111a of about 100 Å in thickness is formed by thermal oxidation, and a non-doped polysilicon layer 106 is formed in a thickness of about 2000 Å by CDV, to cover the gate insulating film 111a. Then, nitrogen is ion-implanted into the non-doped polysilicon layer 106 at an angle of incidence of 15 to 60° under conditions of 10 keV and $2\times10^{15}/cm^2$, while rotating the semiconductor substrate 101. In order to control a threshold voltage, arsenic is ion-implanted into the polysilicon layer 106 under conditions of 50 keV and $1\times10^{12}$ to $1\times10^{13}/cm^2$ (this step is now shown). The polysilicon layer 106 is patterned by photolithography and anisotropic etching, thereby forming a polysilicon layer 105 having a desired shape as shown in FIG. 88.

Then, a resist film 107 is formed on a channel region by photolithography, as shown in FIG. 89. This resist film 107 is employed as a mask to ion-implant boron fluoride under conditions of 30 keV and $4\times10^{15}/cm^2$. Thus, P-type source and drain regions 105b and 105c and nitrogen-doped regions 110 are formed as shown in FIG. 85. In this heat treatment, nitrogen implanted into the polysilicon layer 105 is thermally diffused while nitrogen segregates in the gate insulating film 111a. Thus, a gate insulating film 111 having the nitrogen-doped region 110 is formed.

Relation between the nitrogen implantation conditions and implantation conditions for the source/drain region is identical to that in the first embodiment. Namely, implantation energy for nitrogen is so set that a range $R_P$ of nitrogen is smaller than that of boron fluoride. While oblique rotation implantation of nitrogen is employed in the aforementioned fabrication process, nitrogen may alternatively be vertically implanted to be thereafter diffused in a channel portion defined on a side wall portion of the gate electrode 103 by later heat treatment.

As to an effect of the tenth embodiment, an interfacial level in the interface between the polysilicon layer 105 and the gate insulating film 111 is reduced since nitrogen segregates in the gate insulating film 111. Thus, it is possible to improve reliability of the gate insulating film 111. Namely, it is possible to inhibit hot carriers generated on a drain end from being trapped in the gate insulating film 111 by such reduction of the interfacial level, thereby improving hot carrier resistance. Further, the source/drain regions are also doped with nitrogen, whereby it is possible to prevent occurrence of a punch-through phenomenon caused by diffusion of the impurity forming the source/drain regions.

Figure 90:
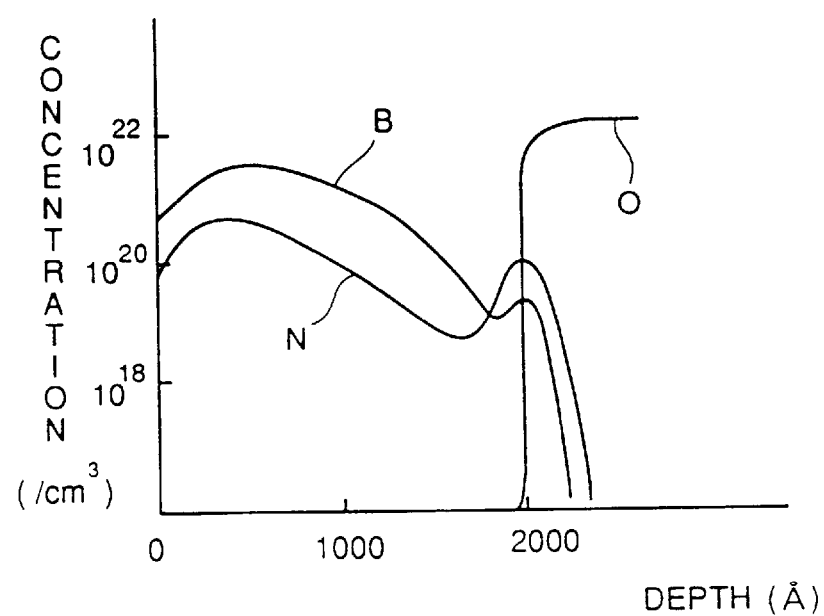
FIG. 90 illustrates an impurity profile along a depth direction of the line a—a (see FIG. 85) in an NMOS-TFT according to an eleventh embodiment of the present invention.

An NMOS-TFT according to an eleventh embodiment of the present invention is now described. While the present invention is applied to a PMOS-TFT in the tenth embodiment, the same is applied to an NMOS-TFT according to the eleventh embodiment. In order to form such an NMOS-TFT, the conductivity types of the implanted impurities may be reversed to those for forming the PMOS-TFT in FIG. 85. Namely, the gate electrode 103 and the source and drain regions 105b and 105c are doped with an N-type impurity, while the channel region 105a is doped with a P-type impurity. FIG. 90 shows an impurity profile of a depth direction in a section taken along the line a—a in FIG. 85, in a case of forming the TFT shown in FIG. 85 as an N-channel type one. An impurity profile of a depth direction in a section taken along the line b—b is identical to that shown in FIG. 83. Referring to FIG. 90, it is understood that nitrogen is deposited in the gate insulating film 111 in the eleventh embodiment.

A fabrication process for the NMOS-TFT according to the eleventh embodiment is now described. The fabrication process according to the eleventh embodiment is basically identical to that for the PMOS-TFT according to the tenth embodiment. Therefore, this process is described with reference to FIGS. 87 to 89. However, this embodiment is different in impurity implantation condition from the tenth embodiment, and hence the impurity shown in parentheses in FIG. 89 is employed in the eleventh embodiment.

First, elements up to a gate electrode 103 are formed through steps similar to those described with reference to the eighth embodiment. Then, a gate insulating film 111a of about 100 Å in thickness is formed by thermal oxidation, and thereafter a non-doped polysilicon layer is formed on the gate insulating film 111a by CVD in a thickness of about 2000 Å. Thereafter nitrogen is ion-implanted into the non-doped polysilicon layer at an angle of incidence of 15 to 60° under conditions of 10 keV and $2 \times 10^{15}/cm^2$ while rotating the semiconductor substrate 101. In order to control a threshold voltage, boron fluoride is ion-implanted into the polysilicon layer under conditions of 30 keV and $1 \times 10^{12}$ to $1 \times 10^{13}/cm^2$. Then, the polysilicon layer is patterned in a prescribed shape by photolithography and anisotropic etching, thereby forming a polysilicon layer 105 of a prescribed shape as shown in FIG. 88. A resist film 107 is formed on a channel region by photolithography, as shown in FIG. 89. The resist film 107 is employed as a mask to ion-implant arsenic into the polysilicon layer 105 under conditions of 30 keV and $4 \times 10^{15}/cm^2$. Heat treatment is carried out at 850° C. for about 20 minutes, thereby activating the impurities as implanted. Thus, N-type source and drain regions 105b and 105c and nitrogen-doped regions 110 are formed. In the heat treatment, nitrogen implanted into the polysilicon layer 105 is thermally diffused, while nitrogen segregates in the gate insulating film 111a. Thus, a gate insulating film 111 having the nitrogen-doped region 110 is formed.

As to an effect of the eleventh embodiment, an interfacial level in the interface between the polysilicon layer 105 and the gate insulating film 111 is reduced since nitrogen segregates in the gate insulating film 111a provided under the channel region 105a. Thus, it is possible to improve reliability of the gate insulating film 111. Namely, it is possible to inhibit hot carriers generated on a drain end from being trapped in the gate insulating film 111 by such reduction of the interfacial level, thereby effectively improving hot carrier resistance. Further, the source/drain regions are also doped with nitrogen, whereby it is possible to prevent occurrence of a punch-through phenomenon caused by diffusion of the impurity forming the source/drain regions.

Figure 91:
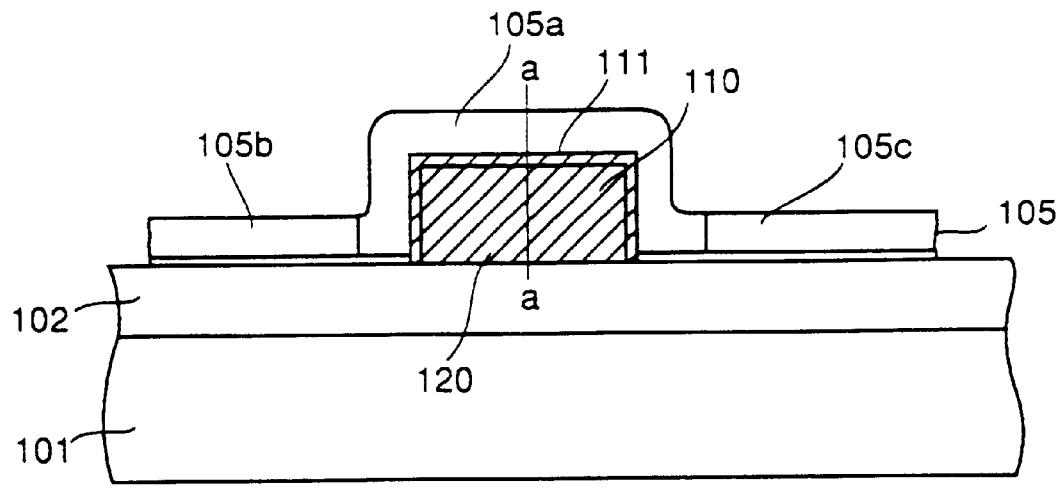
FIG. 91 is a sectional view showing a PMOS-TFT according to a twelfth embodiment of the present invention.
Figure 92:
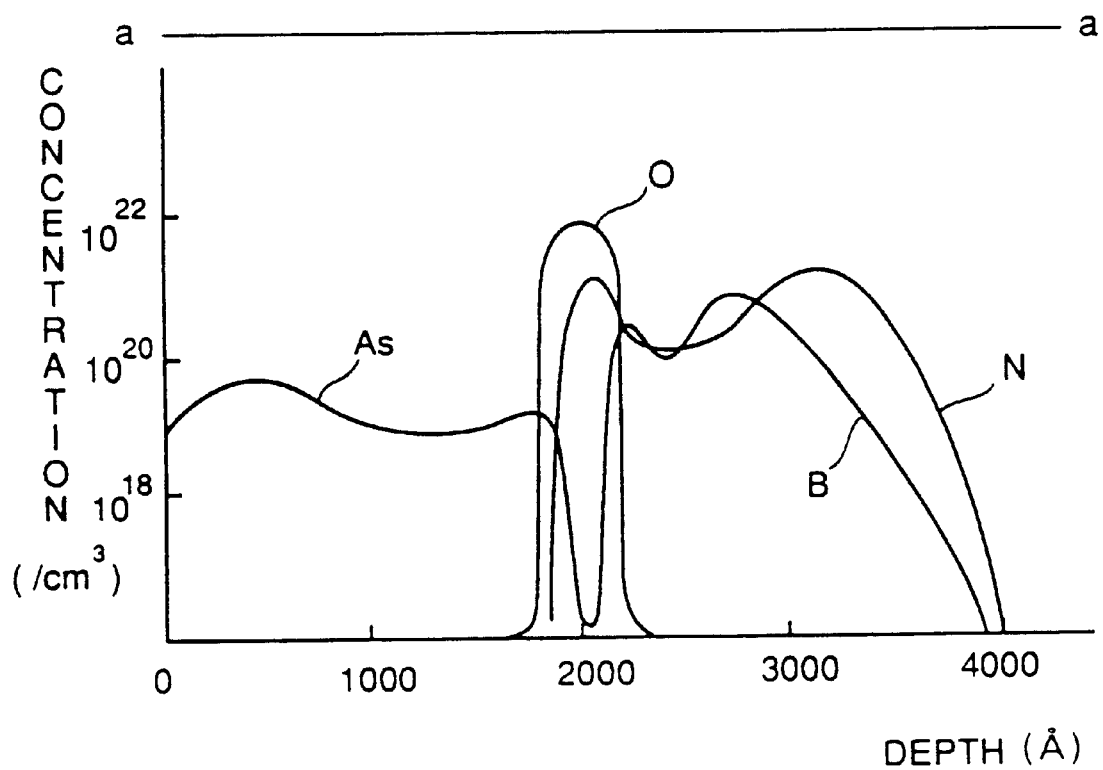
FIG. 92 illustrates an impurity profile along a depth direction of the line a—a in the PMOS-TFT according to the twelfth embodiment shown in FIG. 91.

With reference to FIG. 91, a PMOS-TFT according to a twelfth embodiment of the present invention is now described. In the twelfth embodiment, nitrogen-doped regions 110 exist in a gate electrode 120 and a gate insulating film 111 provided under a channel region 105a. FIG. 92 shows an impurity profile in a section taken along the line a—a in FIG. 91. Referring to FIG. 92, it is understood that nitrogen is deposited in a portion of the gate insulating film 111 located under the channel region 105a.

Figure 93:
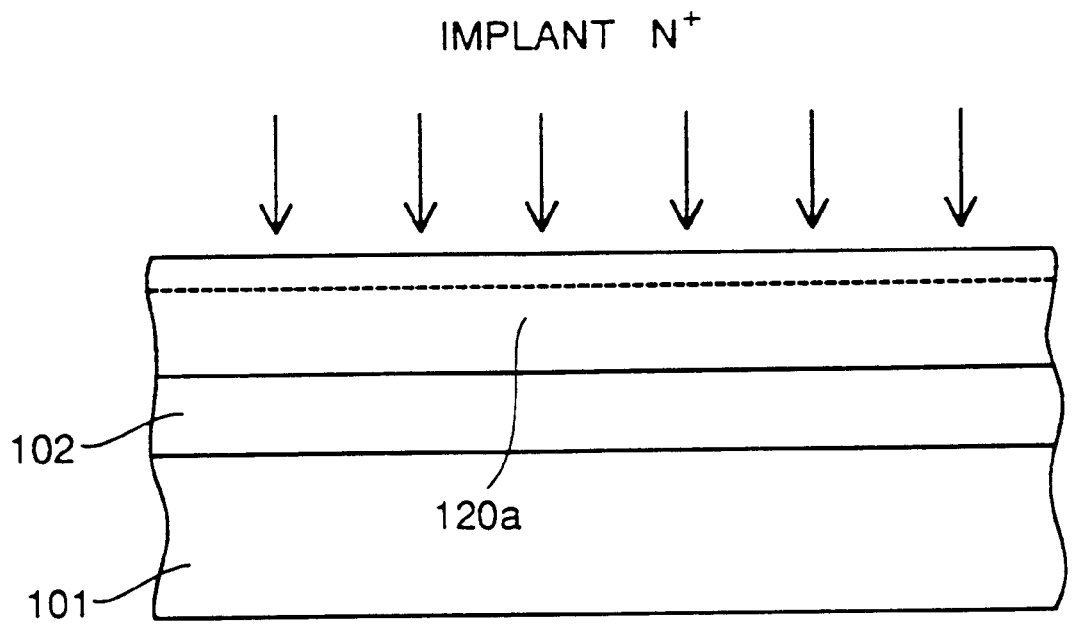
FIGS. 93 to 96 are sectional and perspective views for illustrating a fabrication process for the PMOS-TFT according to the twelfth embodiment shown in FIG. 91.
Figure 94:
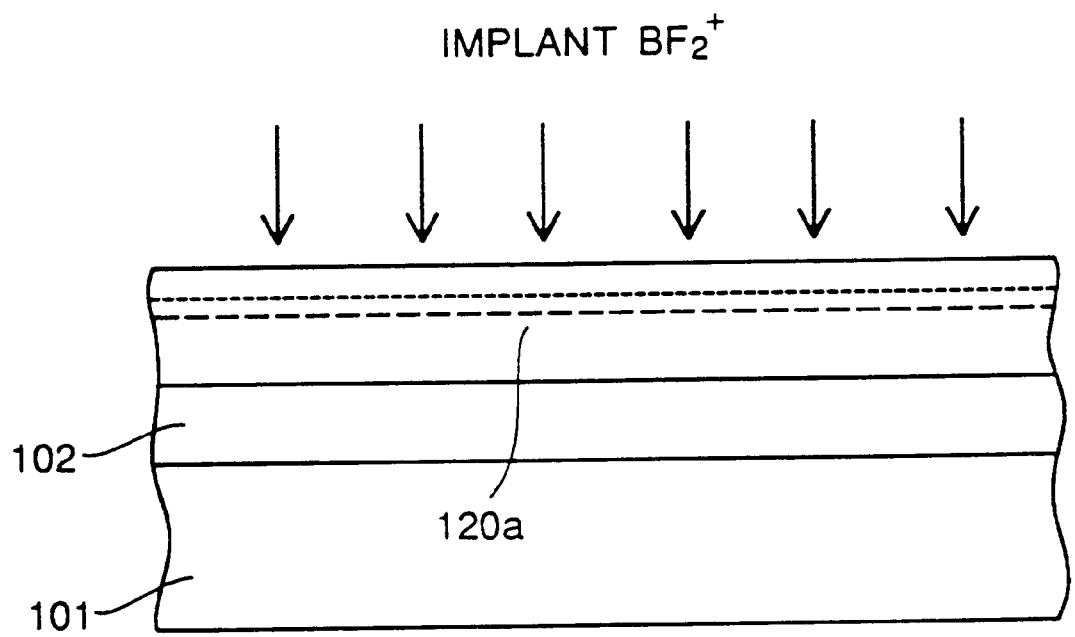
Figure 95:
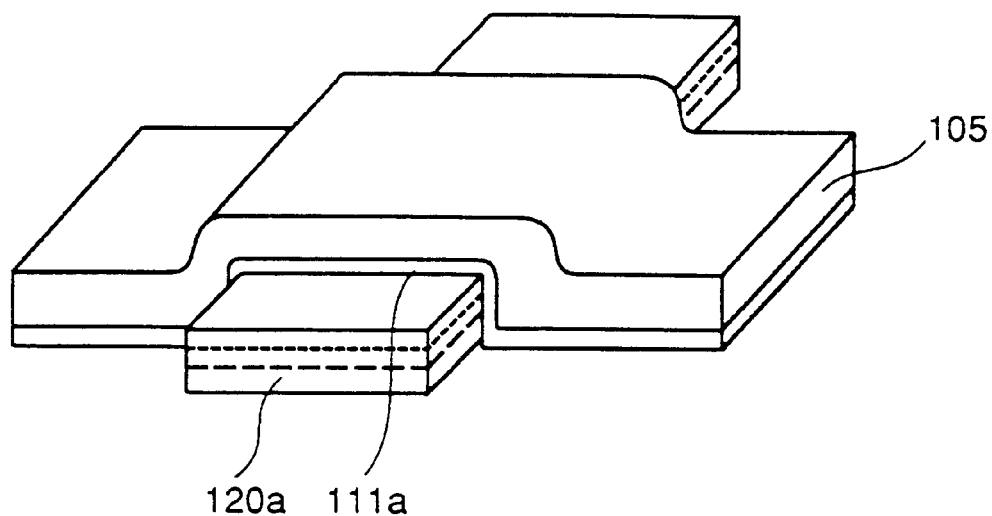

With reference to FIGS. 93 to 96, a fabrication process for the PMOS-TFT according to the twelfth embodiment shown in FIG. 91 is now described. First, an insulating film 102 is formed on a semiconductor substrate 101, and a polysilicon layer 120a is formed on the insulating film 102 in a thickness of about 2000 Å by CDV, as shown in FIG. 93. Arsenic is ion-implanted into the polysilicon layer 120a under conditions of 10 keV and $2 \times 10^{15}/cm^2$. Thereafter boron fluoride is ion-implanted into the polysilicon layer 120a, as shown in FIG. 94. The polysilicon layer 120a is patterned in the form of a gate electrode by photolithography and anisotropic etching, thereby forming a gate electrode 120b shown in FIG. 95.

Then, a gate insulating film 111a of about 100 Å in thickness is formed by thermal oxidation, and a polysilicon layer (not shown) is formed on the gate insulating film 111a in a thickness of about 2000 Å by CDV. In order to control a threshold voltage, arsenic is ion-implanted into the polysilicon layer under conditions of 30 keV and $1 \times 10^{12}$ to $1 \times 10^{13}/cm^2$. Then, the polysilicon layer is patterned in a prescribed shape by photolithography and anisotropic etching, thereby forming a polysilicon layer 105 shown in FIG. 95.

Figure 96:
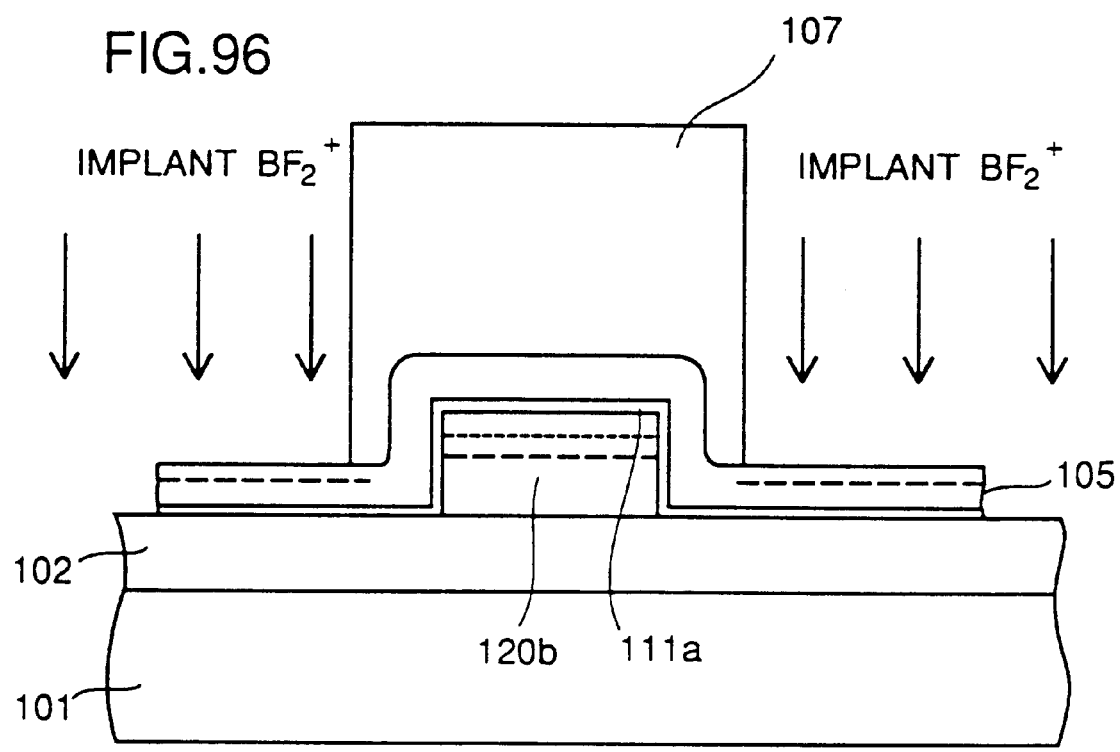

Then, a resist film 107 is formed on a channel region by photolithography, as shown in FIG. 96. The resist film 107 is employed as a mask to ion-implant boron fluoride into the polysilicon layer 105 under conditions of 30 keV and $4 \times 10^{15}/cm^2$. Heat treatment is carried out at 850° C. for about 20 minutes, thereby activating the impurities as implanted. Thus, P-type source and drain regions 105b and 105c shown in FIG. 91 are formed. In this heat treatment, nitrogen implanted into the gate electrode 120 is thermally diffused, while nitrogen segregates in the gate insulating film 111a. Thus, the gate insulating film 111 having the nitrogen-doped region 110 is formed as shown in FIG. 91.

As to an effect of the twelfth embodiment, the gate electrode 120 is doped with nitrogen, whereby it is possible to prevent diffusion of boron in the heat treatment for impurity activation. Thus, it is possible to prevent boron from entering the channel region 105a through the gate insulating film 111. Further, the gate electrode 120 is doped with nitrogen and thereafter heat treated, whereby nitrogen is deposited in the gate insulating film 111. Consequently, it is possible to suppress occurrence of an interfacial level in the gate insulating film 111 caused by hot carrier injection, similarly to the tenth embodiment. Thus, it is possible to improve the gate insulating film 111 in reliability.

Figure 97:
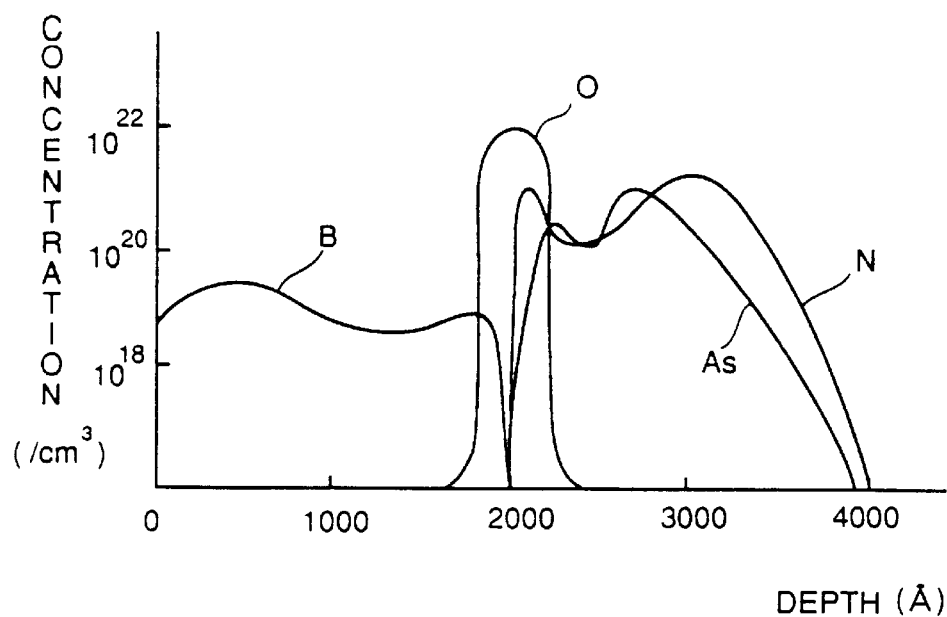
FIG. 97 illustrates an impurity profile along a depth direction of the line a—a (see FIG. 91) in an NMOS-TFT according to a thirteenth embodiment of the present invention.

An NMOS-TFT according to a thirteenth embodiment of the present invention is now described. While the present invention is applied to a PMOS-TFT according to the twelfth embodiment, the same is applied to an NMOS-TFT in the thirteenth embodiment. In order to form such an NMOS-TFT, the conductivity types of the implanted impurities may be reversed to those employed for forming the PMOS-TFT in FIG. 91. Namely, the gate electrode 120 and the source and drain regions 105b and 105c are doped with an N-type impurity, while the channel region 105a is doped with a P-type impurity. FIG. 97 shows an impurity profile of a depth direction in a section taken along the line a—a in FIG. 91 in a case of forming the TFT shown in FIG. 91 as an N-channel type one. Referring to FIG. 97, it is understood that nitrogen is deposited in the gate insulating film 111 located under the channel region 105a.

A fabrication process for the NMOS-TFT according to the thirteenth embodiment is basically substantially identical to that for the PMOS-TFT according to the twelfth embodiment. However, it is necessary to employ ion species which are of reverse conductivity types to those employed for forming the PMOS-TFT.

Also in the thirteenth embodiment, the gate electrode 120 is doped with nitrogen similarly to the twelfth embodiment, whereby it is possible to prevent arsenic contained in the gate electrode 120 from being diffused and injected into the gate insulating film 111 in heat treatment for activating the impurities. Nitrogen is deposited in the gate insulating film 111 in this heat treatment, whereby it is possible to prevent occurrence of an interfacial level in the gate insulating film 111 caused by hot carrier injection. Thus, it is possible to improve the gate insulating film 111 in reliability.

Figure 98:
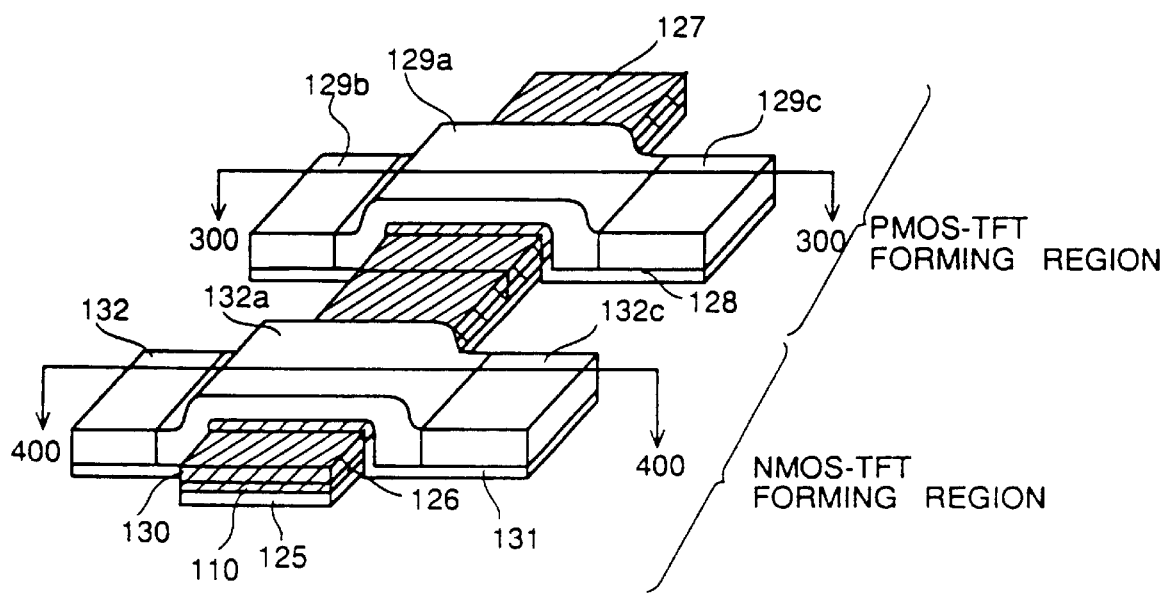
FIG. 98 is a perspective view showing a dual gate CMOS-TFT according to a fourteenth embodiment of the present invention.
Figure 99:
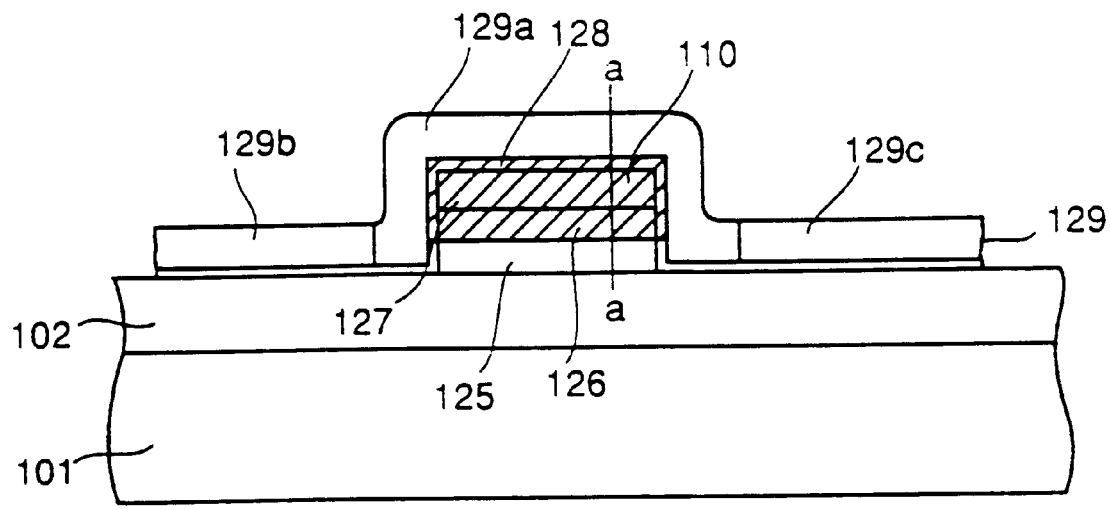
FIG. 99 is a sectional view of the dual gate CMOS-TFT shown in FIG. 98 taken along the line 300 to 300.
Figure 100:
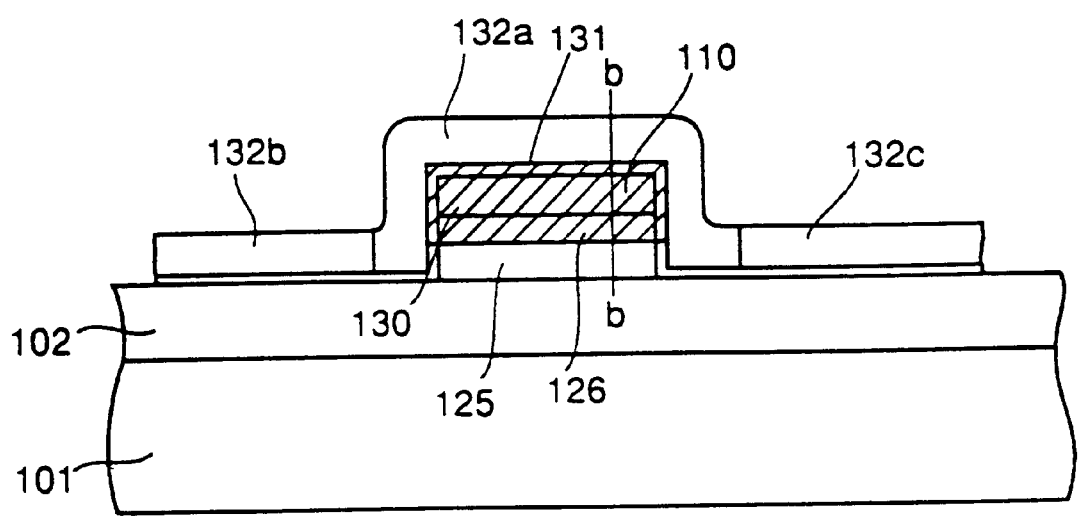
FIG. 100 is a sectional view of the dual gate CMOS-TFT shown in FIG. 98 taken along the line 400—400.

With reference to FIGS. 98 to 100, a dual gate CMOS-TFT according to a fourteenth embodiment of the present invention is now described. According to the fourteenth embodiment, an insulating film 102 is formed on a semiconductor substrate 101. In the fourteenth embodiment, a gate electrode of a PMOS-TFT is formed by a three-layer structure of a non-doped polysilicon layer 125, a tungsten silicide layer 126 and a P-type polysilicon layer 127. Further, a gate electrode of an NMOS-TFT is formed by a three-layer structure of the non-doped polysilicon layer 125, the tungsten silicide layer 126 and an N-type polysilicon layer 130. A gate insulating film 128 is formed to cover the P-type polysilicon layer 127, and a polysilicon layer 129 having a channel region 129a, a P-type source region 129b and a P-type drain region 129c is formed on the gate insulating film 128. On the other hand, a gate insulating film 131 is formed on the N-type polysilicon layer 130, and a polysilicon layer 132 having a channel region 132a, an N-type source region 132b and an N-type drain region 132c is formed on the gate insulating film 131.

Figure 101:
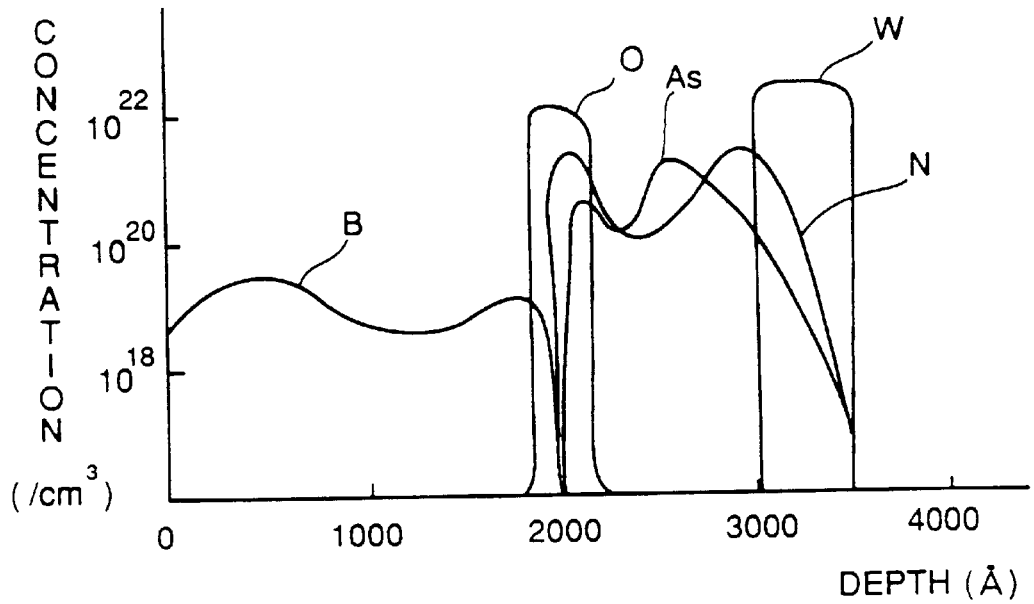
FIG. 101 illustrates an impurity profile along a depth direction of the line b—b in the dual gate CMOSTFT shown in FIG. 99.
Figure 102:
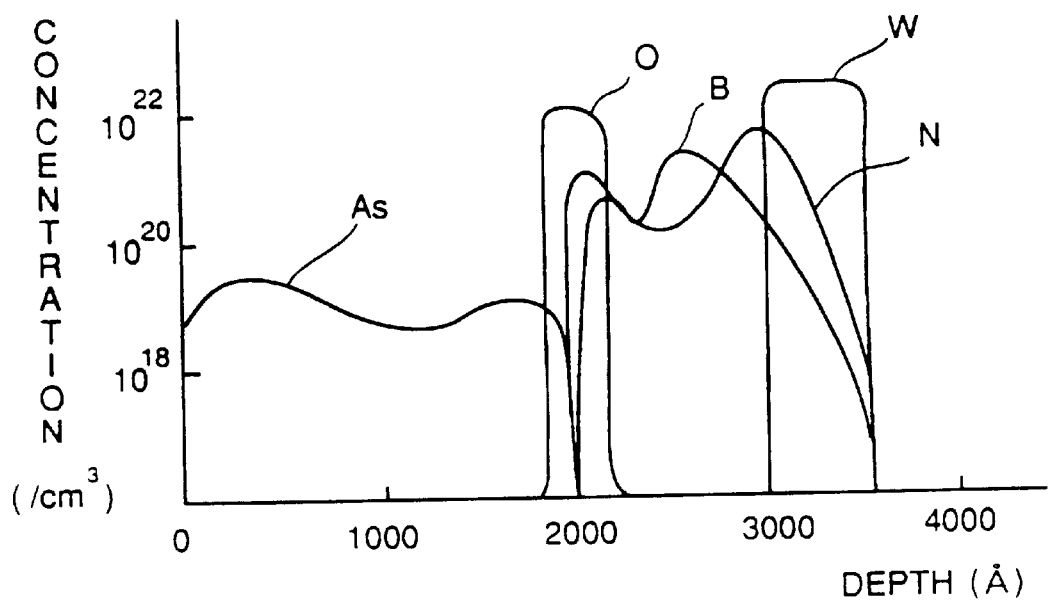
FIG. 102 illustrates an impurity profile in a depth direction of the line b—b in the dual gate CMOS-TFT shown in FIG. 99.

Nitrogen-doped regions 110 exist in the tungsten silicide layer 126, the P-type polysilicon layer 127, the gate insulating film 128, the N-type polysilicon layer 130 and the gate insulating film 131. FIG. 101 shows an impurity profile in a section taken along the line a—a in FIG. 99, and FIG. 102 shows an impurity profile in a section taken along the line b—b in FIG. 99. Referring to FIG. 101, peaks of concentration distribution of nitrogen exist in the interface between the P-type silicon layer 127 and the tungsten silicide layer 126, and the gate insulating film 128 in the gate electrode of the PMOS-TFT. Referring to FIG. 102, peaks of concentration distribution of nitrogen exist in the interface between the N-type polysilicon layer 130 and the tungsten silicide layer 126, and the gate insulating film 128 in the gate electrode of the NMOS-TFT.

With reference to FIGS. 103 to 108, a fabrication process for the dual gate CMOS-TFT according to the fourteenth embodiment shown in FIG. 98 is now described.

Figure 103:
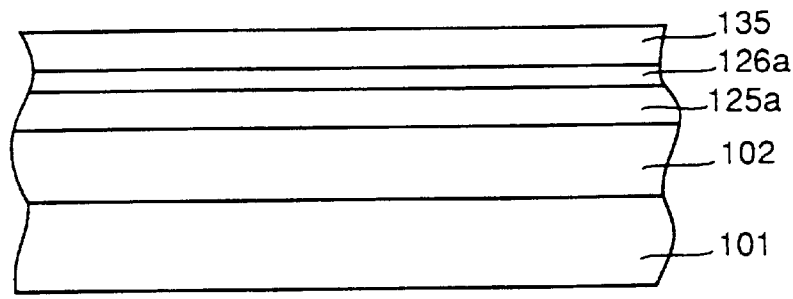
FIGS. 103 to 108 are sectional and plan views for illustrating a fabrication process for the dual gate CMOS-TFT according to the fourteenth embodiment shown in FIG. 98.

First, an insulating film 102 is formed on a semiconductor substrate 101, and a polysilicon layer 125a is formed on the insulating film 102 in a thickness of about 500 Å by CDV, as shown in FIG. 103. Then, a tungsten silicide layer 126a is formed on the polysilicon layer 125a in a thickness of about 500 Å by sputtering. A polysilicon layer 135 is formed on the tungsten silicide layer 126a in a thickness of about 1000 Å.

Figure 104:
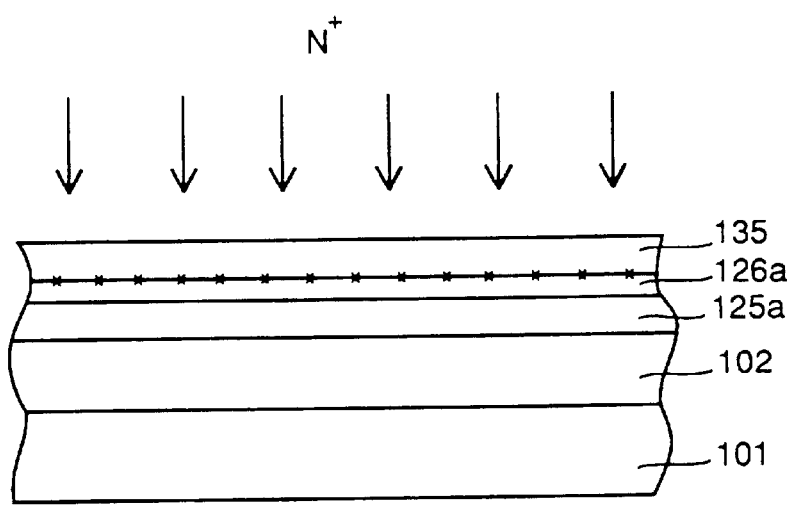

Then, nitrogen is ion-implanted into a portion close to the interface between the polysilicon layer 135 and the tungsten silicide layer 126a, as shown in FIG. 104. According to this embodiment, ion implantation conditions for nitrogen may be set at about 40 keV and $2\times10^{15}/cm^2$.

Figure 105:
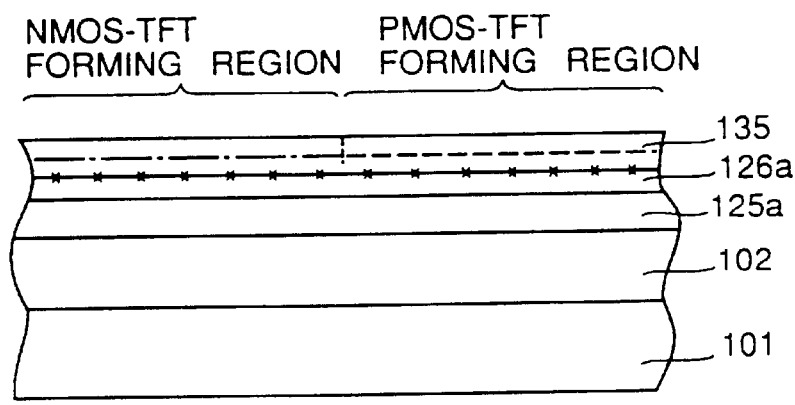

Then, a region for forming a PMOS-TFT is covered with a resist film (not shown), and this resist film is employed as a mask to ion-implant arsenic into a region for forming an NMOS-TFT. Then, the region for forming an NMOS-TFT is covered with a resist film (not shown), and this resist film is employed as a mask to ion-implant boron fluoride into the region for forming a PMOS-TFT. FIG. 105 shows a sectional structure of the TFT after such ion implantation.

Figure 106:
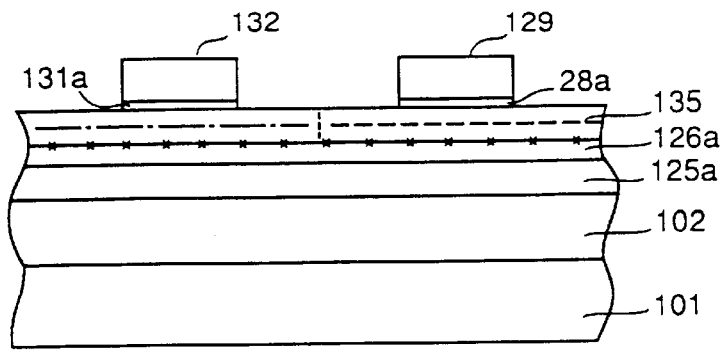
Figure 107:
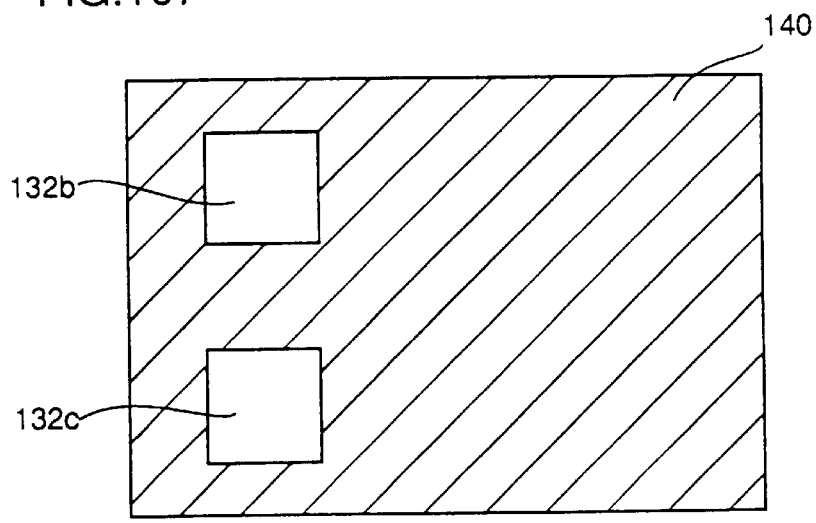

Thereafter the polysilicon layer 135, the tungsten silicide layer 126a and the non-doped polysilicon layer 125a are patterned in the form of gate electrodes. A gate oxide film of about 100 Å in thickness is formed by thermal oxidation, and a polysilicon layer is formed in a thickness of about 2000 Å by CDV. Thereafter ion implantation is carried out on each of the regions for forming a PMOS-TFT and an NMOS-TFT for controlling a threshold voltage, and thereafter the polysilicon layer is patterned. Thus, polysilicon layers 129 and 132 are formed as shown in FIG. 106.

Then, a resist film 140 (see FIG. 107) is formed on a region of the NMOS-TFT excluding source and drain regions 132b and 132c. The resist film 140 is employed as a mask to ion-implant arsenic into the polysilicon layer 135 under conditions of 30 keV and $4\times10^{15}/cm^2$. Heat treatment is carried out at 850° C. for about 20 minutes, thereby activating the arsenic ions. Thus, the source and drain regions 132b and 132c of the NMOS-TFT are formed. Thereafter the resist film 140 is removed.

Figure 108:
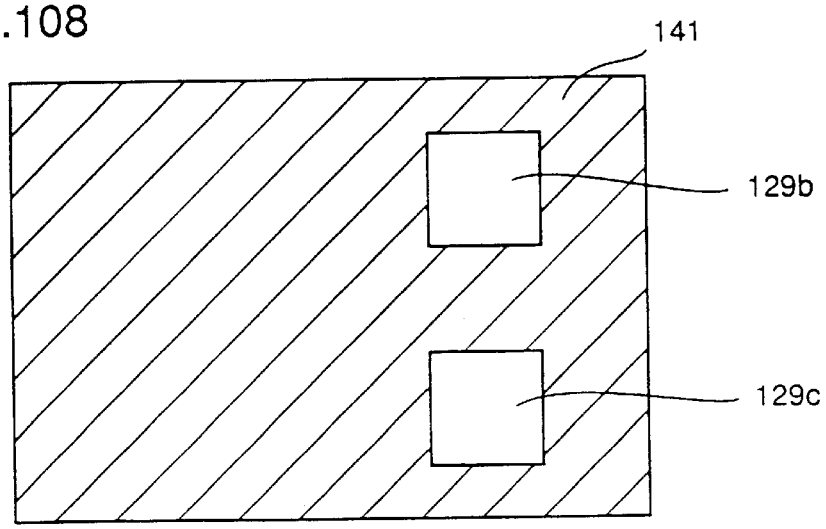

Then, a resist film 141 is formed on a region of the PMOS-TFT excluding source and drain regions 129b and 129c. This resist film 141 is employed as a mask to ion-implant boron fluoride into the source and drain regions 129b and 129c under conditions of 30 keV and $4\times10^{15}/cm^2$. FIG. 108 is a plan view showing the TFT in this stage. Thereafter heat treatment is carried out at 850° C. for about 20 minutes, thereby activating the boron ions. Thus, the source region 129b of the PMOS-TFT and the drain region 129c of the NMOS-TFT are formed.

In the heat treatment step for activating the source/drain regions, the impurities contained in the gate electrodes are also diffused. However, it is possible to suppress diffusion of boron and arsenic in the tungsten silicide layer 126, since nitrogen is doped in portions close to the interfaces between the tungsten silicide layer 126 and the polysilicon layers 127 and 130. Consequently, it is possible to suppress fluctuation of a threshold voltage caused by change in working functions of the gate electrodes.

Figure 109:
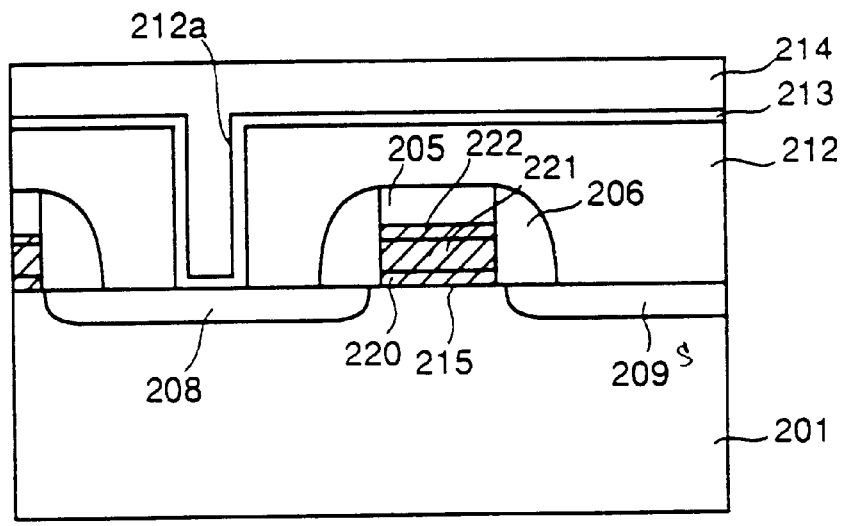
FIG. 109 is a sectional view showing a stack gate type flash EEPROM according to a fifteenth embodiment of the present invention.

With reference to FIG. 109, a stack gate type flash EEPROM according to a fifteenth embodiment of the present invention is now described. In the stack gate type flash EEPROM according to the fifteenth embodiment, a drain region 208 and a source region 209 are formed on a main surface of a silicon substrate 201 at a prescribed space, to define a channel region 215 therebetween. A floating gate electrode 221 is formed on the channel region 215 through an oxide film 220. A control gate electrode 205 is formed on the floating gate electrode 221 through an interlayer insulating film 222. Side wall oxide films 206 are formed on side surfaces of the floating gate electrode 221 and the control gate electrode 205. A smooth coating film 212 is formed to cover the side wall oxide films 206 and the control gate electrode 205. A titanium alloy film 213 is formed on the smooth coating film 212, and an aluminum alloy wiring layer 214 is formed on the titanium alloy film 213. A contact hole 212a is provided in the smooth coating film 212. The titanium alloy film 213 is electrically connected to the drain region 208 in this contact hole 212a.

Figure 110:
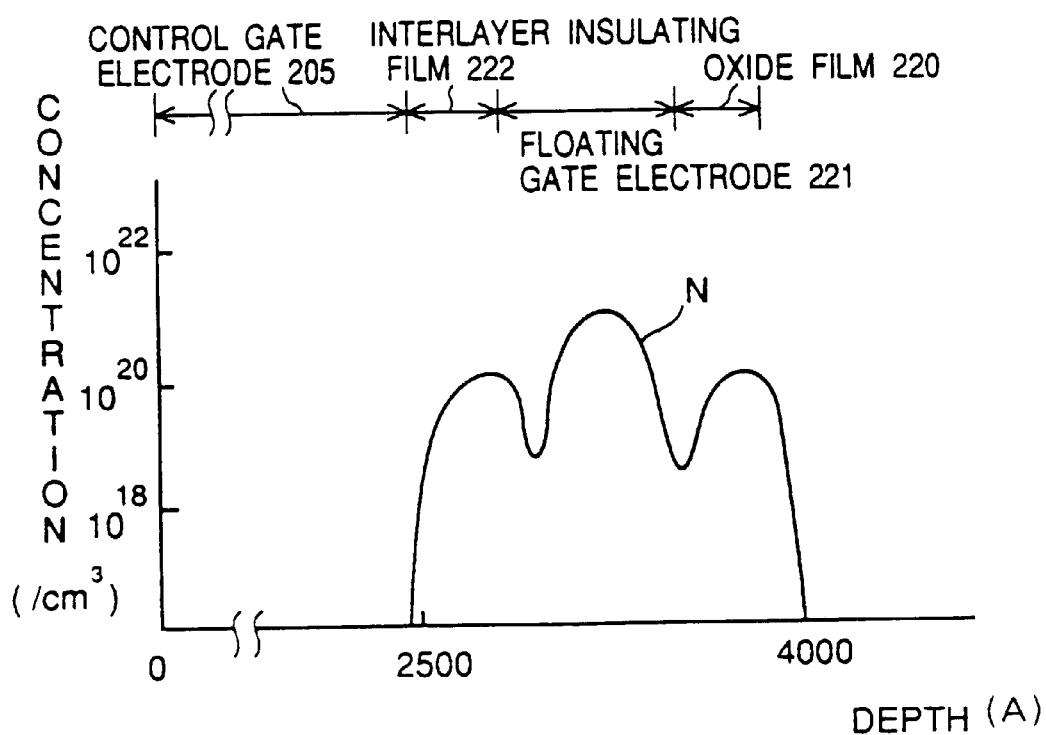
FIG. 110 illustrates a nitrogen concentration profile in a depth direction of a control gate electrode, an interlayer insulating film, a floating gate electrode and an oxide film in the flash EEPROM shown in FIG. 109.
Figure 111:
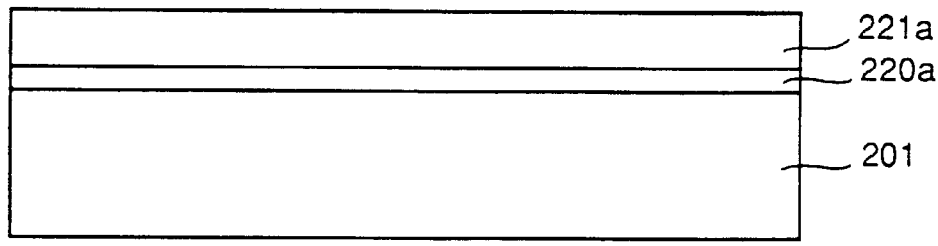
FIGS. 111, 112 and 114 to 124 are sectional views for illustrating a fabrication process for the stack gate type flash EEPROM according to the fifteenth embodiment shown in FIG. 109.

The titanium alloy film 213 is made of titanium nitride, for example. The oxide film 220 has a thickness of about 100 Å. The floating gate electrode 221 has a thickness of about 1000 Å. The interlayer insulating film 222 is formed by a composite film of a nitride film and an oxide film, in a thickness of about 200 Å. Nitrogen-doped regions 219 exist in the oxide film 220, the polysilicon film 221 and the interlayer insulating film 222. FIG. 110 shows an impurity profile of a depth direction in the control electrode 205, the interlayer insulating film 222, the floating gate electrode 221 and the oxide film 220 provided in the flash EEPROM shown in FIG. 109.

With reference to FIGS. 111 to 124, a fabrication process for the stack gate type flash EEPROM according to the fifteenth embodiment shown in FIG. 109 is now described. First, a well region (not shown) and element isolation oxide film (not shown) are formed on prescribed regions of a P-type silicon substrate 201. Thereafter an oxide film 220a of about 100 Å in thickness is formed on the overall surface. A polysilicon film 221a of about 1000 Å in thickness is formed on the oxide film 220a.

Figure 112:
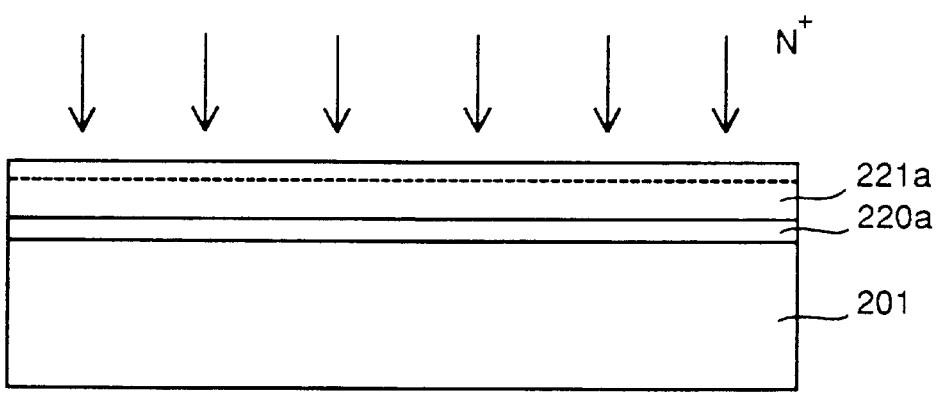

Then, nitrogen is ion-implanted into the polysilicon film 221a under conditions of 5 keV and $4\times10^{15}/cm^2$, as shown in FIG. 112. At this time, a projection range $R_P$ of nitrogen is set to come to a position of the polysilicon film 221a upward beyond a position separated by $5\times\Delta R_P$ from the interface between the polysilicon film 221a and the oxide film 220a toward the polysilicon film 221a, assuming that $\Delta R_P$ represents its standard deviation. If the projection range $R_P$ is set downward beyond the said position, the oxide film 220a may be damaged by nitrogen implantation.

Figure 114:
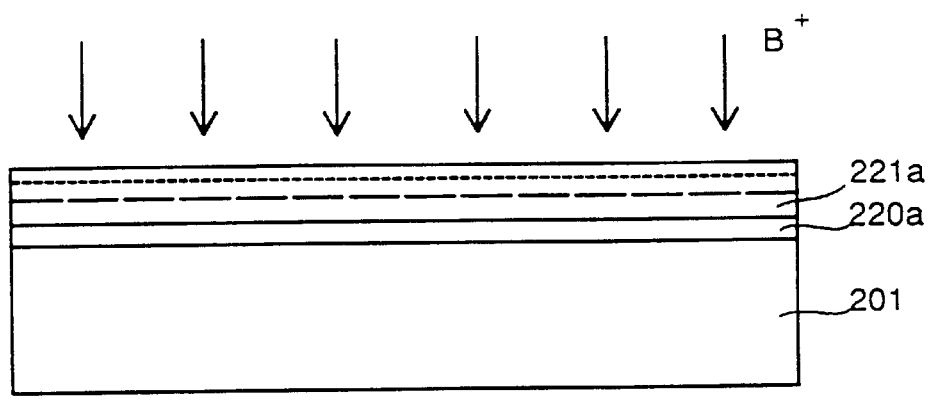
Figure 115:
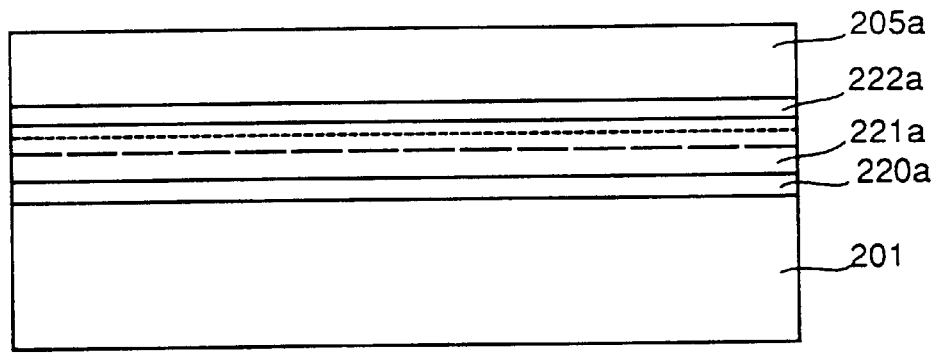

Then, boron is ion-implanted into the polysilicon film 221a under conditions of 20 keV and $4\times10^{15}/cm^2$, as shown in FIG. 114. Thereafter an interlayer insulating film 222a which is formed by a composite film of an oxide film and a nitride film is formed on the polysilicon film 221a in a thickness of about 200 Å, as shown in FIG. 115. Thereafter a polysilicon film 205a is formed on the interlayer insulating film 222a in a thickness of about 2500 Å.

Figure 116:
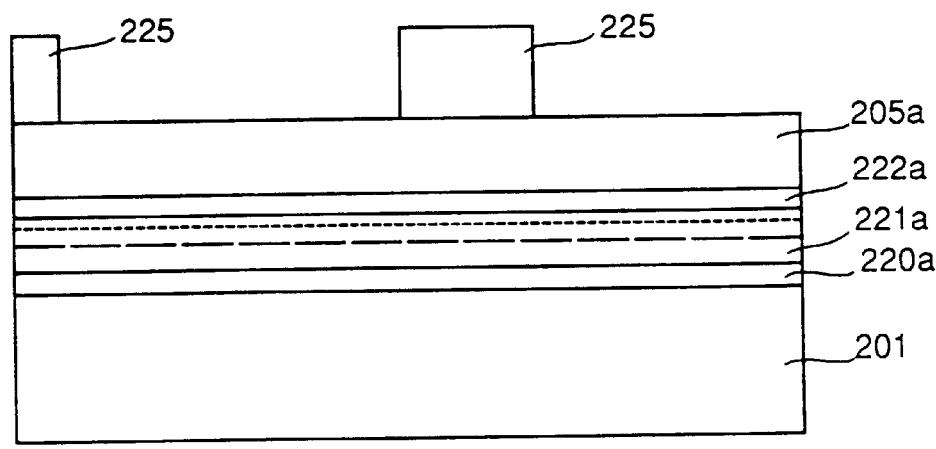
Figure 117:
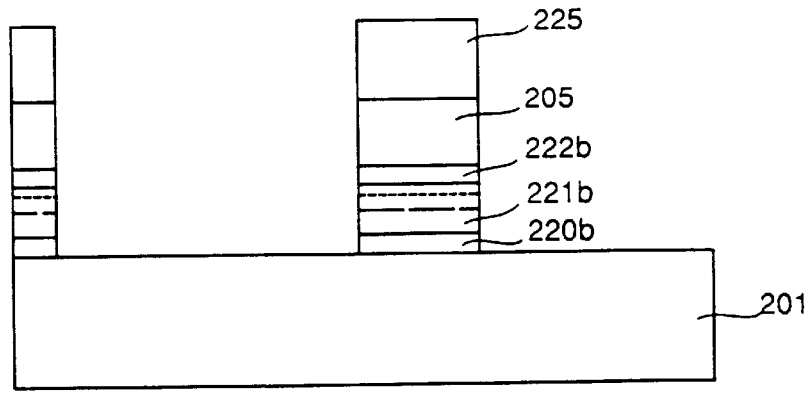

Then, resist films 225 are formed on prescribed regions of the polysilicon film 205a, as shown in FIG. 116. These resist films 225 are employed as masks to carry out anisotropic etching, thereby patterning the polysilicon film 205a, the interlayer insulating film 222a, the polysilicon film 221a and the oxide film 220a. Thus, a control gate electrode 205, an interlayer insulating film 222b, a floating gate electrode 221b and an oxide film 220b are formed as shown in FIG. 117. Thereafter the resist films 225 are removed.

Figure 118:
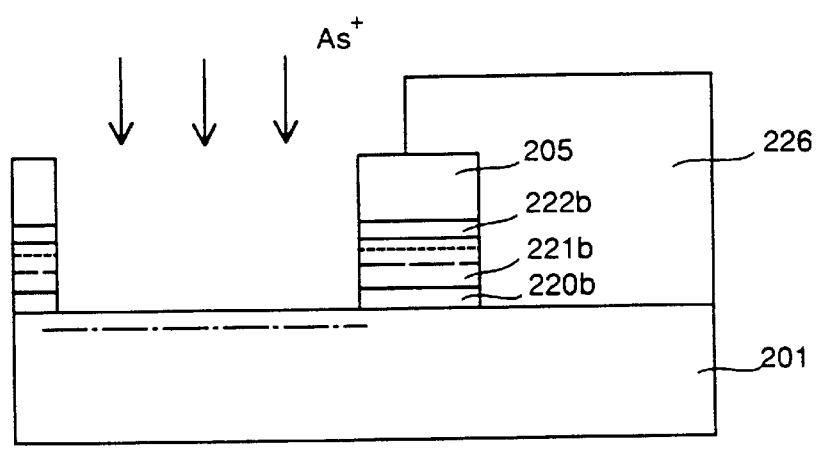

Then, a resist film 226 is formed to cover a portion for serving as a source region of a memory cell, as shown in FIG. 118. The resist film 226 and the control gate electrode 205 are employed as masks, to ion-implant arsenic into the main surface of the silicon substrate 201 under conditions of 35 keV and $5\times10^{15}/cm^2$. Thereafter the resist film 226 is removed.

Figure 119:
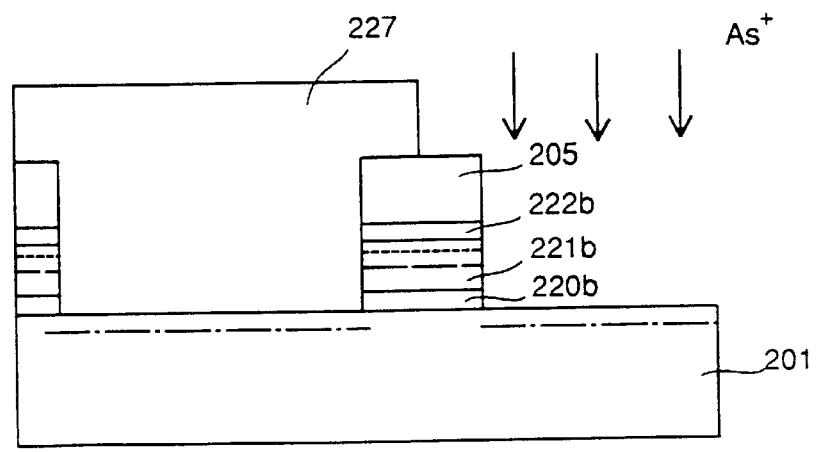

Then, a resist film 227 is formed to cover a portion for serving as a drain region of the memory cell, as shown in FIG. 119. The resist film 227 and the control gate electrode 205 are employed as masks, to ion-implant arsenic into the main surface of the silicon substrate 201 under conditions of 35 keV and $5\times10^{15}/cm^2$. Thereafter the resist film 227 is removed.

Figure 120:
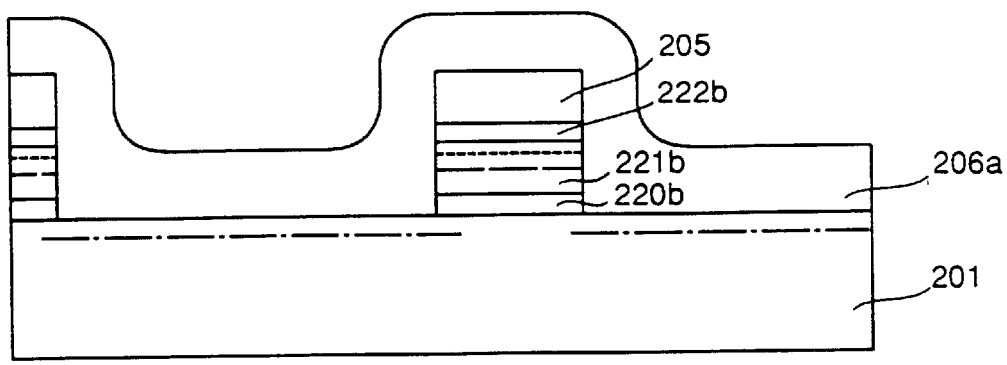
Figure 121:
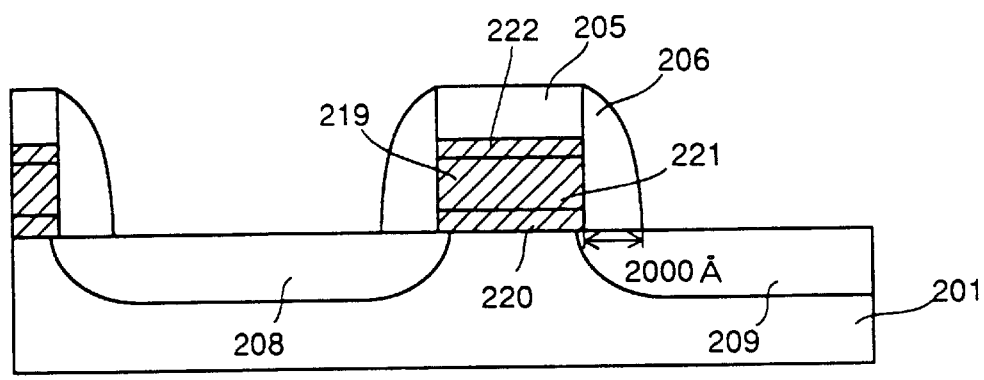

Then, an oxide film 206a is formed on the overall surface in a thickness of about 2000 Å, as shown in FIG. 120. Anisotropic reactive ion etching is carried out on the oxide film 206a, thereby forming side wall oxide films 206 as shown in FIG. 121. Each side wall oxide film 206 as formed has a width of about 2000 Å in a channel length direction. Namely, the width in the channel length direction is substantially identical to the thickness of the oxide film 206a shown in FIG. 120. Thus, it is possible to readily control the width of each side wall oxide film 206 in the channel length direction by adjusting the thickness of the oxide film 206a. After formation of the side wall oxide films 206, heat treatment is carried out at 850° C. for about 60 seconds, thereby activating the impurities as implanted. Thus, a source region 209 and a drain region 208 are formed. Due to this heat treatment, boron and nitrogen implanted into the floating gate electrode 221b are diffused. At this time, nitrogen is diffused in advance of boron, whereby only nitrogen is deposited in the oxide film 220b and the interlayer insulating film 222b. Thus, nitrogen-doped regions 219 are formed in the oxide film 220, the floating gate electrode 221 and the interlayer insulating film 222.

Figure 122:
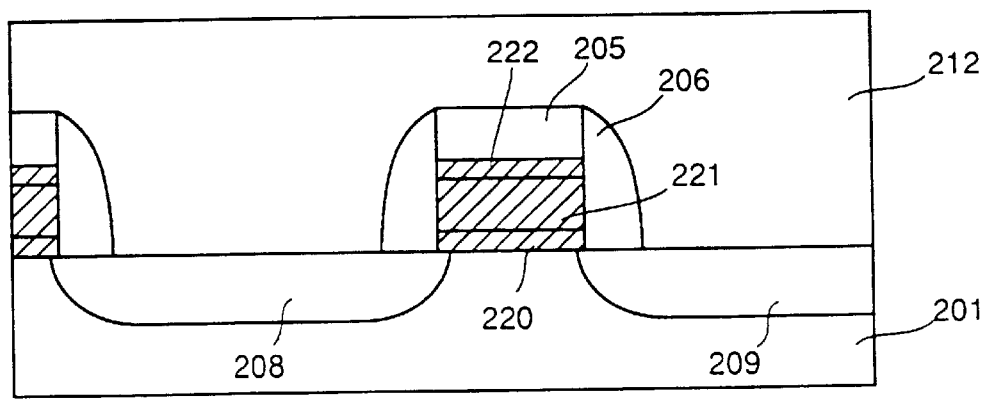

Then, a smooth coating film 212 is formed in a thickness of 5000 to 15000 Å by CDV, as shown in FIG. 122. Thereafter heat treatment is carried out under a temperature condition of 800 to 1000° C. by a reflow method, thereby flattening the surface of the smooth coating film 212. The smooth coating film 212 is formed by a PSG film, a BPSG film, a nitride film, a non-doped oxide film or a layered film of these films, for example.

Figure 123:
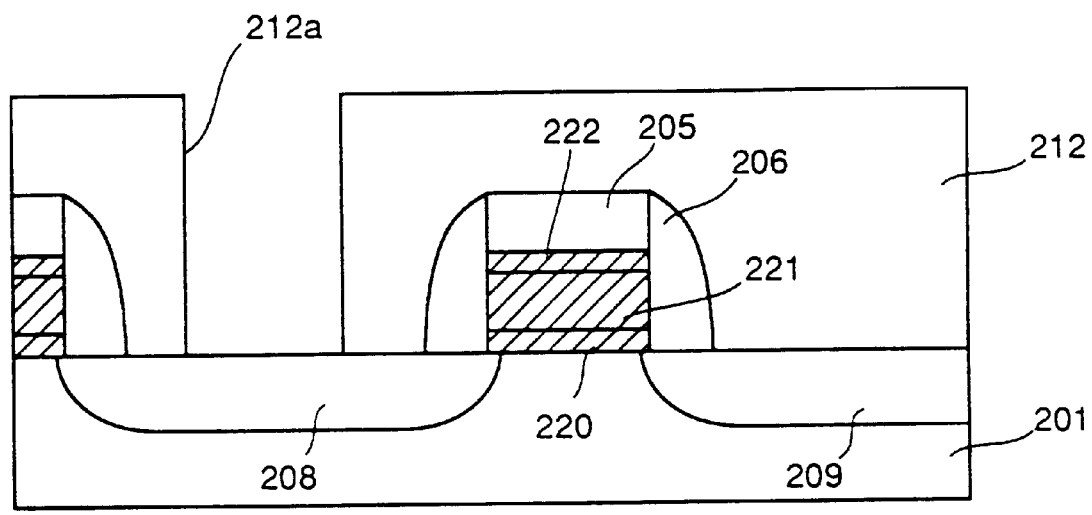
Figure 124:
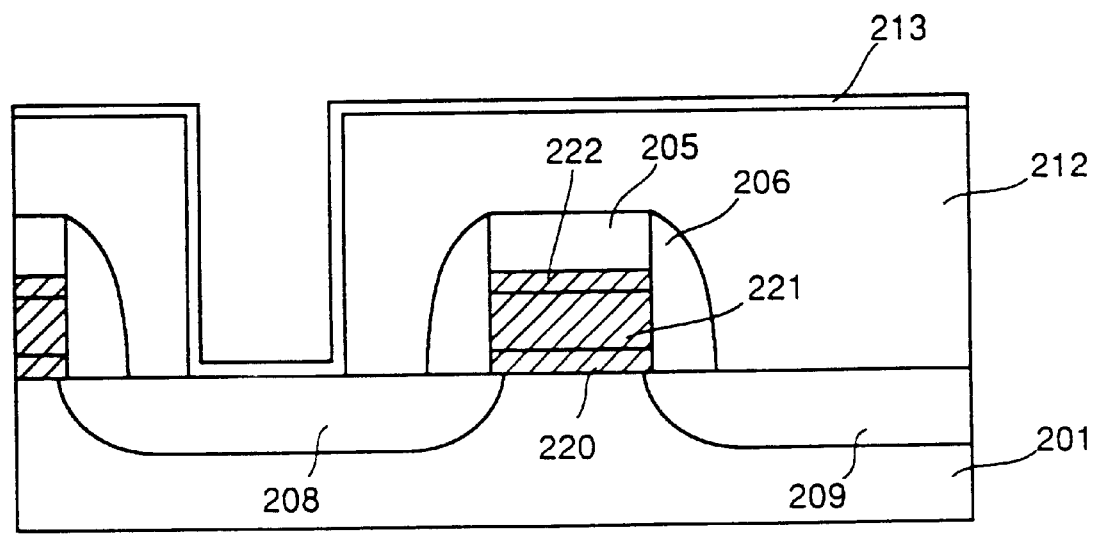

Then, a contact hole 212a of about 0.6 to 1.5 μm in diameter is formed in a portion of the smooth coating film 212 located on the drain region 208, as shown in FIG. 123. Thereafter a titanium alloy film 213 consisting of titanium nitride is formed on a side surface of the contact hole 212a and the smooth coating film 212 for electrical connection with the drain region 208. Finally, an aluminum alloy wiring layer 214 of about 1000 Å in thickness is formed on the titanium alloy film 213 by sputtering. The titanium alloy film 213 and the aluminum alloy wiring layer 214 are patterned by photolithography and dry etching. Thus formed is a bit line consisting of the titanium alloy film 213 and the aluminum alloy wiring layer 214, which is electrically connected with the drain region 208. Thus, the flash EEPROM according to the fifteenth embodiment shown in FIG. 109 is completed. Implantation into the source/drain regions may be simultaneously carried out in the step shown in FIG. 117 through the mask of the resist film 226.

In the flash EEPROM according to the fifteenth embodiment, nitrogen is ion-implanted into the floating gate electrode 221 so that nitrogen is deposited in the oxide film 220 and the interlayer insulating film 222 by subsequent thermal diffusion, whereby no doping of hydrogen is caused dissimilarly to RTN treatment. Due to the effect of nitrogen deposited in the oxide film 220, further, it is possible to suppress trapping and occurrence of an interfacial level caused by hot carrier injection, trapping and occurrence of an interfacial level caused by holes resulting from interband tunneling in a write or erase operation through F-N tunneling. Further, no deterioration of the oxide film 220 is caused by doping of hydrogen, whereby the oxide film 220 is improved in reliability and it is possible to reduce a probability of occurrence of an initial failure in the flash EEPROM. In addition, the interlayer insulating film 222 is also improved in reliability by nitrogen contained therein. Upon such improvement in reliability of the interlayer insulating film 222, it is possible to reduce the film 222 in thickness, whereby a capacitance $C_{FC}$ between the control gate electrode 205 and the floating gate electrode 221 can be increased. Namely, a higher electric field is applied to the channel to improve current drivability when the coupling ratio is large, regardless of the potential which is applied to the control gate electrode 205. Thus, it is possible to reduce the potential which is applied to the control gate electrode 205, thereby reducing the voltage of a power source.

Further, the floating gate electrode 221 is doped with nitrogen, whereby diffusion of boron is suppressed. Thus, it is possible to inhibit boron from punching through the channel region 215 and being injected into the oxide film 220, thereby effectively suppressing fluctuation of the threshold voltage. In addition, nitrogen is doped by ion implantation in the fabrication process for the flash EEPROM according to the fifteenth embodiment, whereby the silicon substrate 201 is not exposed to abrupt temperature change, dissimilarly to RTN treatment. Thus, it is also possible to suppress occurrence of stripy defects.

In RTN treatment, nitrogen may be diffused over a wide range of the silicon substrate 201 since it is necessary to apply heat in nitrogen doping. In the fabrication process according to this embodiment, however, it is not necessary to carry out a heat treatment step in implantation of nitrogen since nitrogen is doped by ion implantation. Thus, the heat treatment can be effectively carried out after patterning of the gate electrode 221, not to diffuse nitrogen in the source region 209 and the drain region 208.

While boron is ion-implanted into the polysilicon film 221a for forming the floating gate electrode 221 which is doped in a P type in the fabrication process for the flash EEPROM according to the fifteenth embodiment, arsenic ions may alternatively be implanted into an N-type doped polysilicon film which is doped with phosphorus by about $5 \times 10^{20}/cm^3$ or a polysilicon film under conditions of about 50 keV and $4 \times 10^{15}/cm^2$, thereby forming the floating gate electrode 221.

Figure 125:
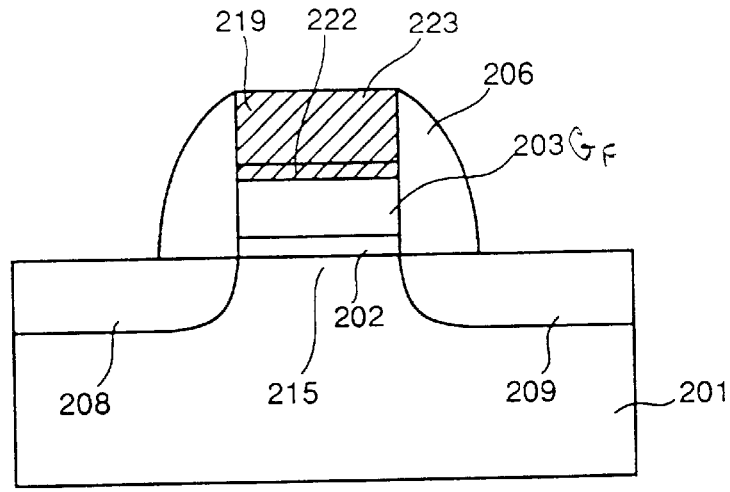
FIG. 125 is a sectional view showing a memory cell part of a stack gate type flash EEPROM according to a sixteenth embodiment of the present invention.

With reference to FIG. 125, a stack gate type flash EEPROM according to a sixteenth embodiment of the present invention is now described. In the flash EEPROM according to the sixth embodiment, a source region 209 and a drain region 208 are formed on a main surface of a P-type silicon substrate 201 at a prescribed space, to hold a channel region 215 therebetween. A floating gate electrode 203 is formed on the channel region 215 through an oxide film 202. A control gate electrode 223 is formed on the floating gate electrode 203 through an interlayer insulating film 222 which is formed by a composite film of a nitride film and an oxide film. The interlayer insulating film 222 has a thickness of about 200 Å. The control gate electrode 223 is formed by a polysilicon film, and has a thickness of about 2500 Å. Nitrogen-doped regions 219 exist in the interlayer insulating film 222 and the control gate electrode 223.

Figure 126:
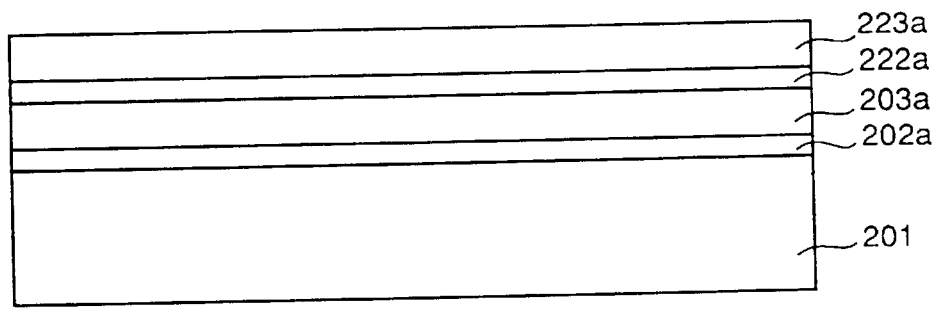
FIGS. 126 to 128 are sectional views for illustrating a fabrication process for the stack gate type flash EEPROM according to the sixteenth embodiment shown in FIG. 125.
Figure 127:
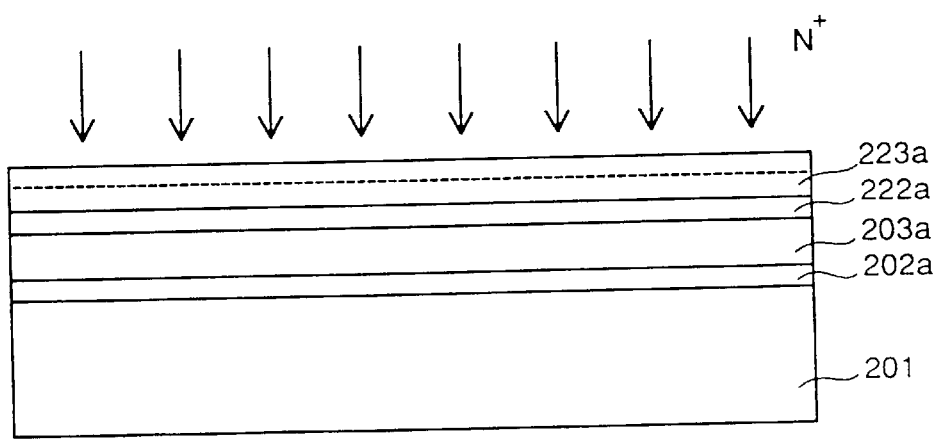
Figure 128:
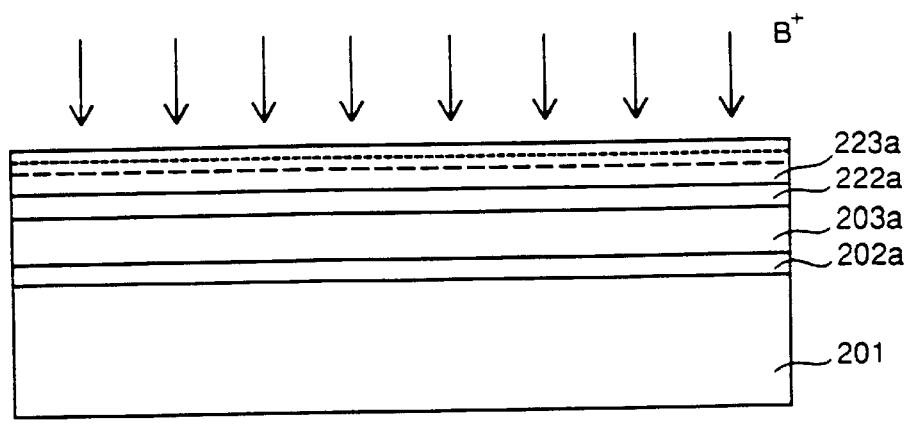

With reference to FIGS. 126 to 128, a fabrication process for the flash EEPROM according to the sixteenth embodiment shown in FIG. 125 is now described. First, a well region and element isolation oxide film (not shown) are formed on prescribed regions of a P-type silicon substrate 201, and thereafter an oxide film 202a of about 100 Å in thickness, a polysilicon film 203a of about 1000 Å in thickness, an interlayer insulating film 222a of about 200 Å in thickness which is formed by a composite film of an oxide film and a nitride film, and a polysilicon film 223a of about 2500 Å in thickness are successively formed on the overall surface, as shown in FIG. 126.

Then, nitrogen is ion-implanted into the polysilicon film 223a under conditions of about 10 keV and $4 \times 10^{15}/cm^2$, as shown in FIG. 127. At this time, a projection range $R_P$ of nitrogen is set to come to a position of the polysilicon film 223a upward beyond a position separated by $5 \times \Delta R_P$ from the interface between the polysilicon film 223a and the oxide film 222a toward the polysilicon film 223a, assuming that $\Delta R_P$ represents its standard deviation, similarly to the fabrication process for the fifteenth embodiment (see FIG. 113).

Then, boron is ion-implanted into the polysilicon film 223a under conditions of 20 keV and $4 \times 10^{15}/cm^2$, as shown in FIG. 128. Thereafter the flash EEPROM as shown in FIG. 125 is completed, through a fabrication process which is similar to that for the fifteenth embodiment described above with reference to FIGS. 116 to 124. In a heat treatment step for activating the impurities in the sixteenth embodiment, however, nitrogen which is doped in the control gate electrode 223 is deposited in the interlayer insulating film 222. While boron is ion-implanted into the polysilicon film 223a for forming the control gate electrode 223 which is doped in a P type in the sixteenth embodiment, a doped polysilicon film which is doped with phosphorus by about $5 \times 10^{20}/cm^3$ or an N-type polysilicon film which is formed by implanting arsenic ions into a polysilicon film under conditions of about 50 keV and $4 \times 10^{15}/cm^2$ may alternatively be employed to form the control gate electrode 223.

Also in the sixteenth embodiment, it is possible to improve the interlayer insulating film 222 in reliability while reducing the voltage of a power source for the element, similarly to the fifteenth embodiment. Further, it is possible to prevent diffusion of boron which is doped in the control gate electrode 223 in heat treatment by implanting nitrogen into the control gate electrode 223, thereby preventing boron from being injected into the interlayer insulating film 222.

Figure 129:
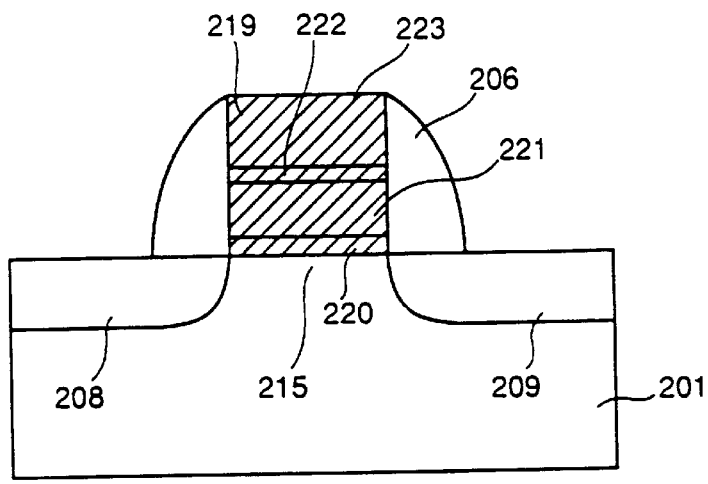
FIG. 129 is a sectional view showing a memory cell part of a stack gate type flash EEPROM according to a seventeenth embodiment of the present invention.

With reference to FIG. 129, a stack gate type flash EEPROM according to a seventeenth embodiment of the present invention is now described. In the seventeenth embodiment, the fifteenth and sixteenth embodiments are combined with each other.

Figure 113:
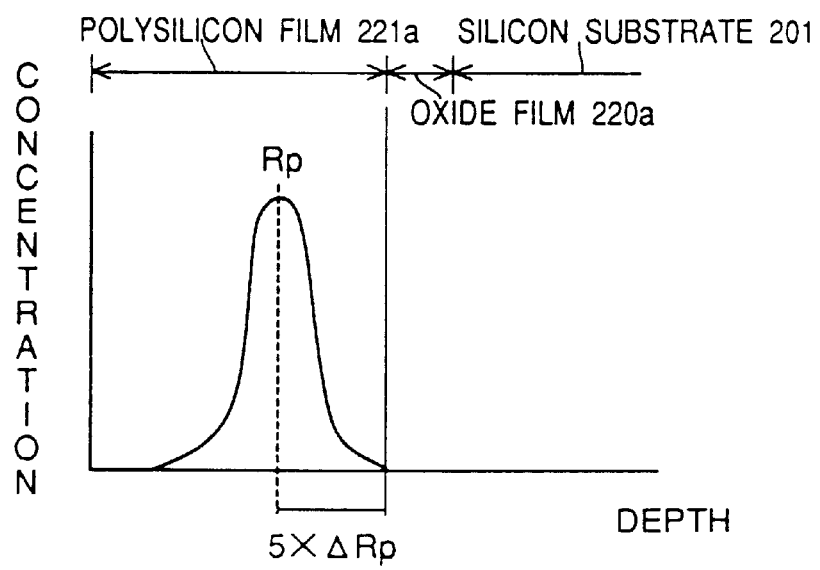
FIG. 113 is a graph for illustrating a method of setting a nitrogen projection range in a nitrogen implantation step shown in FIG. 112.
Figure 130:
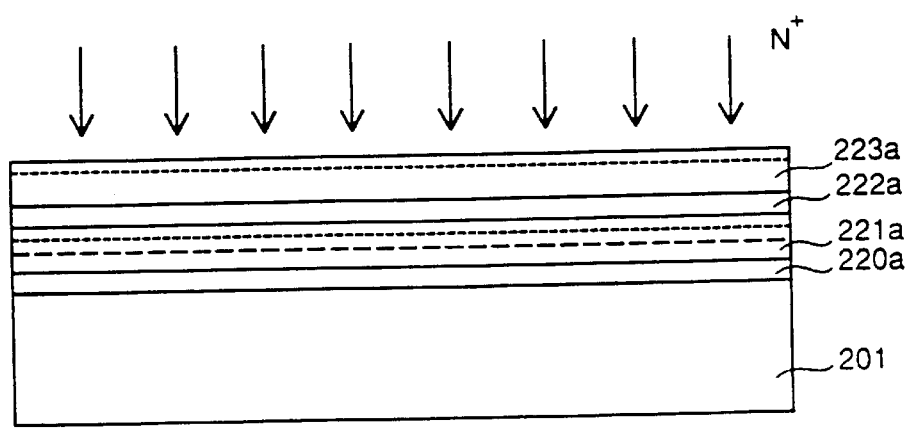
FIGS. 130 and 131 are sectional views for illustrating a fabrication process for the stack gate type flash EEPROM according to the seventeenth embodiment shown in FIG. 129.
Figure 131:
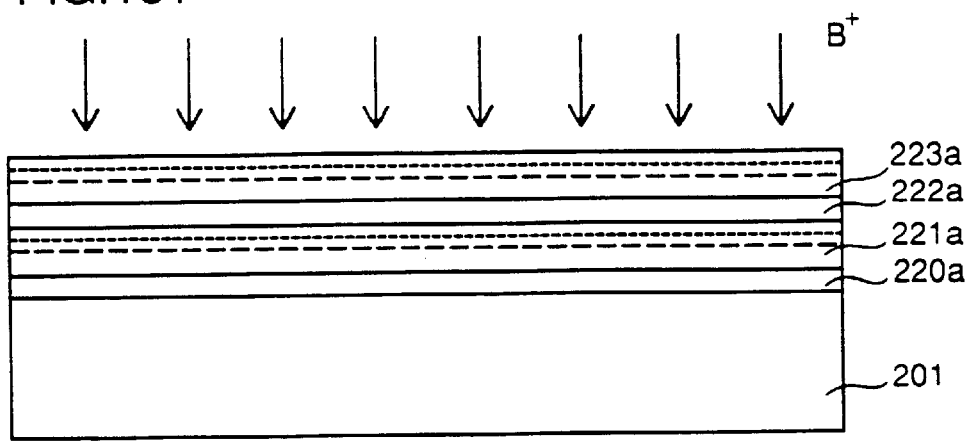

With reference to FIGS. 130 and 131, a fabrication process for the flash EEPROM according to the seventeenth embodiment is now described. Elements up to a polysilicon film 223a shown in FIG. 113 are formed through a process which is similar to that of the fifteenth embodiment shown in FIGS. 111 to 115. Nitrogen is ion-implanted into the polysilicon film 223a under conditions of about 10 keV and $4 \times 10^{15}/cm^2$. Then, boron is ion-implanted into the polysilicon film 223a under conditions of about 20 keV and $4 \times 10^{15}/cm^2$, as shown in FIG. 131. Thereafter the flash EEPROM shown in FIG. 129 is completed through steps which are similar to those of the fifteenth embodiment shown in FIGS. 116 to 124. In a heat treatment step for activating impurities in the seventeenth embodiment, however, nitrogen which is doped in the control electrode 223b is also deposited in the interlayer insulating film 222b simultaneously with nitrogen which is doped in the floating gate electrode 221b and deposited in the oxide film 220b and the interlayer insulating film 222b. While the floating gate electrode 221b and the control electrode 223b are of P types in the above description, the same may alternatively be of N types. In this case, a doped polysilicon film which is doped with phosphorus by about $5 \times 10^{20}/cm^{31}$, or an N-type polysilicon film obtained by ion-implanting arsenic into a polysilicon film under conditions of about 50 keV and $4 \times 10^{15}/cm^2$ is employed.

Effects of the stack gate type flash EEPROM according to the seventeenth embodiment are similar to those of the fifteenth and sixteenth embodiments as described above.

Figure 132:
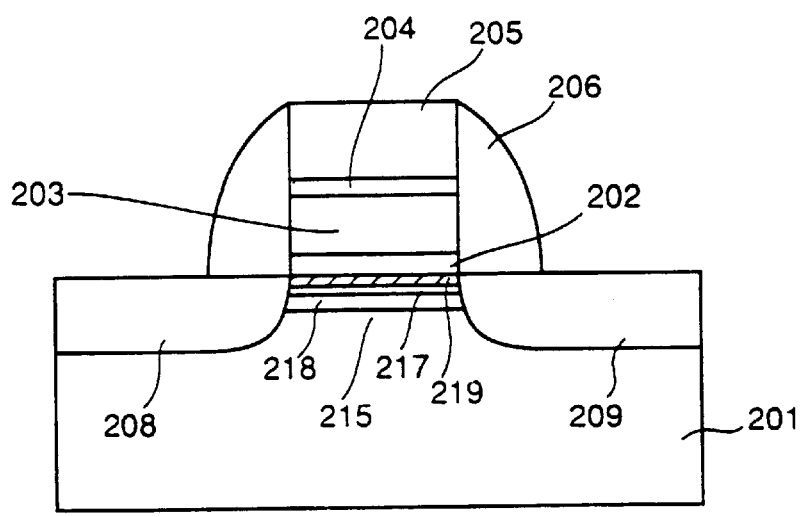
FIG. 132 is a sectional view showing a memory cell part of a buried channel type flash EEPROM according to an eighteenth embodiment of the present invention.

With reference to FIG. 132, a buried channel type flash EEPROM according to an eighteenth embodiment of the present invention is now described. In the buried channel type flash EEPROM according to the eighteenth embodiment, a source region 209 and a drain region 208 are formed on a main surface of a P-type silicon substrate 201 at a prescribed space, to hold a channel region 215 therebetween. A floating gate electrode 203 is formed on the channel region 215 through an oxide film 202 having a small thickness of about 100 Å. A control gate electrode 205 is formed on the floating gate electrode 203 through an interlayer insulating film 204. Side wall oxide films 206 are formed on side surfaces of the floating gate electrode 203 and the control gate electrode 205. An N-type impurity layer 217 is formed on the channel region 215, and a P-type impurity layer 218 is formed under the N-type impurity layer 217. A nitrogen-doped region 219 is formed on a main surface of the N-type impurity layer 217.

Figure 133:
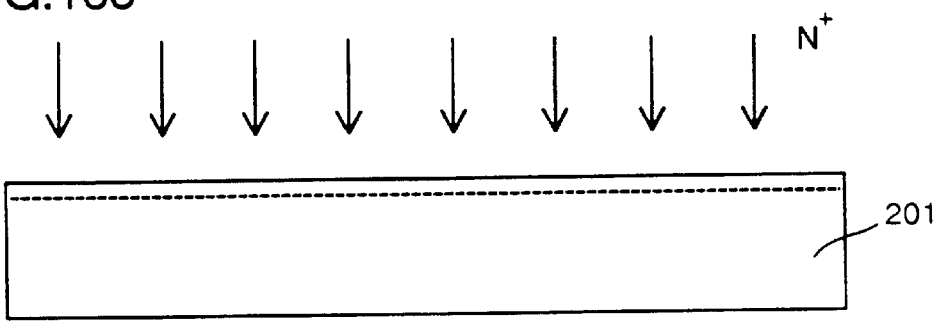
FIGS. 133 to 136 are sectional views for illustrating a fabrication process for the buried channel type flash EEPROM according to the eighteenth embodiment shown in FIG. 132.
Figure 134:
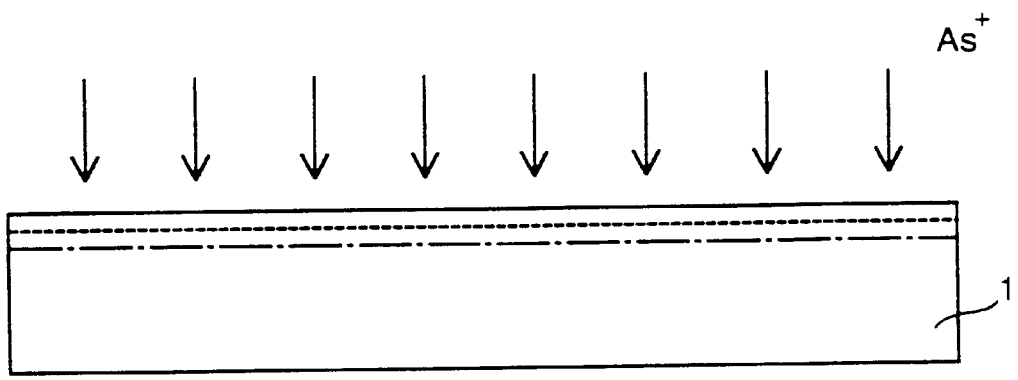
Figure 135:
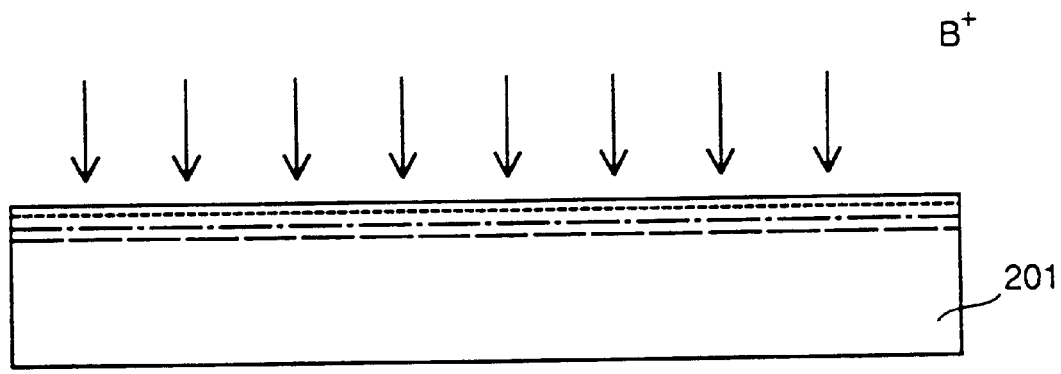

With reference to FIGS. 133 to 136, a fabrication process for the buried channel type flash EEPROM according to the eighteenth embodiment is now described. First, a well region (not shown) and element isolation oxide film (not shown) are formed on prescribed regions of a P-type silicon substrate 201. As shown in FIG. 133, nitrogen is ion-implanted into the silicon substrate 201 in such a range that a depth from the main surface of the silicon substrate 201 is smaller than about 500 Å. Then, an N-type impurity such as arsenic or phosphorus is ion-implanted into the silicon substrate 201 in such a range that a depth from the main surface of the silicon substrate 201 is not more than about 500 Å, as shown in FIG. 134. Further, a P-type impurity such as boron is implanted in such a range that a depth from the main surface of the silicon substrate 201 is at least about 500 Å, as shown in FIG. 135. Namely, nitrogen is implanted at such energy that the range of nitrogen is smaller than that of arsenic.

Figure 136:
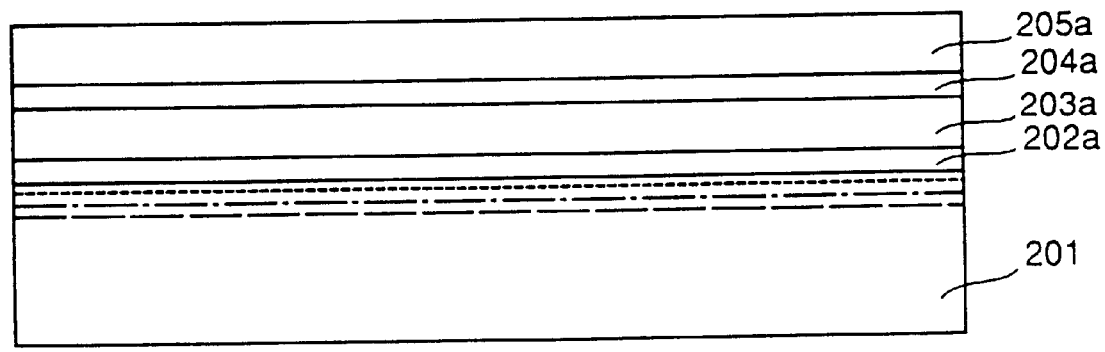

Then, an oxide film 202a of about 100 Å in thickness, a polysilicon film 203a of about 1000 Å in thickness, an interlayer insulating film 204a of about 200 Å in thickness, which is formed by a composite film of an oxide film and a nitride film, and a polysilicon film 205a of about 2500 Å in thickness are successively formed on the overall surface, as shown in FIG. 136. Thereafter the flash EEPROM according to the eighteenth embodiment is completed through a process which is similar to that for the fifteenth embodiment described above with reference to FIGS. 116 to 124. In the eighteenth embodiment, however, the impurities implanted into the N-type impurity layer 217 and the P-type impurity layer 218 are activated and the nitrogen-doped region 219 is simultaneously formed in a heat treatment step which is similar to that of the fifteenth embodiment. The N-type impurity layer 217 is formed to cover the nitrogen-doped region 219 by the aforementioned impurity ion implantation conditions, whereby no defects are caused by ion implantation of nitrogen in junction planes of the N-type impurity layer 217 and the P-type impurity layer 218. Thus, no junction leakage current is increased, whereby no damage is caused by implantation of nitrogen.

According to the eighteenth embodiment, a region shallower than the N-type impurity layer 217 is doped with nitrogen, whereby diffusion of arsenic is suppressed. Further, it is also possible to prevent diffusion of boron in the P-type impurity layer 218. Thus, the N-type impurity layer 217 can be formed in a small thickness, whereby it is possible to suppress a punch-through phenomenon in the buried channel type flash EEPROM. Further, it is possible to control the thickness of the N-type impurity layer 217 at a desired value by controlling nitrogen implantation conditions.

Figure 137:
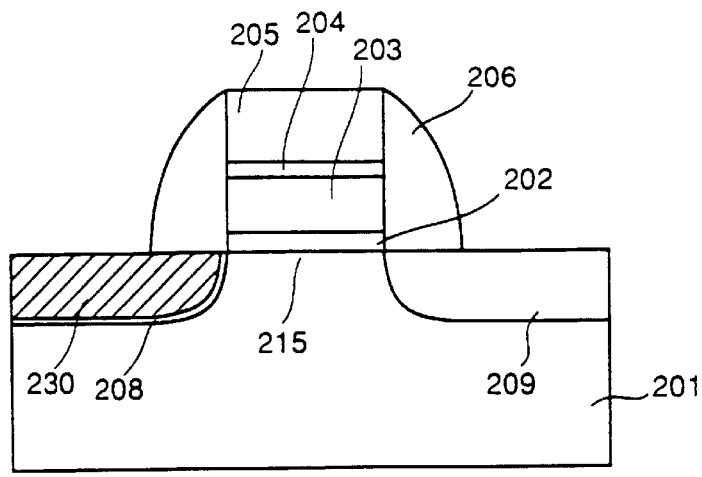
FIG. 137 is a sectional view showing a stack gate type flash EEPROM according to a nineteenth embodiment of the present invention.
Figure 138:
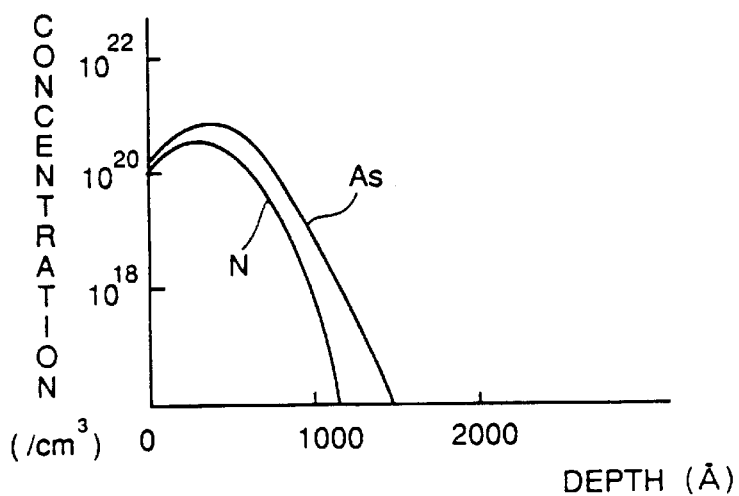
FIG. 138 illustrates an impurity profile in a depth direction of a drain region in the flash EEPROM shown in FIG. 137.

With reference to FIG. 137, a stack gate type flash EEPROM according to a nineteenth embodiment of the present invention is now described. In the nineteenth embodiment, a nitrogen-doped region 230 is formed in a drain region 208. FIG. 138 shows an impurity profile of a depth direction in the drain region 208 of the flash EEPROM shown in FIG. 137. Referring to FIG. 138, it is understood that a junction plane of the drain region 208 is not doped with nitrogen, but the nitrogen-doped region 230 exists in the drain region 208 which is formed by doping with arsenic.

Figure 139:
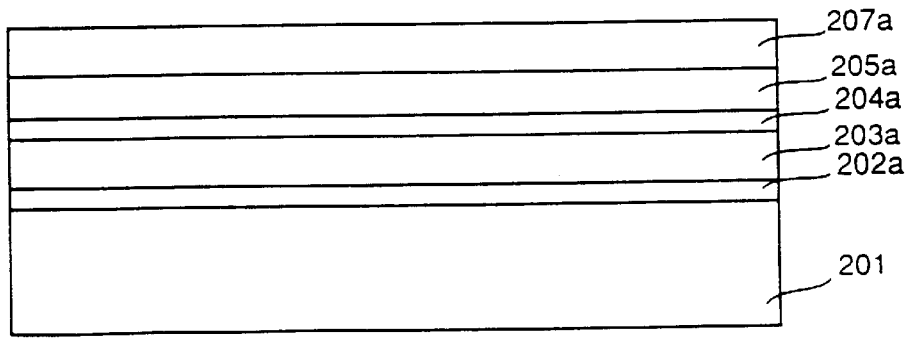
FIGS. 139 to 141 are sectional views for illustrating a fabrication process for the stack gate type flash EEPROM according to the nineteenth embodiment shown in FIG. 137.
Figure 140:
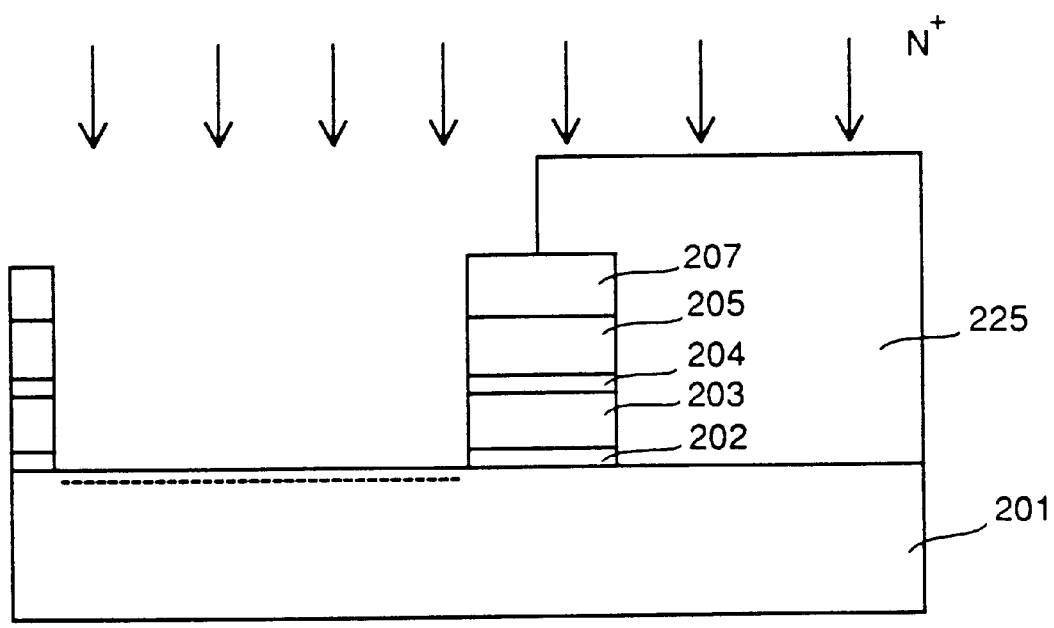
Figure 141:
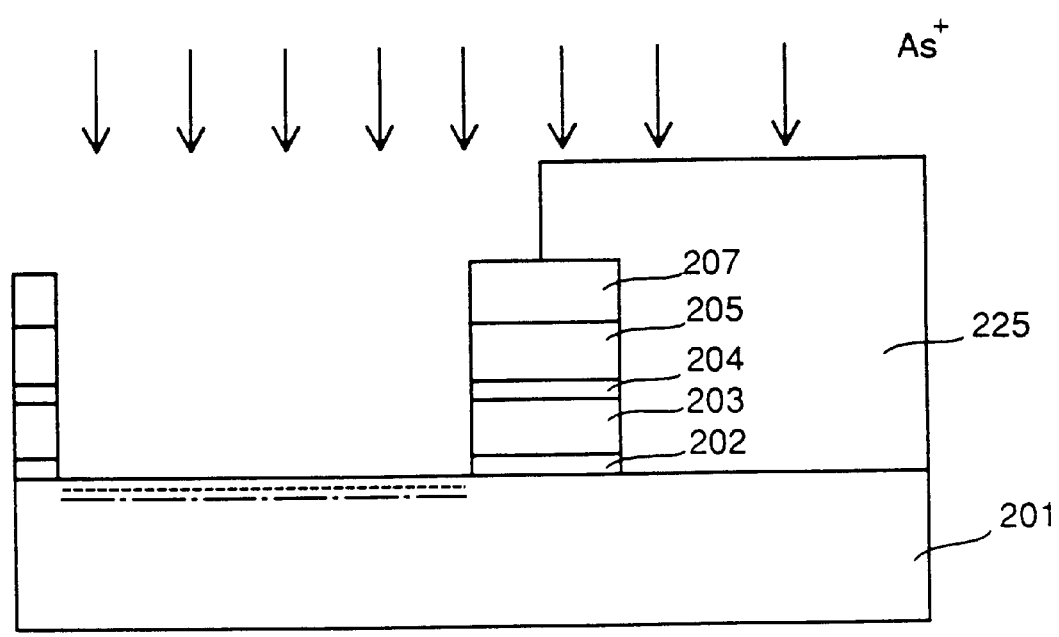

With reference to FIGS. 139 to 141, a fabrication process for the flash EEPROM according to the nineteenth embodiment shown in FIG. 137 is now described. First, a well region (not shown) and element isolation oxide film (not shown) are formed on prescribed regions of a P-type silicon substrate 201. As shown in FIG. 139, an oxide film 202a of about 100 Å in thickness, a polysilicon film 203a of about 1000 Å in thickness, an interlayer insulating film 204a of about 200 Å in thickness, which is formed by a composite film of an oxide film and a nitride film, a polysilicon film 205a of about 2500 Å in thickness, and an oxide film 207a of about 1000 Å in thickness are successively formed on the overall surface, as shown in FIG. 139.

Then, the oxide film 202a, the polysilicon film 203a, the interlayer insulating film 204a, the polysilicon film 205a, and the oxide film 207a are patterned in the form of a gate electrode, thereby forming an oxide film 202, a floating gate electrode 203, an interlayer insulating film 204, a control gate electrode 205 and an oxide film 207, as shown in FIG. 140. Thereafter a source forming region is covered with a resist film 225. The resist film 225 and the oxide film 207 are employed as masks to ion-implant nitrogen into a drain forming region under conditions of about 10 keV and $8 \times 10^{15}/cm^2$.

Then, the resist film 225 and the oxide film 207 are again employed as masks to ion-implant arsenic under conditions of 35 keV and $5 \times 10^{15}/cm^2$, as shown in FIG. 141. Namely, nitrogen is implanted at such energy that its range is smaller than that of arsenic. Thereafter the resist film 225 is removed. Subsequent fabrication steps are identical to those of the fifteenth embodiment shown in FIGS. 119 to 124. In the fabrication process for the nineteenth embodiment, however, the impurities implanted into the source region 209 and the drain region 208 are activated and the nitrogen-doped region 230 is simultaneously formed in the heat treatment step in the fifteenth embodiment. Due to the aforementioned impurity ion implantation conditions, the drain region 208 is formed to cover the nitrogen-doped region 230. Thus, no defects are caused by ion implantation of nitrogen in a junction plane between the drain region 208 and the silicon substrate 201, and hence no junction leakage current is increased. Thus, no damage is caused by implantation of nitrogen.

According to the nineteenth embodiment, the drain region 208 is doped with nitrogen, whereby it is possible to prevent diffusion of arsenic which is implanted into the drain region 208 in the heat treatment step. Therefore, it is possible to shallowly form the P-N junction plane between the drain region 208 and the silicon substrate 201 Thus, it is possible to suppress a short channel effect such as a punch-through phenomenon. Due to such suppression of a short channel effect, further, it is possible to refine the element.

Diffusion of arsenic which is implanted into the drain region 208 is thus suppressed by nitrogen which is doped in the drain region 208, whereby an overlap region between the oxide film 202 and the drain region 208 caused by transverse diffusion of arsenic is reduced. Thus, a capacitance $C_{FS}$ between the control gate electrode 205 and the drain region 208 is reduced. Therefore, it is possible to increase the coupling ratio $C_{FC}/C_{TOTAL}$, whereby potential difference between potentials $V_{CG}$ and $V_{FG}$ of the control gate electrode 205 and the floating gate electrode 203 is reduced. Namely, a higher electric field is applied to the channel region 215 to improve current drivability when the coupling ratio is large, regardless of the potential which is applied to the control gate electrode 205. Thus, it is possible to reduce the voltage $V_{CG}$ which is applied to the control gate electrode 205 as the coupling ratio is increased, thereby reducing the voltage of a power source.

Figure 142:
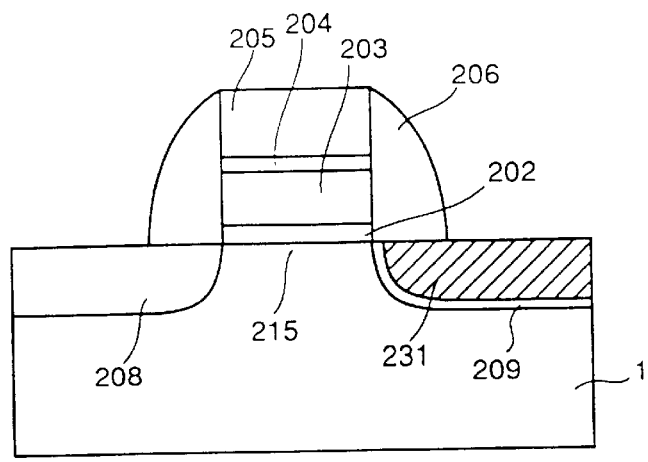
FIG. 142 is a sectional view showing a stack gate type flash EEPROM according to a twentieth embodiment of the present invention.

With reference to FIG. 142, a stack gate type flash EEPROM according to a twentieth embodiment of the present invention is now described. According to the twentieth embodiment, a nitrogen-doped region 231 is formed in a source region 209. As to a fabrication process for the flash EEPROM according to the twentieth embodiment, the nitrogen doping step of the nineteenth embodiment may be carried out in advance of a source implantation step. Also in the twentieth embodiment, nitrogen is implanted at such energy that its range is smaller than that of arsenic, similarly to the aforementioned fabrication process for the nineteenth embodiment. An effect similar to that of the nineteenth embodiment can be attained in the twentieth embodiment.

Figure 143:
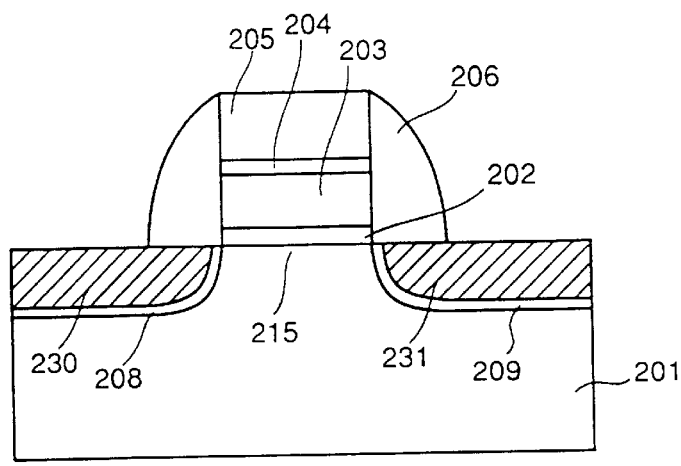
FIG. 143 is a sectional view showing a stack gate type flash EEPROM according to a twenty-first embodiment of the present invention.

With reference to FIG. 143, a stack gate type flash EEPROM according to a twenty-first embodiment of the present invention is now described. In the twenty-first embodiment, the nineteenth and twentieth embodiments are combined with each other. Namely, a nitrogen-doped region 230 is formed in a drain region 208, and a nitrogen-doped region 231 is formed in a source region 209.

Figure 144:
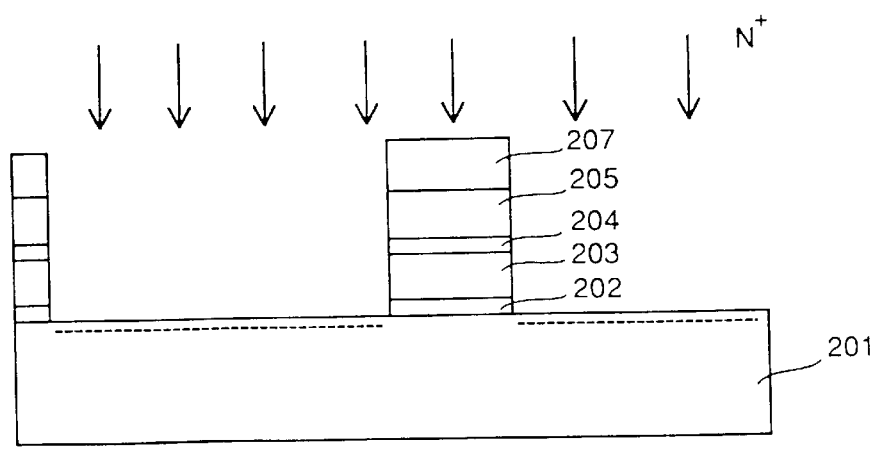
FIG. 144 is a sectional view for illustrating a fabrication process for the stack gate type flash EEPROM according to the twenty-first embodiment shown in FIG. 143.
Figure 145:
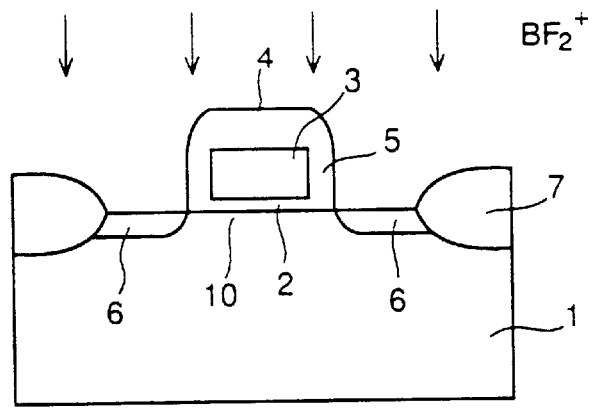
FIG. 145 is a sectional view for illustrating a first example of a conventional method of fabricating a PMOS transistor.
Figure 146:
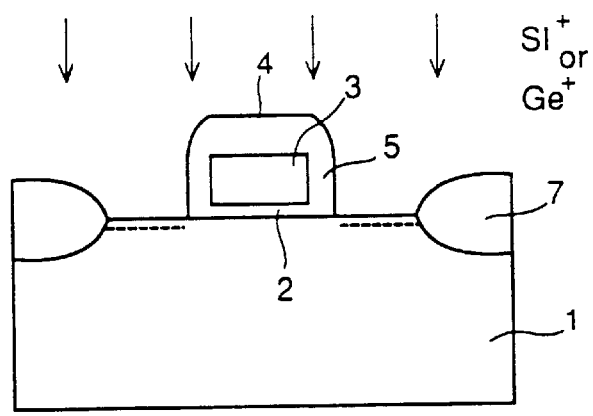
FIGS. 146A and 146B are sectional views for illustrating a second example of a conventional method of fabricating a PMOS transistor.
Figure 146:
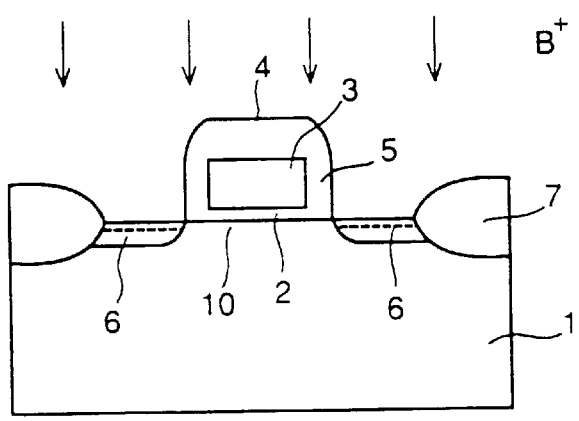
Figure 147:
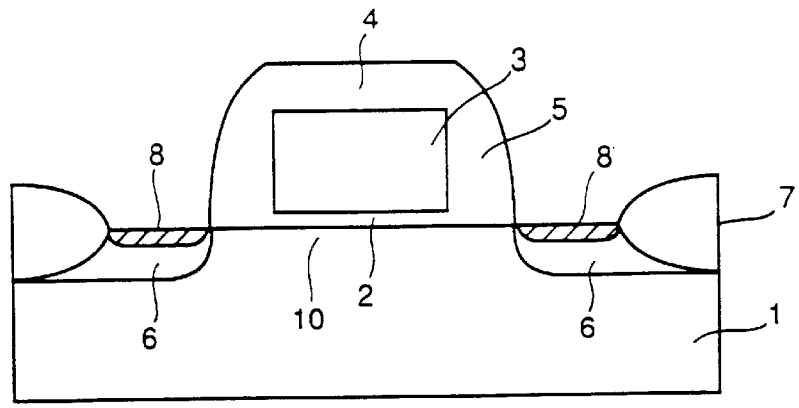
FIG. 147 is a sectional view showing a conventional improved PMOS transistor.
Figure 148:
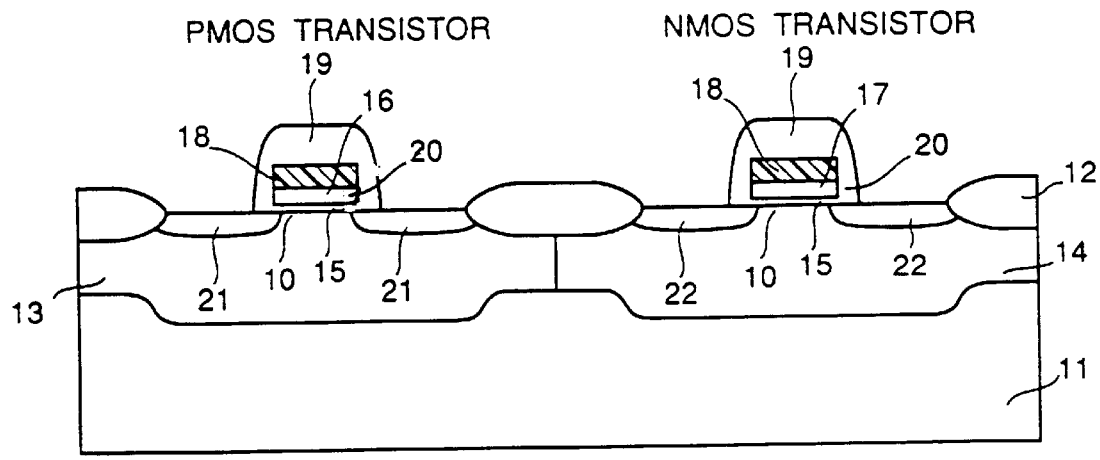
FIG. 148 is a sectional view showing an example of a conventional dual gate CMOS transistor.
Figure 149:
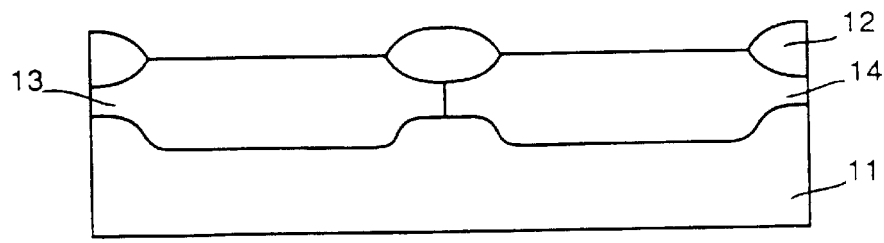
FIGS. 149 to 157 are sectional views for illustrating a fabrication process for the dual gate CMOS transistor shown in FIG. 148.
Figure 150:
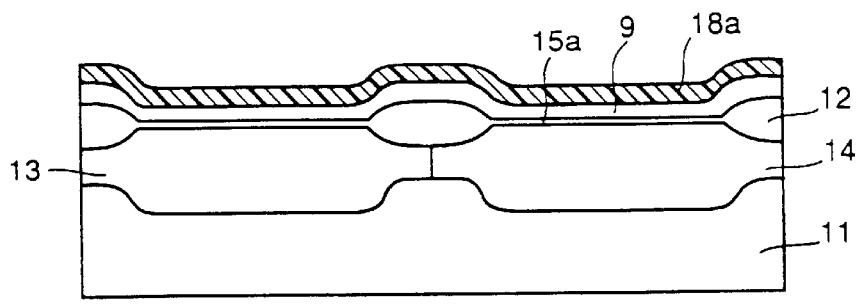
Figure 151:
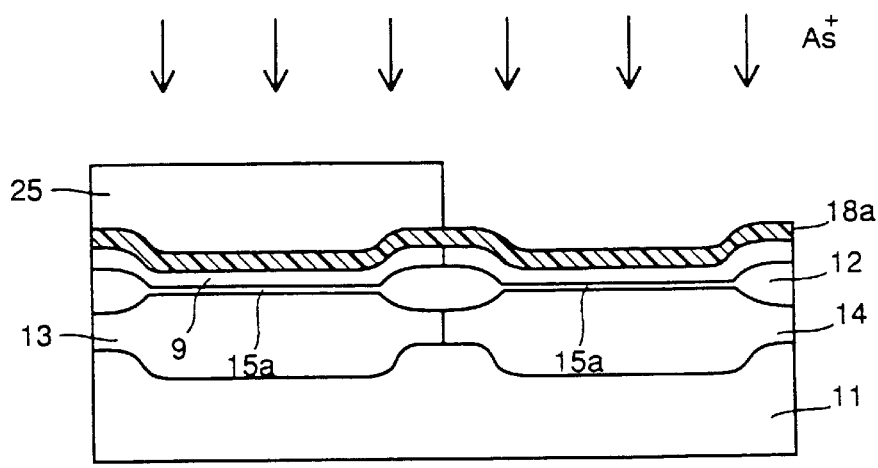
Figure 152:
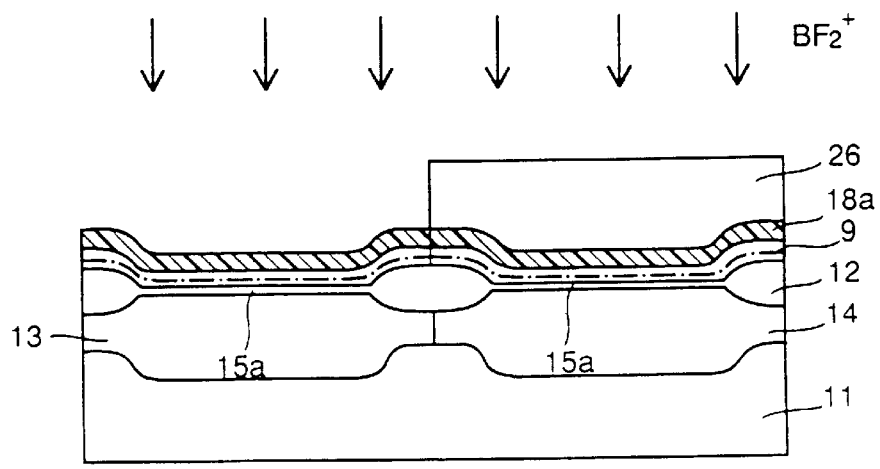
Figure 153:
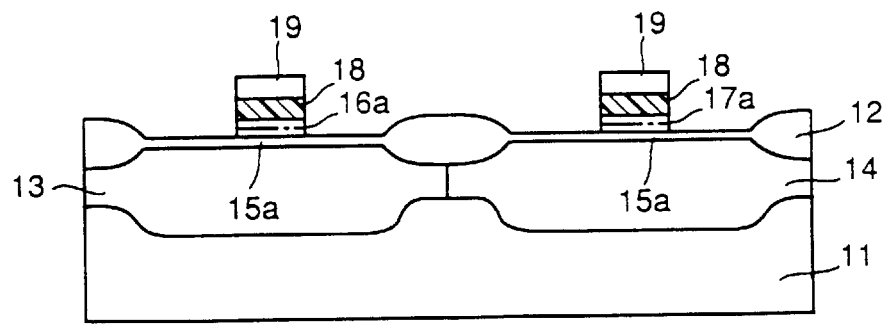
Figure 154:
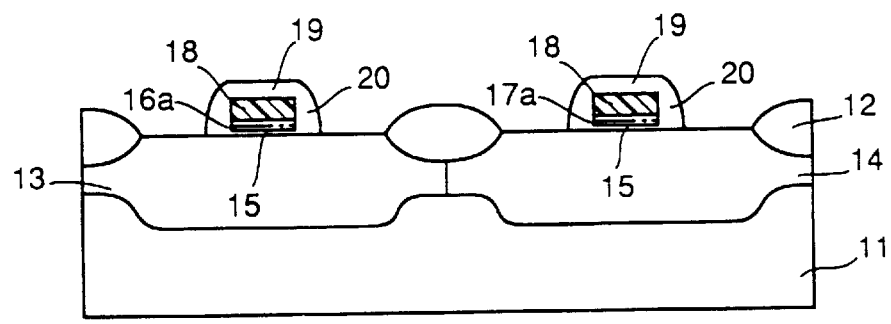
Figure 155:
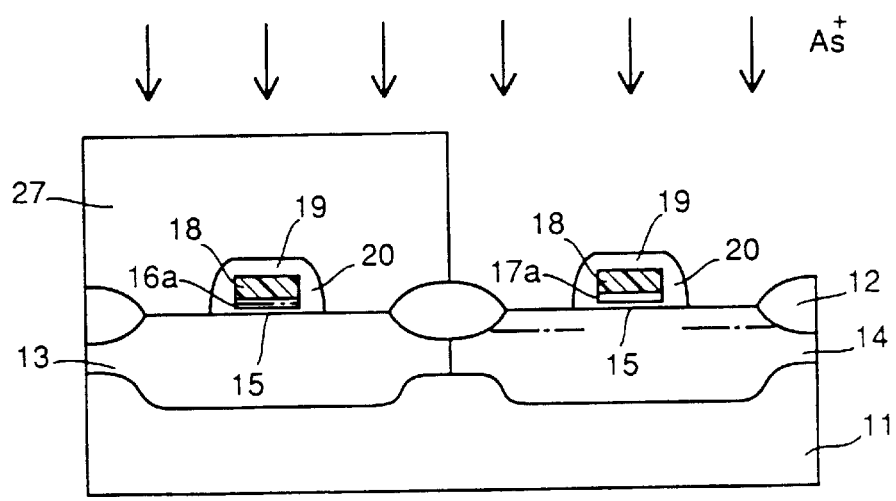
Figure 156:
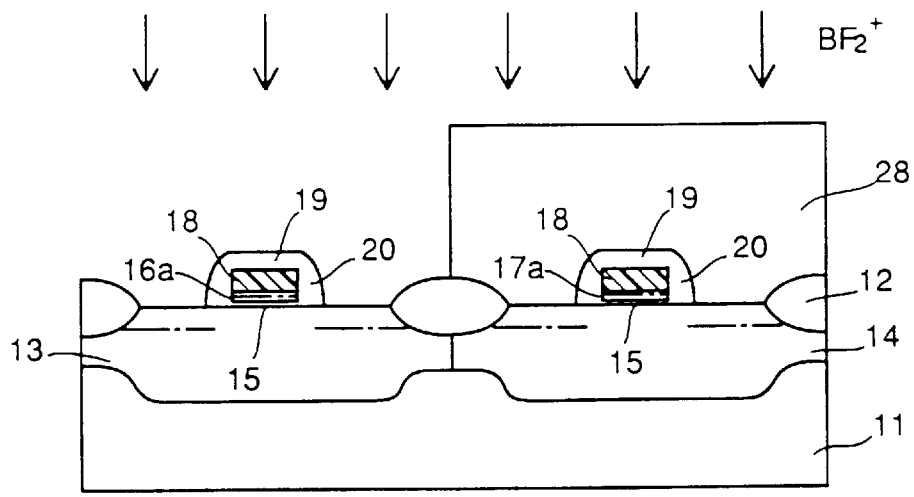
Figure 157:
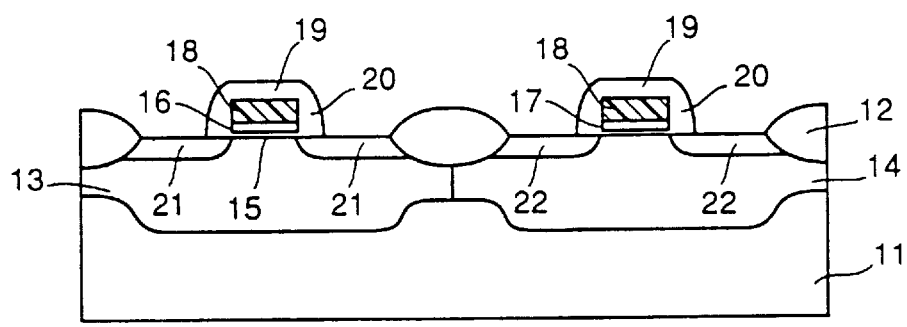
Figure 158:
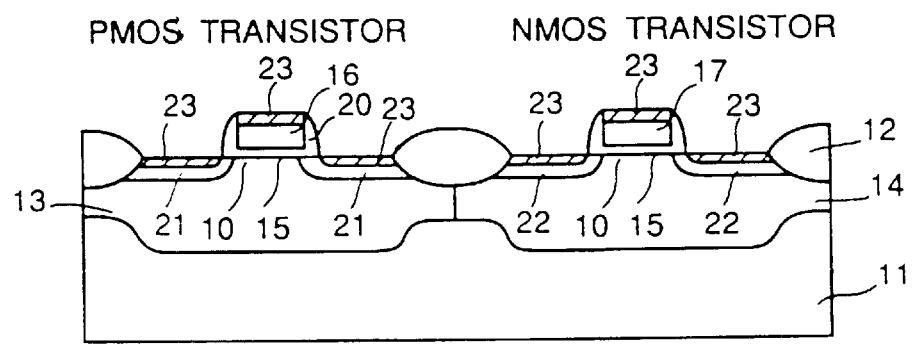
FIG. 158 is a sectional view showing another example of a conventional dual gate CMOS transistor.
Figure 159:
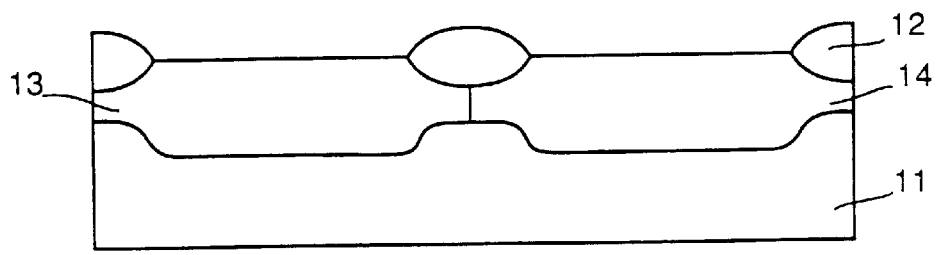
FIGS. 159 to 163 are sectional views for illustrating a fabrication process for the dual gate CMOS transistor shown in FIG. 158.
Figure 160:
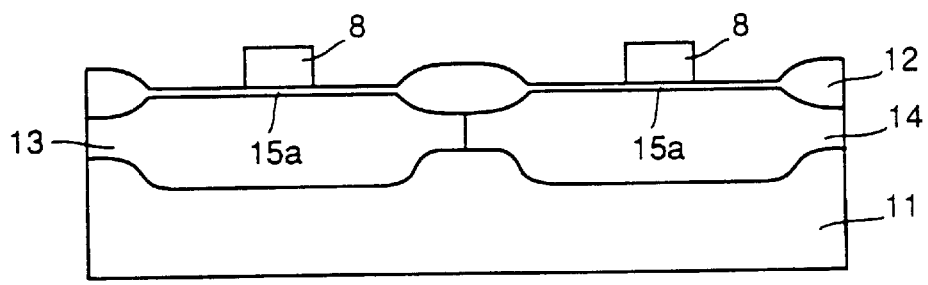
Figure 161:
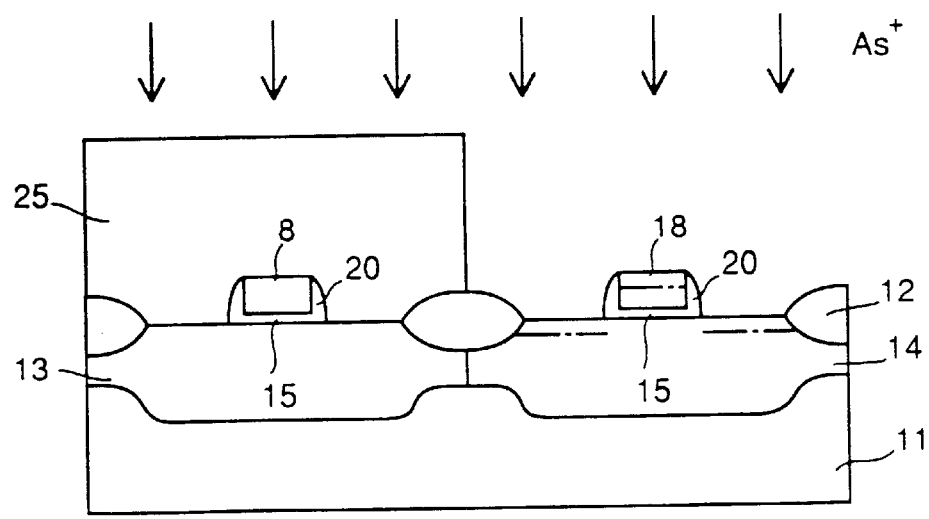
Figure 162:
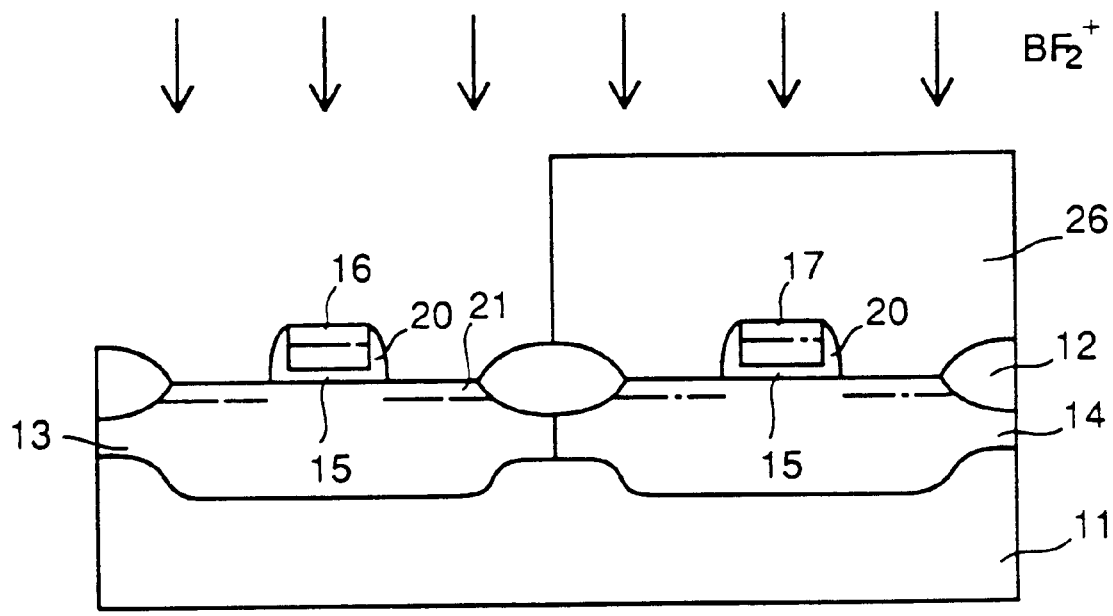
Figure 163:
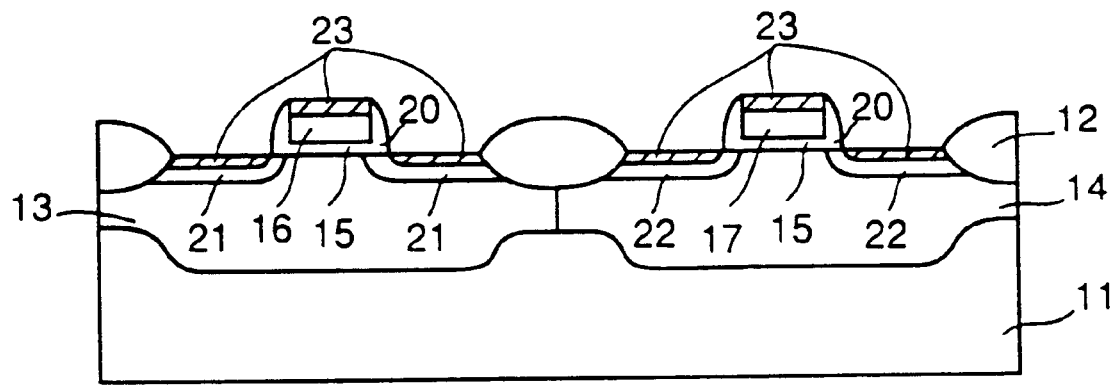
Figure 164:
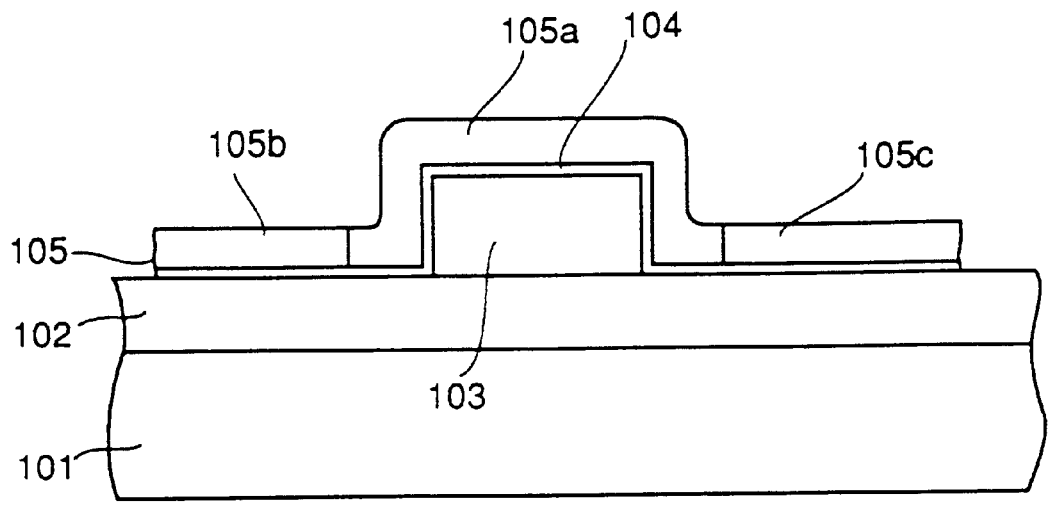
FIG. 164 is a sectional view showing a conventional PMOS-TFT.
Figure 165:
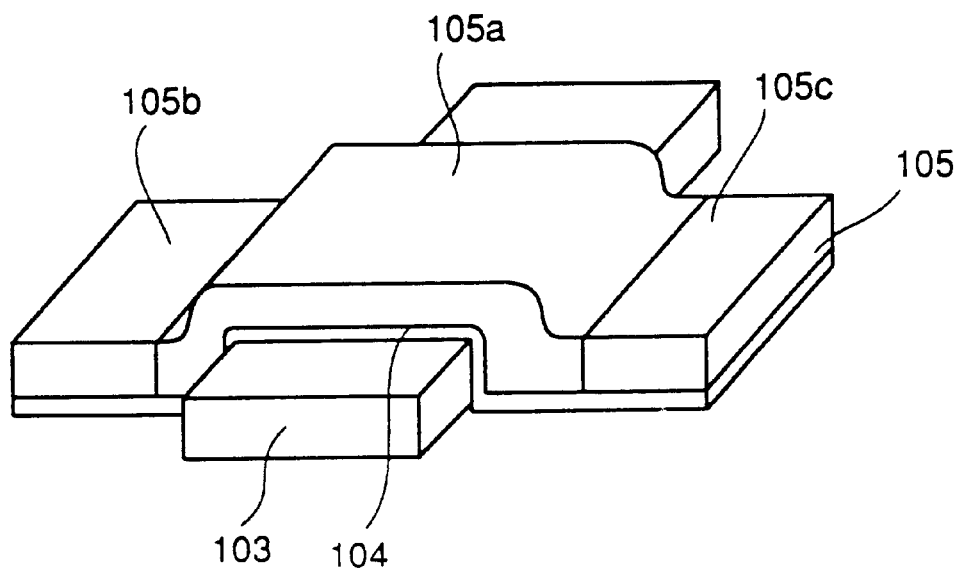
FIG. 165 is a perspective view of the PMOS-TFT shown in FIG. 164.
Figure 166:
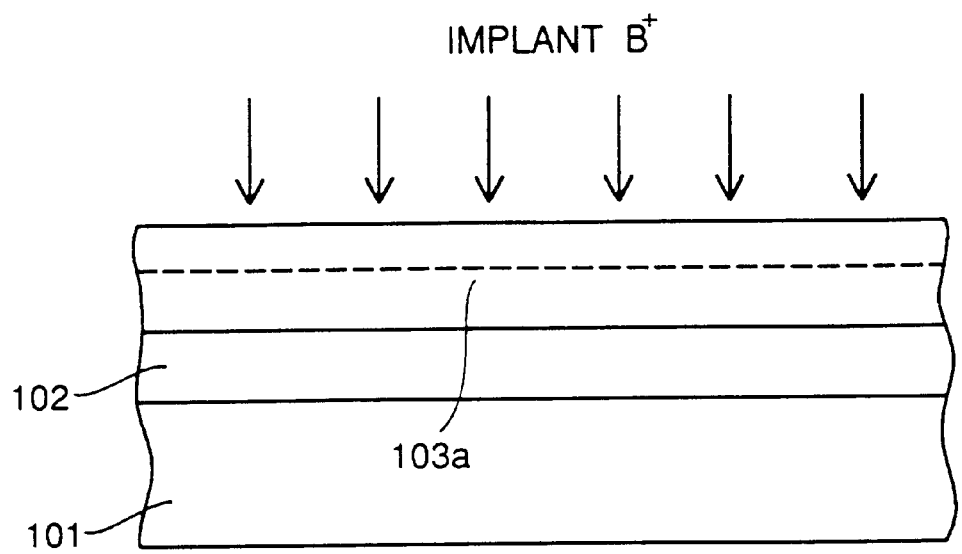
FIGS. 166 to 169 are sectional and perspective views for illustrating a fabrication process for the conventional PMOS-TFT shown in FIG. 164.
Figure 167:
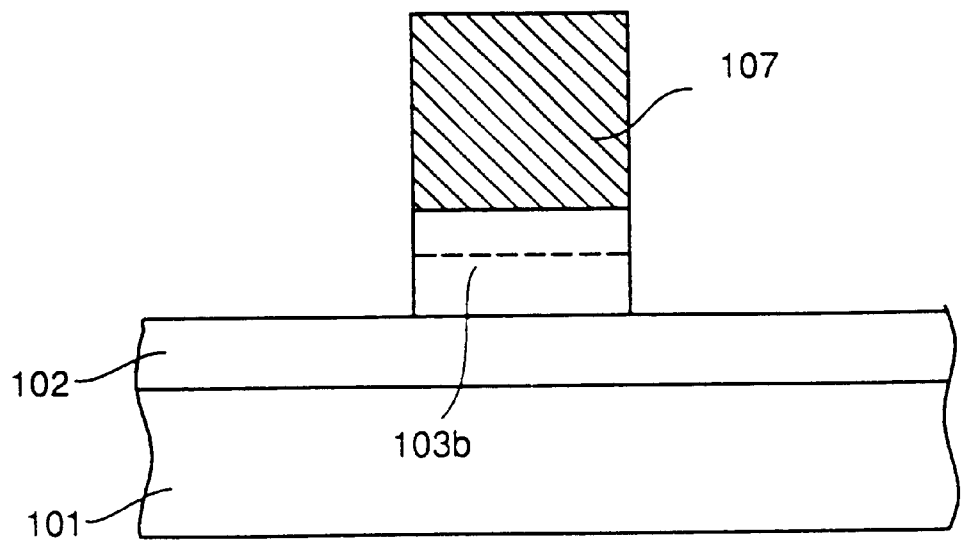
Figure 168:
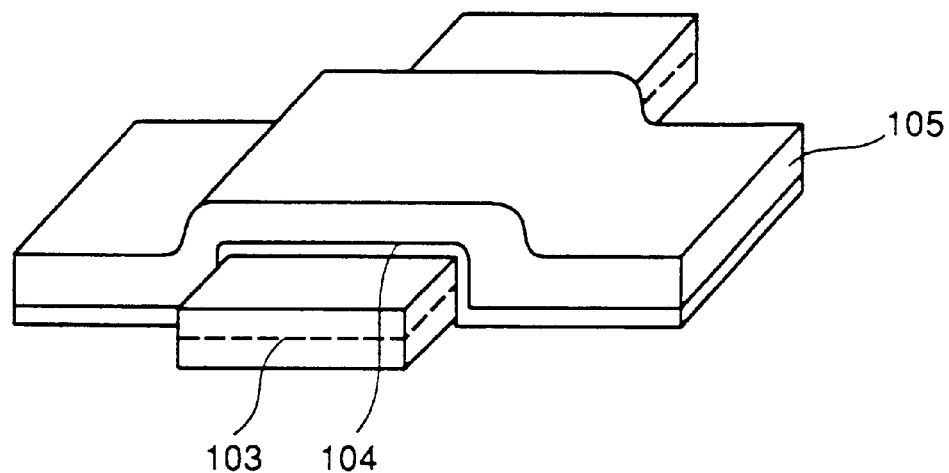
Figure 169:
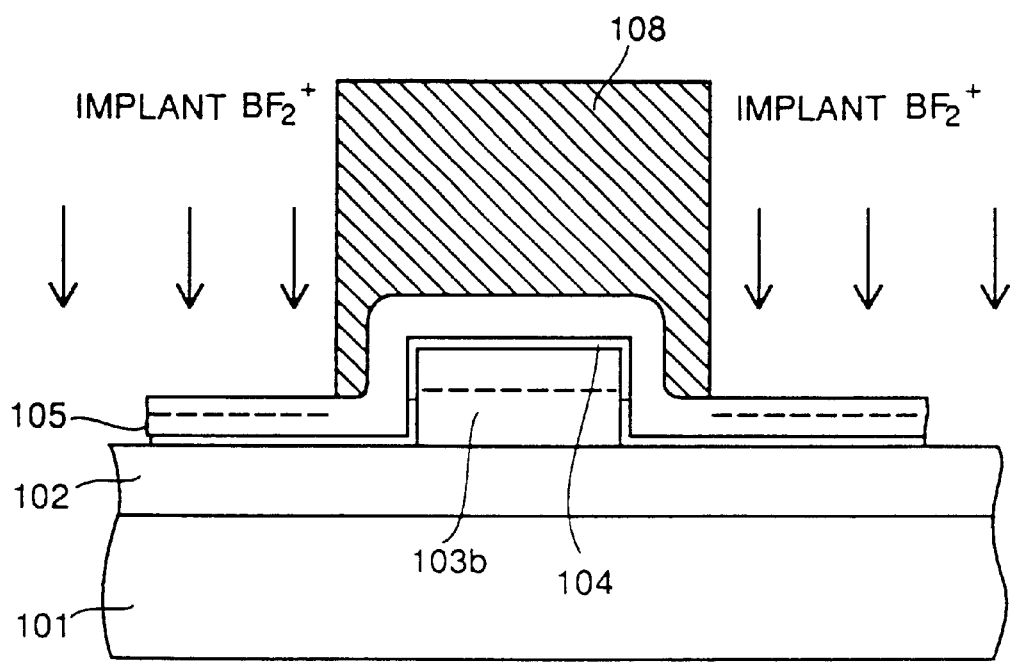
Figure 170:
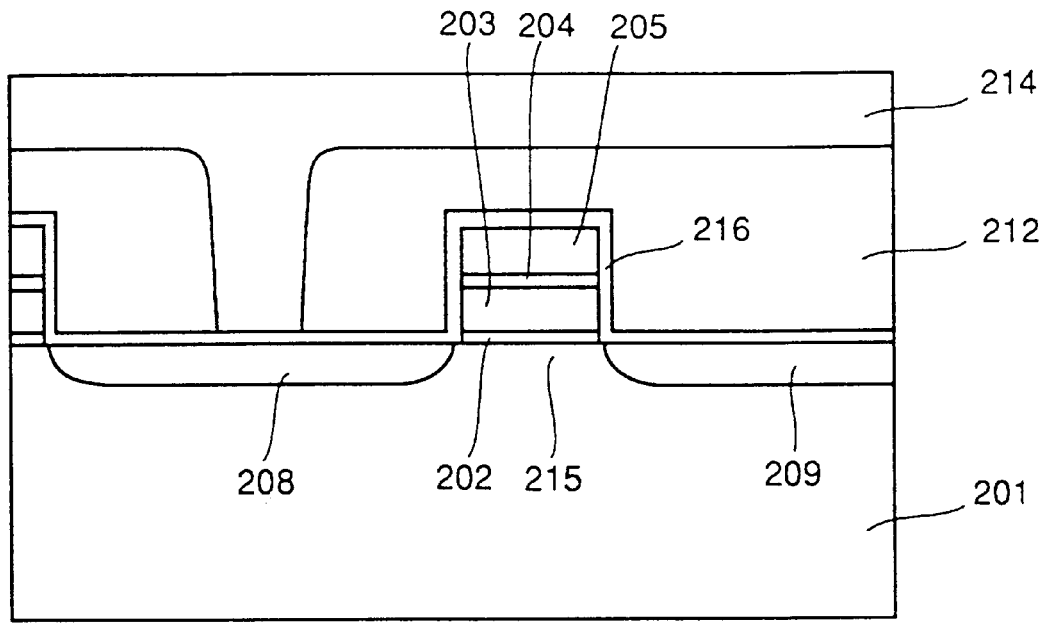
FIG. 170 is a sectional view showing a conventional stack gate type flash EEPROM.
Figure 171:
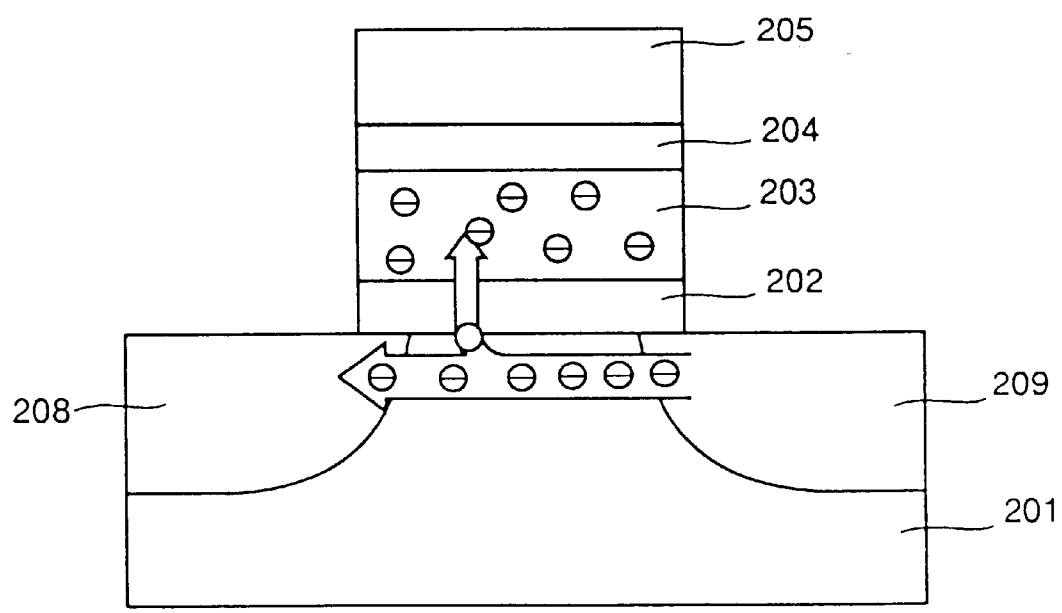
FIG. 171 is a schematic diagram for illustrating a write operation in the conventional flash EEPROM employing CHE.
Figure 172:
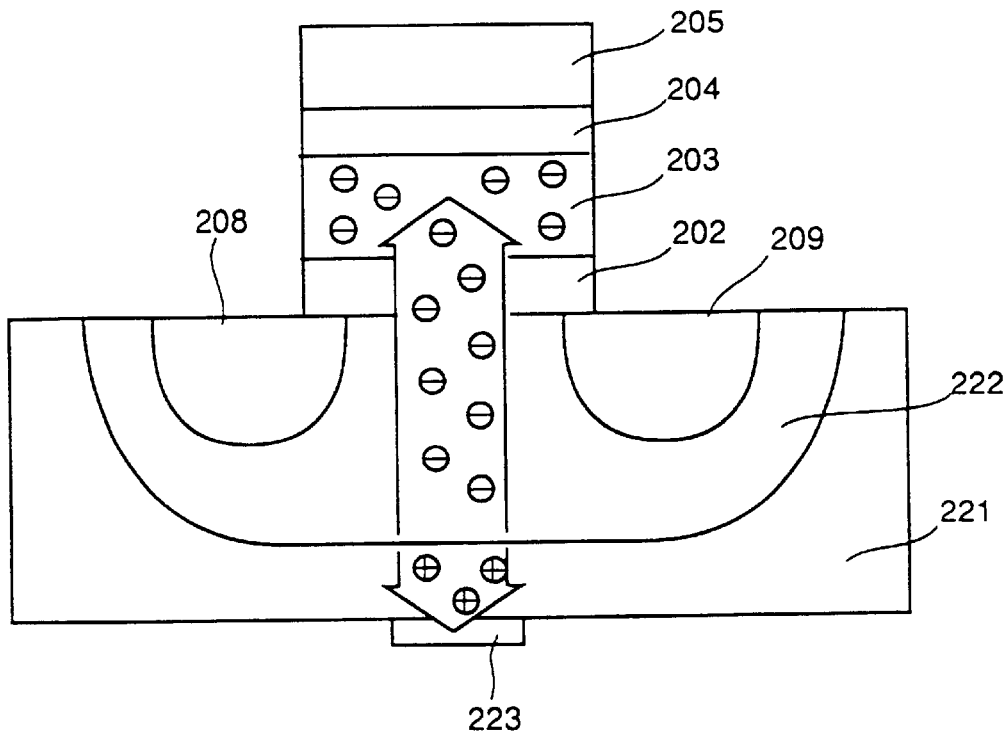
FIG. 172 is a schematic diagram for illustrating a write operation in a conventional flash EEPROM employing SHE.
Figure 173:
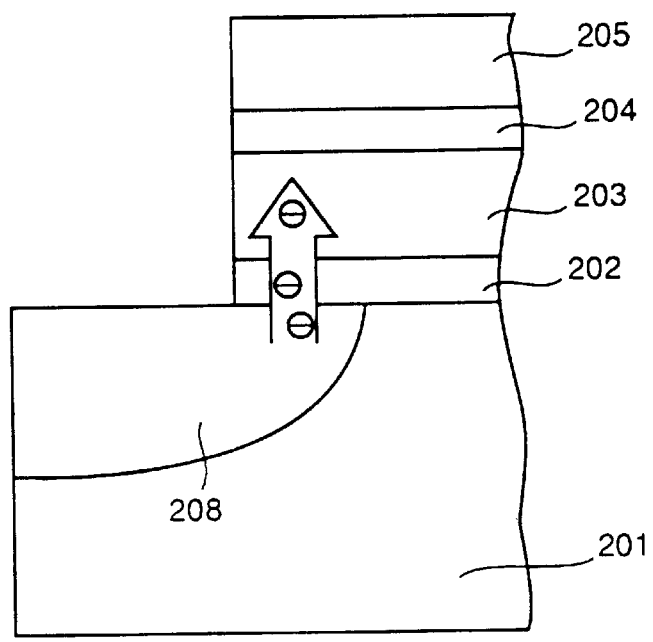
FIG. 173 is a schematic diagram for illustrating a write operation in a conventional flash EEPROM employing an F-N tunnel phenomenon.
Figure 174:
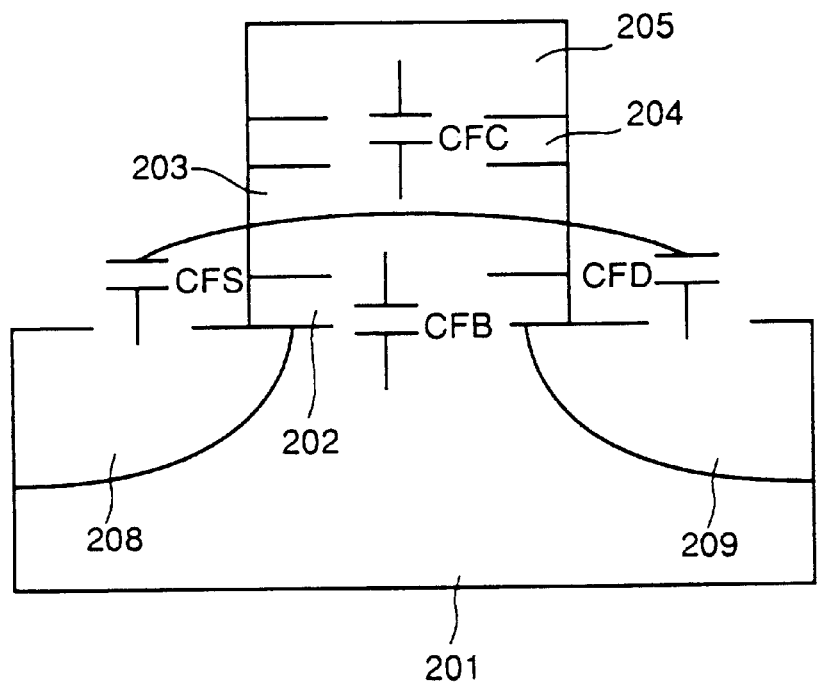
FIG. 174 is a model diagram for illustrating a coupling ratio of a flash EEPROM.
Figure 175:
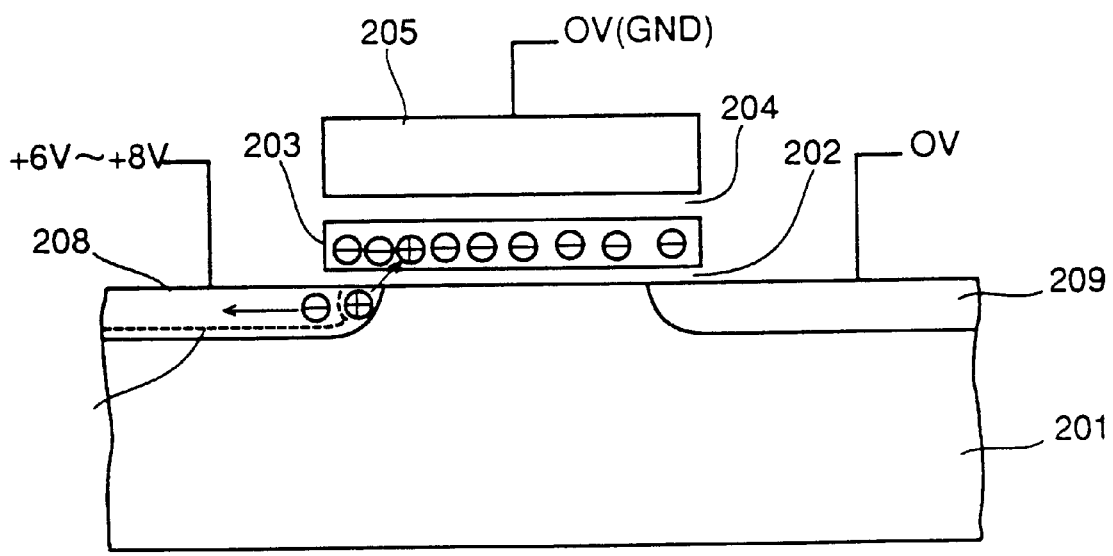
FIG. 175 is a model diagram for illustrating interband tunneling.
Figure 176:
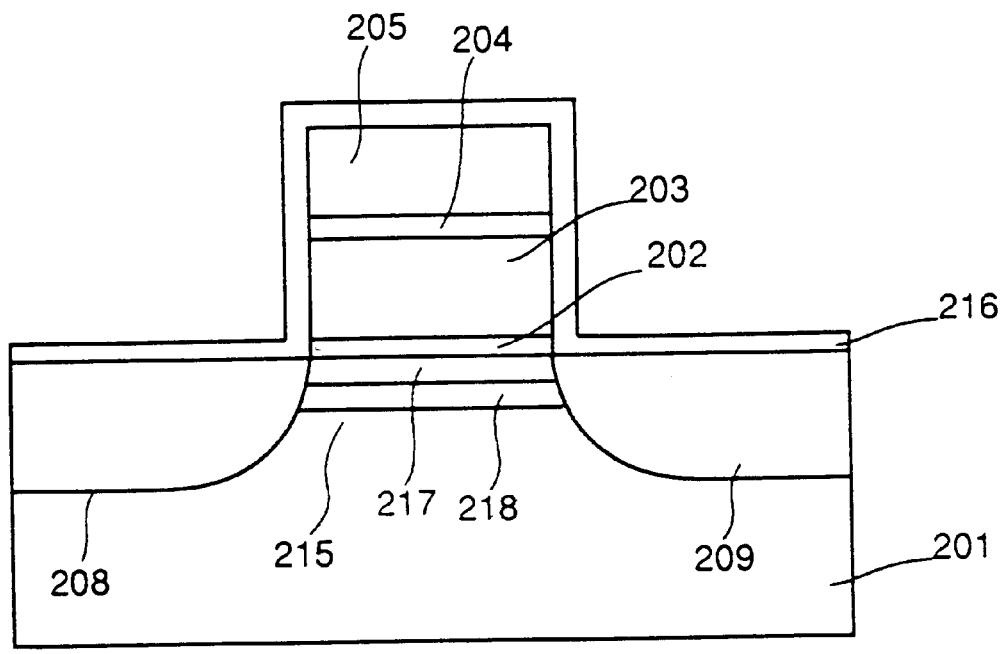
FIG. 176 is a sectional view showing a conventional buried channel type flash EEPROM.
Figure 177:
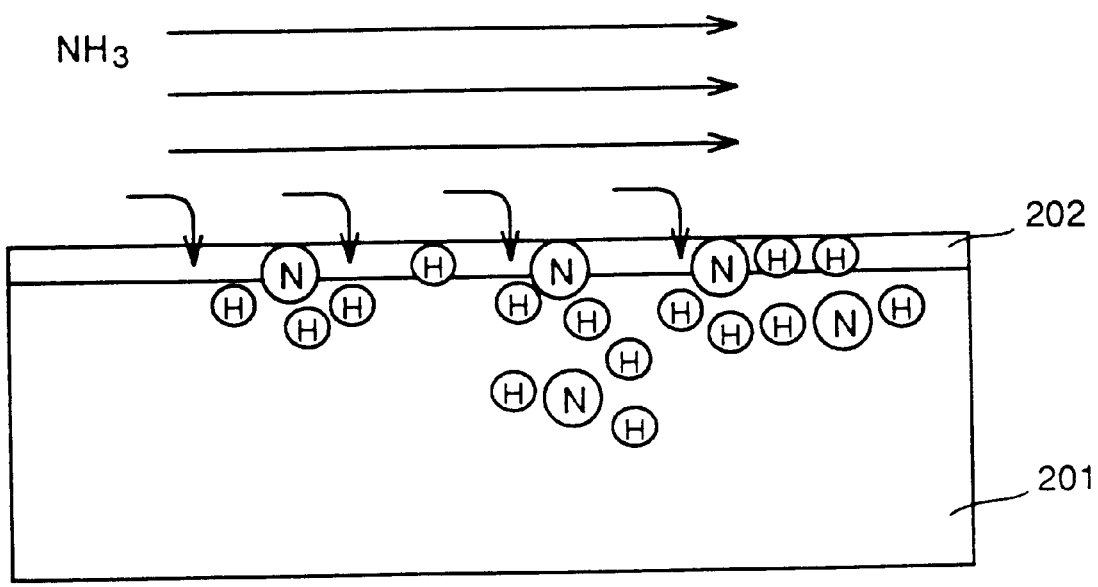
FIG. 177 is a model diagram for illustrating inconvenience in a case of employing RTN treatment as a method of introducing nitrogen into an oxide film.

As to a fabrication process for the flash EEPROM according to the twenty-first embodiment, the nitrogen doping step in the nineteenth embodiment may be carried out after a step of patterning a gate electrode (see FIG. 144).

According to the twenty-first embodiment, the drain region 208 and the source region 209 are provided with the nitrogen-doped regions 230 and 231 respectively, whereby the effect of the nineteenth or twentieth embodiment further remarkably appears. In the twenty-first embodiment, nitrogen may be ion-implanted without providing an oxide film 207, thereby doping a control gate electrode 205 also with nitrogen.

In the semiconductor device according to the first aspect of the present invention, as hereinabove described, it is possible to suppress diffusion of the impurity which is introduced into the gate electrode by doping the gate electrode with nitrogen. Thus, it is possible to inhibit the impurity from being mixed into the gate insulating film and punching through the gate insulating film. Further, it is possible to improve the gate insulating film in reliability and hot carrier resistance by doping the gate insulating film with nitrogen.

In the method of fabricating a semiconductor device according to the second aspect of the present invention, on the other hand, heat treatment is carried out after nitrogen is ion-implanted into the gate insulating film to deposit nitrogen in the gate insulating film, whereby it is possible to form the gate insulating film doped with no hydrogen without damaging the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:
  forming an insulating layer on a semiconductor substrate;
  forming an electrode layer on said insulating film;
  ion-implanting nitrogen into said electrode layer;
  implanting an impurity into said electrode layer after the step of ion-implanting nitrogen, whereby no heat treating occurs between the steps of ion-implanting nitrogen and implanting said impurity; and
  carrying out heat treatment after said steps of implanting nitrogen and said impurity into said electrode layer, thereby depositing nitrogen in said insulating film.

2. A method of fabricating a semiconductor device in accordance with claim 1, wherein
  a projection range $R_P$ of said nitrogen in said step of ion-implanting said nitrogen is set to at such a position that a distance from an interface between said insulating film and said electrode layer toward said electrode layer is at least $5 \times \Delta R_P$, assuming that $\Delta R_P$ represents its standard deviation.

3. A method of fabricating a semiconductor device, comprising the steps of:
  forming a first insulating layer on a semiconductor substrate;
  forming an electrode layer on said first insulating film;
  ion-implanting nitrogen into said electrode layer;
  implanting an impurity into said electrode layer after the step of ion-implanting nitrogen, whereby no heat treating occurs between the steps of ion-implanting nitrogen and implanting said impurity;
  forming a second insulating layer on said electrode layer after said steps of implanting said nitrogen and said impurity; and
  carrying out heat treatment after said step of forming said second insulating layer, thereby depositing nitrogen in said insulating film.

4. A method of fabricating a semiconductor device, comprising the steps of:
  forming a gate electrode on a semiconductor substrate;
  implanting nitrogen ions into said semiconductor substrate for forming nitrogen-doped regions in said semiconductor substrate to hold said gate electrode therebetween; and
  implanting impurity ions having a range being larger than that of said nitrogen ions into said semiconductor substrate after the step of implanting nitrogen ions, whereby no heat treating occurs between the steps of implanting nitrogen ions and implanting impurity ions, thereby forming source/drain regions including said nitrogen-doped regions.

5. A method of fabricating a semiconductor device in accordance with claim 4, wherein
  said nitrogen ions are implanted into said semiconductor substrate at an angle being smaller than 90° with respect to a main surface of said semiconductor substrate.

6. A method of fabricating a semiconductor device in accordance with claim 4, wherein
  said step of implanting said nitrogen ions includes a step of doping said gate electrode with nitrogen, and
  said step of implanting said impurity ions includes a step of doping said gate electrode with an impurity,
  said method further comprising a step of carrying out heat treatment after said step of implanting said impurity into said gate electrode and said semiconductor substrate, thereby depositing nitrogen in said gate insulating film.

7. A method of fabricating a semiconductor device comprising a semiconductor substrate having a first conductivity type first semiconductor region and a second conductivity type second semiconductor region, a gate insulating film being formed on said semiconductor substrate, and a gate electrode layer being formed on said gate insulating film, said method comprising the steps of:
  ion-implanting nitrogen into the overall surface of said gate electrode layer;
  introducing a second conductivity type impurity into a portion of said gate electrode layer being formed on said first semiconductor region after the step of ion-implanting nitrogen, whereby no heat treating occurs between the steps of ion-implanting nitrogen and introducing said second conductivity type impurity;
  introducing a first conductivity type impurity into a portion of said gate electrode layer being formed on said second semiconductor region; and carrying out heat treatment after said introduction of said nitrogen and said impurities into said gate electrode layer, thereby depositing nitrogen into said gate insulating film.

8. A semiconductor device in accordance with claim 7, wherein said gate electrode layer consists of a polysilicon layer and a metal silicide film being formed on said polysilicon layer, said nitrogen is ion-implanted into an interface between said polysilicon film and said metal suicide film, said second conductivity type impurity is introduced into a portion of said polysilicon film being formed on said first semiconductor region, and said first conductivity type impurity is introduced into a portion of said polysilicon film being formed on said second semiconductor region.

9. A method of fabricating a semiconductor device having a polysilicon film serving as an active semiconductor layer, a first insulating film being formed on a first surface of said active semiconductor layer, and a gate electrode being formed through said first insulating film, said method comprising the steps of:

implanting nitrogen ions into said polysilicon film by oblique rotation implantation; and implanting an impurity into source/drain forming regions of said polysilicon film after said step of implanting said nitrogen ions, whereby no heat treating occurs between the steps of ion-implanting nitrogen and introducing said second conductivity type impurity.

10. A method of fabricating a semiconductor device, comprising the steps of:

ion-implanting nitrogen into a gate electrode;

forming a gate insulating film on said gate electrode after said step of implanting said nitrogen ions;

forming a polysilicon film serving as an active semiconductor layer on said gate insulating film, wherein said active semiconductor layer is formed by implanting an impurity into said polysilicon film after said step of implanting nitrogen ions, whereby no heat treating occurs between the step of implanting nitrogen ions and implanting said impurity; and carrying out heat treatment after said steps of implanting nitrogen and said impurity into said electrode layer, thereby depositing nitrogen in said insulating film.

* * * * *